(12) United States Patent
Tanaka

(10) Patent No.: US 6,713,872 B2
(45) Date of Patent: *Mar. 30, 2004

(54) MULTILAYERED SEMICONDUCTOR DEVICE

(75) Inventor: Yoshinori Tanaka, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 32 days.

This patent is subject to a terminal disclaimer.

(21) Appl. No.: 10/114,264

(22) Filed: Apr. 3, 2002

(65) Prior Publication Data

US 2002/0105089 A1 Aug. 8, 2002

Related U.S. Application Data

(63) Continuation of application No. 09/440,575, filed on Nov. 15, 1999, now Pat. No. 6,369,446.

(30) Foreign Application Priority Data

May 31, 1999 (JP) ............................................. 11-152850

(51) Int. Cl.[7] ...................... H01L 23/148; H01L 23/152
(52) U.S. Cl. ...................... 257/758; 257/753; 257/754; 257/755; 257/757
(58) Field of Search ............................... 757/758, 760, 757/309, 306, 310, 311, 753, 754, 755, 757; 438/210, 239, 250

(56) References Cited

U.S. PATENT DOCUMENTS

| 5,273,925 A | 12/1993 | Yamanaka ..................... 437/52 |
| 5,451,804 A | 9/1995 | Lur et al. ..................... 257/758 |
| 5,597,756 A | 1/1997 | Fazan et al. |
| 5,605,857 A | 2/1997 | Jost et al. |
| 5,608,247 A | 3/1997 | Brown |
| 5,828,096 A | 10/1998 | Ohno et al. .................. 257/306 |
| 5,929,524 A | 7/1999 | Drynan et al. ............... 257/758 |
| 5,929,526 A | 7/1999 | Srinivasan et al. .......... 257/768 |
| 6,071,773 A | 6/2000 | Lee et al. .................... 438/253 |
| 6,074,908 A | 6/2000 | Huang ......................... 438/241 |
| 6,077,742 A | 6/2000 | Chen et al. ................. 438/255 |
| 6,077,743 A | 6/2000 | Chen ........................... 438/255 |
| 6,080,664 A | 6/2000 | Huang et al. ................ 438/638 |
| 6,096,595 A | 8/2000 | Huang ......................... 438/238 |
| 6,130,449 A | 10/2000 | Matsuoka et al. .......... 257/296 |
| 6,191,484 B1 | 2/2001 | Huang et al. ................ 257/752 |
| 6,369,446 B1 * | 4/2002 | Tanaka ........................ 257/758 |

FOREIGN PATENT DOCUMENTS

| JP | 10-79478 | 3/1998 |
| JP | 10-79480 | 3/1998 |
| JP | 10-200068 | 7/1998 |
| JP | 10-209394 | 8/1998 |

* cited by examiner

Primary Examiner—Eddie Lee
Assistant Examiner—Douglas W. Owens
(74) Attorney, Agent, or Firm—McDermott, Will & Emery

(57) ABSTRACT

A first silicon oxide film is formed in such a manner as to cover source/drain regions of a transistor. A conductive pad is provided in the first silicon oxide film in such a manner that one end surface thereof is connected to each source/drain region and the other end surface thereof is exposed to the surface of the first silicon oxide film. A second silicon oxide film is formed on the first silicon oxide film and the pad. A conductive layer functioning as plug is provided in the second silicon oxide film in such a manner that one end surface thereof is in contact with the pad and the other end surface thereof is connected to an interconnection layer. The surface of the first silicon oxide film is smoothly continuous to the other end surface of the pad at the same level. The conductive layer as the plug is formed in such a manner as to be smaller in size than the pad and to be in contact with the central portion of the pad.

6 Claims, 38 Drawing Sheets

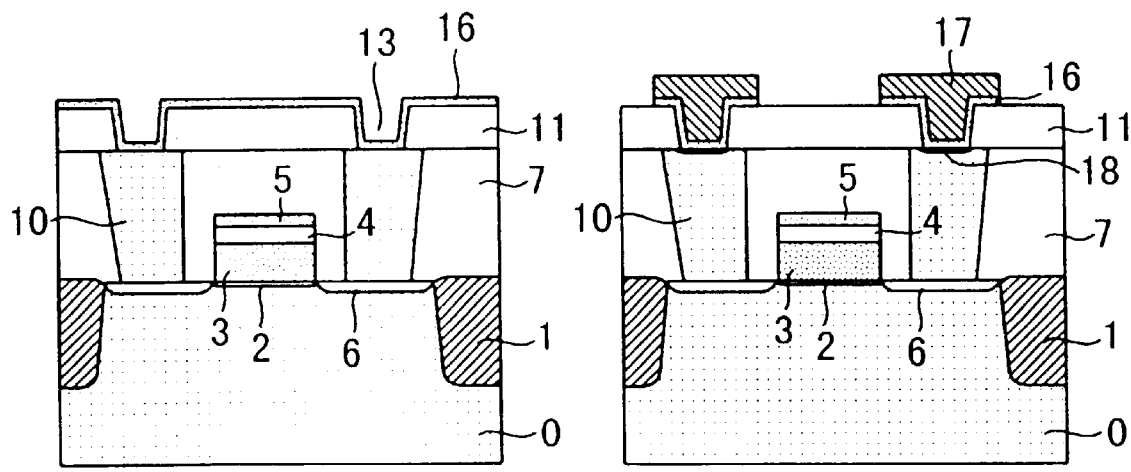
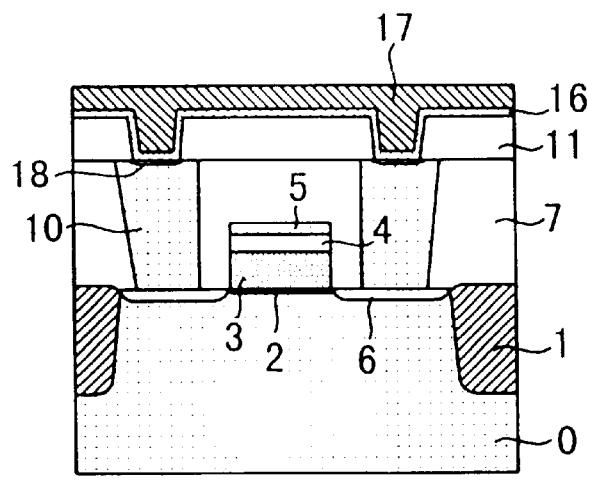
Fig. 4A
Fig. 4C
Fig. 4B

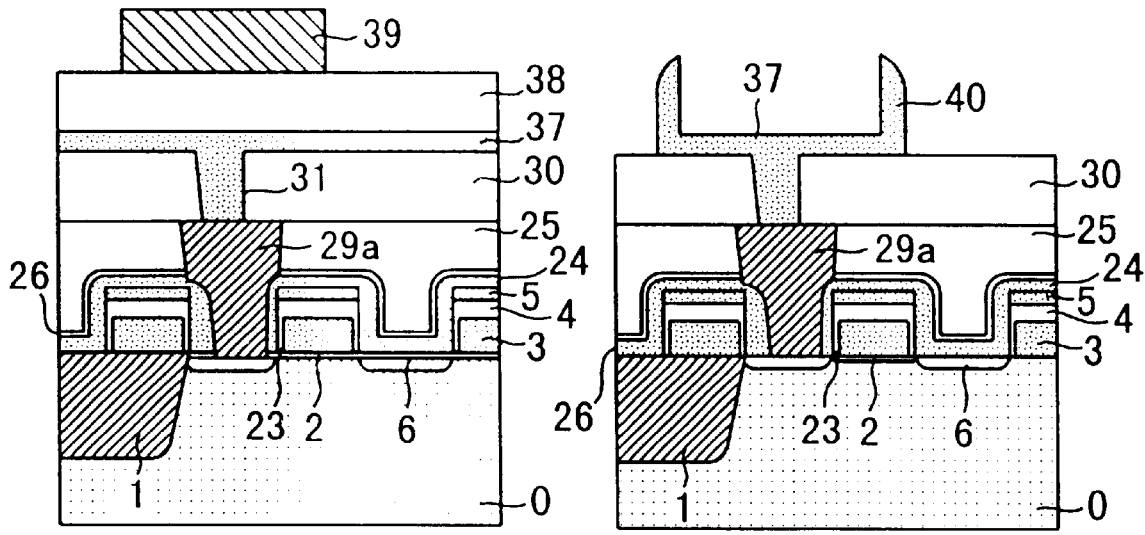
Fig. 9A
Fig. 9C
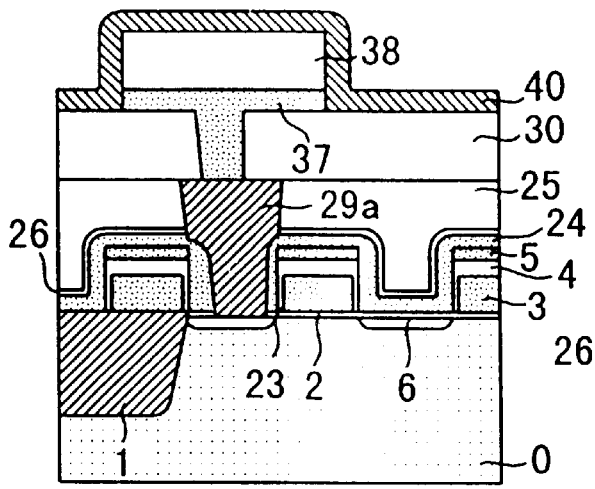
Fig. 9B

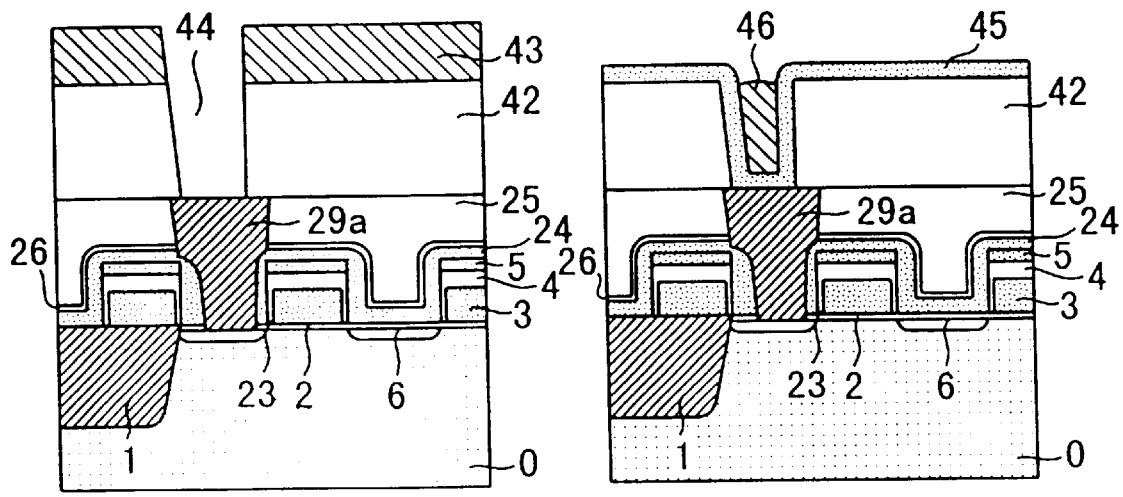
Fig. 11A
Fig. 11C
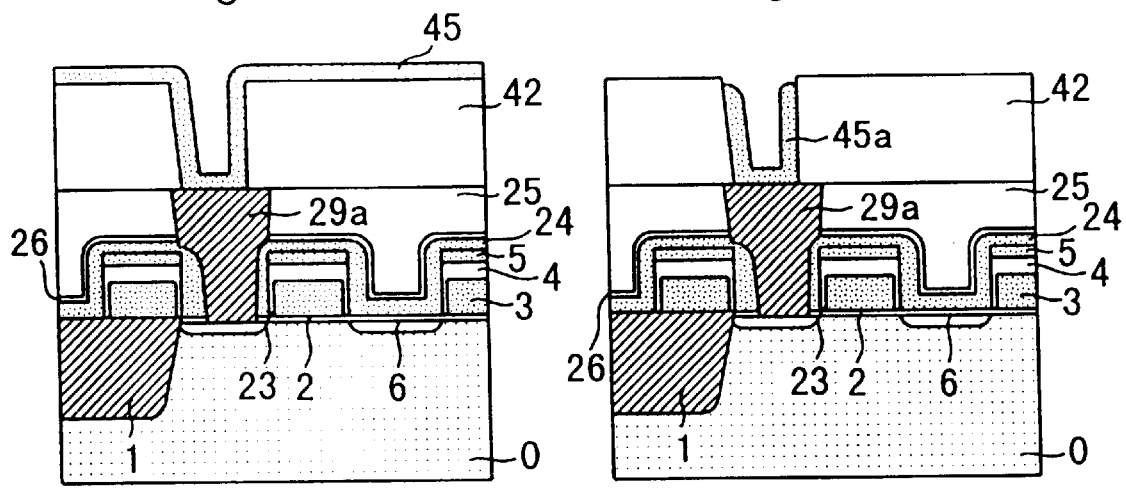
Fig. 11B
Fig. 11D

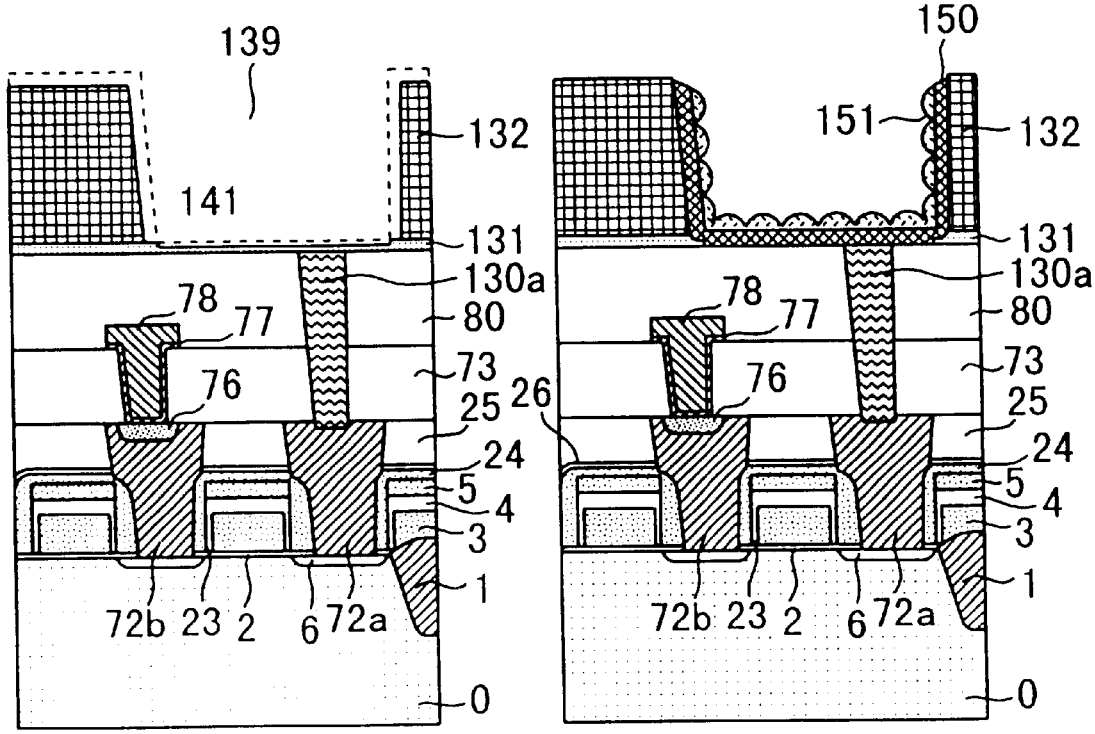
Fig. 29A
Fig. 29C
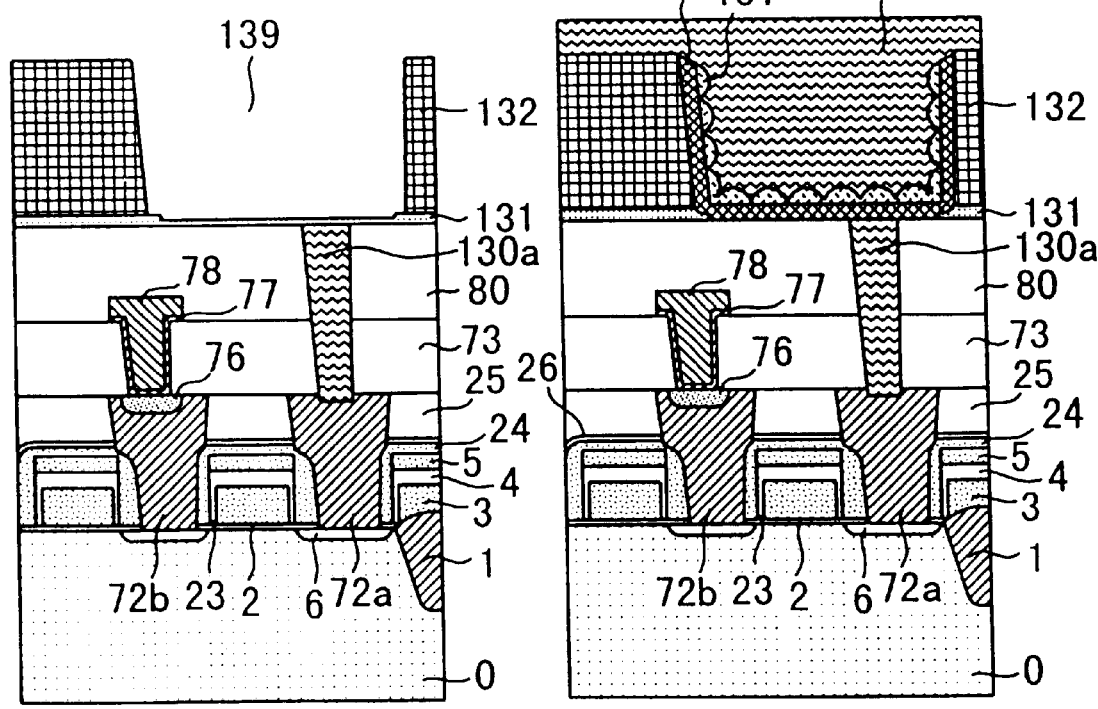
Fig. 29B
Fig. 29D

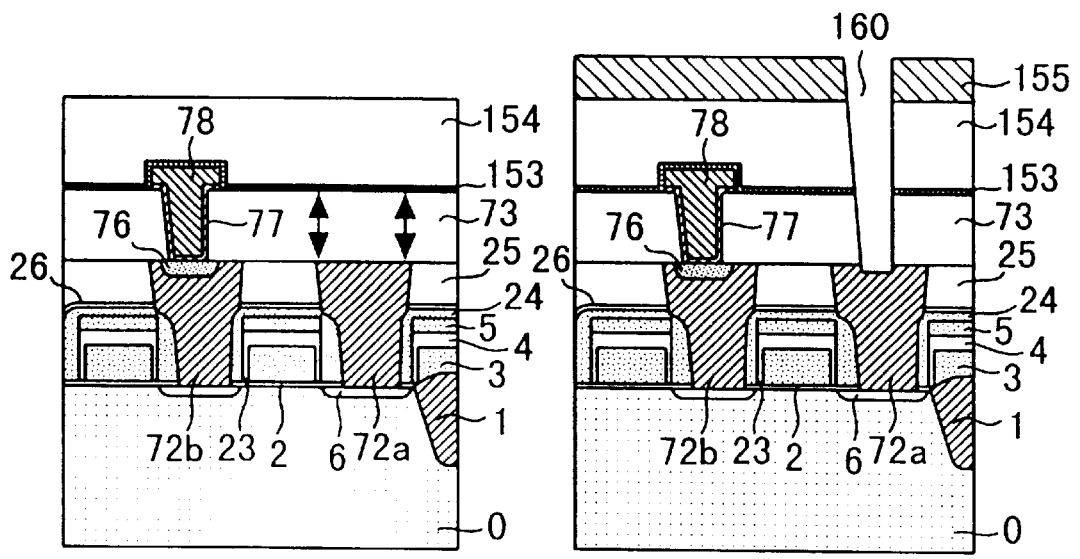
Fig. 30A
Fig. 30C
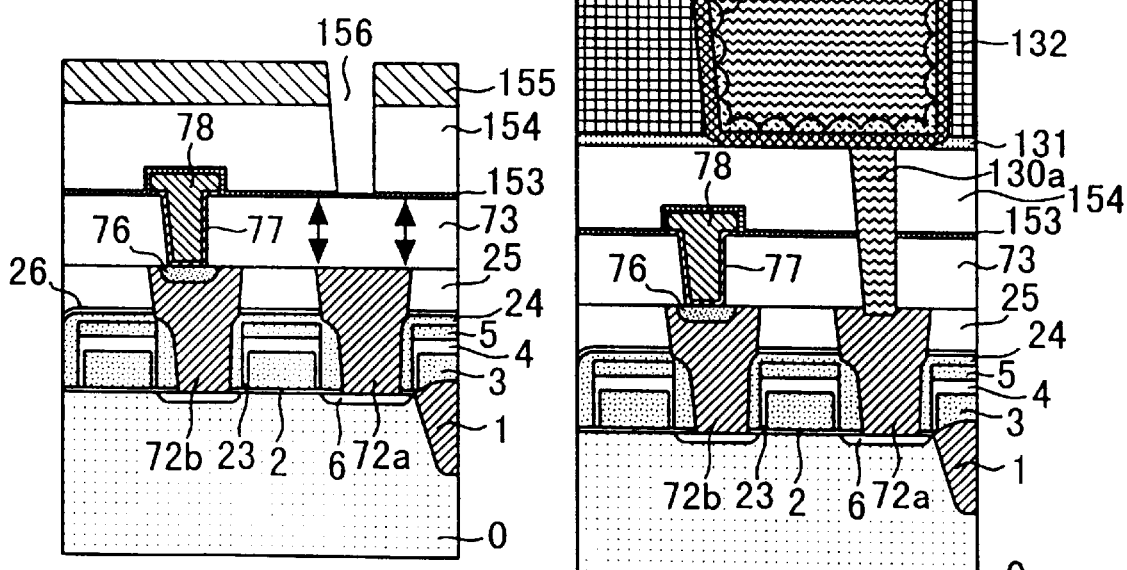
Fig. 30B
Fig. 30D

MULTILAYERED SEMICONDUCTOR DEVICE

This application is a continuation of U.S. patent application Ser. No. 09/440,575, filed Nov. 15, 1999 U.S. Pat. No. 6,369,446.

BACKGROUND OF THE INVENTION

1. Field of the Invention

The present invention generally relates to a semiconductor device and a manufacturing method thereof, and particularly to a semiconductor device having a multi-layer interconnection structure and a manufacturing method thereof.

2. Description of the Background Art

FIGS. 40A to 40F are views illustrating a related art structure of a semiconductor device having a multi-layer interconnection structure and a manufacturing method thereof. Referring to FIG. 40A, reference numeral 0 designates a silicon substrate; 1 is a trench isolation region; 2 is a gate oxide film; and 3 is a gate silicon film deposited by low pressure CVD (Chemical Vapor Deposition). The gate silicon film 3 is made from polysilicon or amorphous silicon doped with an impurity such as phosphorus (P) or arsenic (As).

In FIG. 40A, reference numeral 4 is a silicon oxide film deposited by low pressure CVD, and 5 is a silicon nitride film deposited by low pressure CVD. The gate silicon film 3, the silicon oxide film 4 and the silicon nitride film 5 form a gate electrode. Reference numeral 6 designates a source/drain region formed at a specific location surrounded by the trench isolation region 1 and the gate electrode composed of the films 3 to 5. The source/drain regions 6 are elements for constituting a transistor in cooperation with the gate electrode composed of the films 3 to 5. If the transistor is of an N-type, the source/drain region 6 is formed by implanting an impurity such as phosphorus or arsenic in the silicon substrate 0; while, if the transistor is of a P-type, the source/drain region 6 is formed by implanting an impurity such as boron (B) in the silicon substrate 0.

Referring to FIG. 40B, a silicon oxide film 300 is deposited on the silicon substrate 0 to cover the gate electrode composed of the films 3 to 5 and the source/drain regions 6.

Referring to FIG. 40C, the silicon oxide film 300 is etched to form side walls 301 covering the side surfaces of the gate electrode composed of the films 3 to 5. After formation of the side walls 301, a doped silicon film 302 made from polysilicon or amorphous silicon doped with an impurity is deposited on the silicon substrate 0 to cover the gate electrode composed of the films 3 to 5 and the side walls 301. The doped silicon film 302 is made from silicon doped with phosphorus or arsenic if the transistor is of the N-type and is made from silicon doped with boron if the transistor is of the P-type.

Referring to FIG. 40D, the doped silicon film 302 is etched in such a manner that pad layers 303 connected to the source/drain regions are formed on both sides of the gate electrode composed of the films 3 to 5.

Referring to FIG. 40F, the contact hole 306 is filled with polysilicon or amorphous silicon in such a manner that the filled-in silicon is connected to the pad layers 303, to form an interconnection layer 307. Polysilicon or amorphous silicon, which forms the interconnection layer 307, is doped with an impurity such as phosphorus or arsenic if the transistor is of the N-type and is doped with an impurity such as boron if the transistor is of the P-type.

In recent years, with the increased demands toward miniaturization of a semiconductor device, a dimensional allowable margin between the contact hole 306 and the gate electrode composed of the films 3 to 5 has come to be reduced. In such a situation, by use of the above-described pad layer 303, it is possible to ensure conduction between the interconnection layer 307 and the source/drain region 6 while preventing short-circuit between the interconnection layer 307 and the gate silicon film 3.

FIG. 41 is a cross-sectional view showing a second example of the related art semiconductor device. In FIG. 41, parts corresponding to those in FIG. 40 are designated by like reference numerals and explanation thereof is omitted.

Referring to FIG. 41, reference numeral 308 designates a high melting point metal film made from Ti, TiN or the like; 309 is a low resistance metal film made from W or the like; and 310 is a silicide film produced by reaction between a pad layer (doped polysilicon) 303 and the high melting point metal film 308.

An interconnection layer having a sufficiently low resistance can be formed by the high melting point metal film 308 and the low resistance metal film 309. The contact resistance at the contact boundary between the interconnection layer and the pad layer 303 can be sufficiently suppressed and also a desirable ohmic characteristic thereat can be ensured by the presence of the silicide layer 310 interposed between the interconnection layer and the pad layer 303. As a result, in the semiconductor device shown in FIG. 41, the resistance between a source/drain region 6 and the interconnection layer can be sufficiently suppressed.

FIGS. 42A to 42F and FIG. 43 are sectional views illustrating a manufacturing method in which a structure for connecting a source/drain region to an interconnection layer using a pad layer (hereinafter, referred to as "pad structure") is applied to a DRAM (Dynamic Random Access Memory) as well as a structure of the DRAM fabricated by the manufacturing method. In these figures, parts corresponding to those in FIGS. 40A to 40E and FIG. 41 are designated by like reference numerals and explanation thereof is omitted.

In the case of applying the pad structure to a DRAM, as shown in FIG. 42A, after formation of a silicon nitride film 5, the wafer is subjected to oxidation treatment, to form an oxide layer on side surfaces of a gate silicon film 3. As a result, the upper and side portions of the gate silicon film 3 are covered with a silicon oxide film 4. Referring to FIG. 42B, a silicon nitride film 320 is deposited by CVD to cover the entire surface of a silicon substrate 0. Then, the silicon nitride film 320 is selectively etched using a patterned resist film 321 as a mask, to form a contact hole 322 opened to each source/drain region 6 between adjacent gate electrodes.

Referring to FIG. 42C, a pad layer 323 made from doped polysilicon or amorphous silicon is formed in each contact hole 322. In FIG. 42C, of the two pad layers 323, the left one is to be connected to an interconnection layer (bit line) of the DRAM, and the right one is to be connected to a storage node (capacitor) of the DRAM.

Referring to FIG. 42D, a silicon oxide film 324 is deposited on the entire surface of the silicon substrate 0 in such a manner as to cover the upper portions of the pad layers 323.

Referring to FIG. 42E, the silicon oxide film 324 is selectively etched using a patterned resist film 330 as a mask, to form a contact hole 331 opened to each pad layer 323 to be connected to an interconnection layer.

Referring to FIG. 42F, a high melting point metal film 333 made from Ti, TiN or the like is formed in such a manner as to cover the surface of the silicon oxide film 324, the side surface of each contact hole 331, and the surface of each pad layer 323. Then, a low resistance metal film 334 made from W or the like is formed on the high melting point metal film 333.

Referring to FIG. 43, the high melting point metal film 333 and the low resistance metal film 334 are selectively etched into a desired shape, to form an interconnection layer composed of the metal films 333 and 334. Then, the wafer is subjected to a specific heat treatment, to form a silicide film 335 near the boundary between the high melting point metal film 333 and the pad layer 323.

After that, a first electrode of a capacitor is formed in such a manner as to be connected to the pad layer 323 for a capacitor. Then, an insulating film and a second electrode are sequentially formed thereon. A memory cell structure of the DRAM is thus realized. In the case of applying the pad structure to the DRAM as described above, even if the dimensional margin is small, the interconnection layer and the capacitor can be certainly connected to the source/drain resin 6 without short-circuit with the gate silicon film 3; and the resistance between the source/drain region 7 and the interconnection layer can be sufficiently suppressed according to the above structure. In this way, by use of the pad structure, a DRAM having a high level of integration and good electric characteristics can be realized.

The above pad structure, however, has problems. For example, in the pad structure shown in FIG. 40F and FIG. 41, the pad layer 303 is provided with a large stepped portion. Similarly, in the pad structure shown in FIG. 43, the pad layer 323 is provided with a large stepped portion. In the case where the pad layer 303 or 323 has such a large stepped portion, it is very difficult to form the pattern by photolithographer and etching and also to form the contact hole 306 or 322 opened to the pad layer 303 or 323 by etching. As a result, the above pad structure may cause an inconvenience such as short-circuit between the adjacent pad layers by an etching residue.

Further, in the case where the pad layer 303 or 323 has such a large stepped portion, the planarization of the interlayer insulating film, i.e., of the silicon oxide film 304 or 324 deposited on the pad layer 303 or 323 is made poor. Accordingly, the stepped portion of the pad layer 303 or 323 causes a problem that it is difficult to ensure a good processing accuracy of the interconnection layer formed on the interlayer insulating film.

In the pad structure shown in FIGS. 42A to 42F and FIG. 43, the pad layer 323 is provided between the two adjacent gate electrodes each being composed of the films 3 to 5 and a large recess is provided in the central portion of the pad layer 323, whereby the gap between the gate electrodes is made sufficiently smaller than the width of the contact hole 331 while ensuring enough contact surface. In such a pad structure, however, since the aspect ratio of the portion near the central portion of the pad layer 323 is high, the coverage of the conductive layer, that is, the high melting point metal film 333 or the first electrode of the capacitor formed on the pad layer 323 is made poor. Accordingly, the pad structure in which the pad layer 323 is provided between the two adjacent gate electrodes each being composed of the films 3 to 5 may cause a problem that the contact resistance near the pad layer 323 is increased and thereby the device characteristics are degraded.

Additionally, in the pad structure shown in FIG. 41 or 43 in which the high melting point metal film is formed on the pad layer 303 or 323, the coverage of the high melting point metal at the stepped portion of the pad layer 303 or 323 is apt to be degraded, with a result that the contact resistance at the portion near the pad layer 303 or 323 is increased. In particular, in the case where the coverage of the high melting point metal film 308 or 333 is poor, the pad layer 303 or 323 may be locally brought into contact with the low resistance metal film 309 or 334. The element W generally used for forming the low resistance metal film 309 or 334 has a property of absorbing an impurity from doped silicon. As a result, if the pad layer 303 or 323 is locally brought into contact with the low resistance metal film 309 or 334, there occurs an inconvenience such as a contact failure because of the absorption of the impurity from doped silicon by the element W.

In this way, according to the above-described pad structure, there arise various inconveniences resulting from the stepped portion of the pad layer 303 or 323. As a result, the above-described pad structure has a problem in degrading both the yield of the device and the reliability of the device.

SUMMARY OF THE INVENTION

The present invention has been conceived to solve the previously-mentioned problems, and a first object of the present invention is to provide a semiconductor device requiring a high level of integration, which is capable of ensuring a good yield and a high reliability.

A second object of the present invention is to provide a method of manufacturing a semiconductor device having a high level of integration, a good yield, and a high reliability.

The first object of the present invention is achieved by a semiconductor device as described below. The semiconductor device includes first and second circuit elements to be connected to each other. The two elements are disposed in such a manner as to be spaced from each other with a specific gap kept therebetween in the stacking direction. A first interlayer insulating film is formed on the first circuit element. A conductive pad is provided in the first interlayer insulating film in such a manner that one end surface thereof is connected to the first circuit element and the other end surface thereof is exposed to the surface of the first interlayer insulating film. A second interlayer insulating film is formed on the first interlayer insulating film and the pad. A conductive plug is provided in the second interlayer insulating film in such a manner that one end surface thereof is in contact with the pad and the other end surface thereof is connected to the second circuit element. The surface of the first interlayer insulating film is smoothly continuous to the other end surface of the pad at the same level. The plug is smaller in size than the pad and is in contact with the central portion of the pad.

The second object of the present invention is achieved by a method of manufacturing a semiconductor device in which first and second circuit elements to be connected to each other are disposed in such a manner as to be spaced from each other with a specific gap kept therebetween in the stacking direction. According to the method, a first interlayer insulating film is formed on the first circuit element. A conductive pad is provided in the first interlayer insulating film in such a manner that one end surface of the conductive pad is connected to the first circuit element. A second interlayer insulating film is formed on the first interlayer insulating film and the pad. A conductive plug is provided in the second interlayer insulating film in such a manner that one end surface of the conductive plug is in contact with the pad and the other end surface thereof is connected to the second circuit element. The step of forming the pad includes a step of forming the pad in such a manner that the other end surface of the pad is smoothly continuous to the surface of the first interlayer insulating film at the same level. Further, the plug is formed in such a manner as to be smaller in size than the pad and to be in contact with the central portion of the pad.

The first object of the present invention is also achieved be a semiconductor device described as below. The semiconductor device has a capacitor over bit line structure in which a capacitor is provided on a bit line. The semiconductor device further includes a transistor formed on a silicon substrate. The transistor includes two source/drain regions and a gate electrode held therebetween. A first interlayer insulating film is formed on the transistor. An interconnection side pad is provided in the first interlayer insulating film in such a manner that one end surface thereof is connected to one of the source/drain regions and the other end surface thereof is exposed to the surface of the first interlayer insulating film. A capacitor side pad is provided in the first interlayer insulting film. A capacitor side pad is provided in the first interlayer insulating film in such a manner that one end surface thereof is connected to the other of the source/drain regions and the other end surface thereof is exposed to the surface of the first interlayer insulating film. A second interlayer insulating film and the two pads. A bit line is formed on the second interlayer insulating film. An insulating film in such a manner that one end surface thereof is in contact with the interconnection side pad and the other end surface thereof is connected to the bit line. A third interlayer insulating film is formed on the bit lien and the second interlayer insulating film. A first electrode for a capacitor is formed on the third interlayer insulating film. A capacitor side plug is provided in the third interlayer insulating film in such a manner that one end surface thereof is in contact with the capacitor side pad and the other end surface thereof is connected to the first electrode. The surface of the first interlayer insulating film is smoothly continuous to the other end surfaces of the two pads at the same level. The interconnection side plug is smaller in size than the interconnection side pad, and is in contact with the central portion of the interconnection said pad. The capacitor side plug is smaller in size than the capacitor side pad, and is in contact with the central portion of the capacitor side pad. The interconnection side pad is made from doped silicon. The interconnection side plug includes a high melting point metal film being in contact with the interconnection side pad and a low resistance metal film formed on the high melting point metal side film. A silicide film is formed near the boundary between the interconnection side pad and the interconnection side plug. The silicide film is formed by reaction between the interconnection side pad and a first high melting point metal film suitable for preventing absorption of an impurity from the doped silicon. The high melting point metal film constituting part of the interconnection plug is a second high melting point metal film suitable for preventing reacting between the doped silicon and the low resistance metal film.

Other objects and further features of the present invention will be apparent from the following detailed description when read in conjunction with the accompanying drawings.

BRIEF DESCRIPTION OF THE DRAWINGS

FIGS. 4A to 4C are cross-sectional views illustrating essential parts of a manufacturing method of a semiconductor device according to a third embodiment of the present invention;

FIGS. 9A to 9C are cross-sectional views illustrating essential parts of a manufacturing method of a semiconductor device according to a seventh embodiment of the present invention;

FIGS. 11A to 11D are cross-sectional views illustrating essential parts of a manufacturing method of a semiconductor device according to a ninth embodiment of the present invention;

FIGS. 29A to 29D are cross-sectional views illustrating essential parts of a manufacturing method of a semiconductor device according to a twenty-second embodiment of the present invention;

FIGS. 30A to 30D are cross-sectional views illustrating essential parts of a manufacturing method of a semiconductor device according to a twenty-third embodiment of the present invention;

BEST MODE OF CARRYING OUT THE INVENTION

Figure 1A:
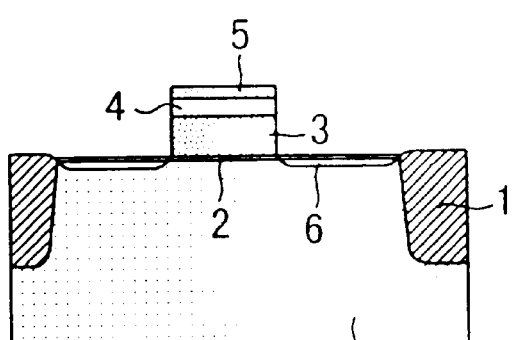
FIGS. 1A to 1F and FIG. 2 are cross-sectional views illustrating the structure of a semiconductor device and a manufacturing method thereof according to a first embodiment of the present invention.

In the following, principles and embodiments of the present invention will be described with reference to the accompanying drawings. The members and steps that are common to some of the drawings are given the same reference numerals and redundant descriptions therefor may be omitted.

First Embodiment

FIGS. 1A to 1F and FIG. 2 are cross-sectional views illustrating the structure of a semiconductor device and a manufacturing method thereof according to a first embodiment of the present invention. Referring to FIG. 1A, reference numeral 0 designates a silicon substrate; 1 is a trench isolation region; 2 is a gate oxide film; and 3 is a gate silicon film deposited by low pressure CVD (Chemical Vapor Deposition). The gate silicon film 3 is made from polysilicon or amorphous silicon which is doped with an impurity such as phosphorus or arsenic.

In FIG. 1A, reference numeral 4 designates a silicon oxide film deposited by low pressure CVD and 5 is a silicon nitride film deposited by low pressure CVD. The gate silicon film 3, the silicon oxide film 4 and the silicon nitride film 5 form a gate electrode. Reference numeral 6 is a source/drain region formed at a specific location surrounded by the trench isolation region 1 and the gate electrode composed of the films 3 to 5. The source/drain regions 6 are elements for constituting a transistor in cooperation with the gate electrode composed of the films 3 to 5. If the transistor is of an N-type, the source/drain region 6 is formed by implanting an impurity such as phosphorus or arsenic in the silicon substrate 0; while, if the transistor is of a P-type, the source/drain region 6 is formed by implanting an impurity such as boron in the silicon substrate 0.

Figure 1B:
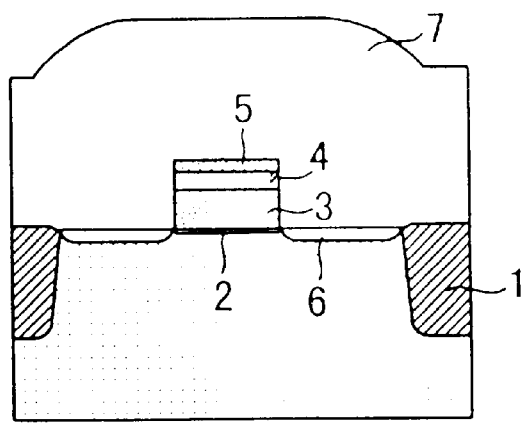

Referring to FIG. 1B, a silicon oxide film 7 is deposited on the silicon substrate 0 by low pressure or atmospheric pressure CVD in such a manner as to cover the gate electrode composed of the films 3 to 5 and the source/drain regions 6. The silicon oxide film 7 is made from an undoped silicon oxide or a silicon oxide doped with phosphorus or boron. If the silicon oxide film 7 is made from the silicon oxide doped with phosphorus or boron, to improve the planarization for a stepped portion of the silicon oxide film 7, the silicon oxide film 7 is subjected to a reflow process by heat-treatment, more specifically, by annealing which is performed by heating the silicon substrate 0 in an atmosphere of $H_2O_2$, $O_2$, $N_2$ or the like at a temperature ranging about 700° C. to about 900° C.

Figure 1C:
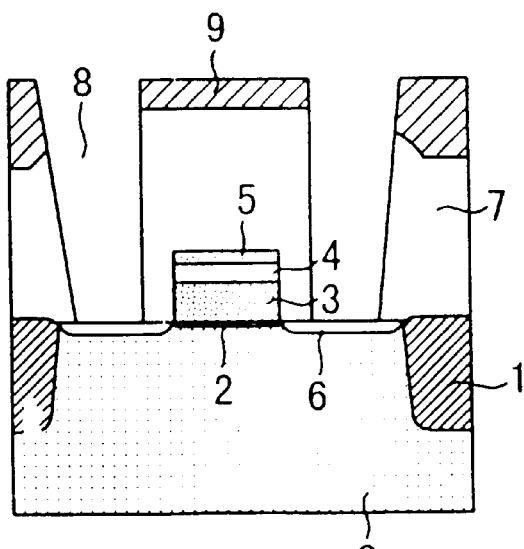

Referring to FIG. 1C, a patterned resist film 9 is formed on the silicon oxide film 7. The silicon oxide film 7 is selectively removed by dry etching such as RIE (Reaction Ion Etching) using the patterned resist film 9 as a mask, to form contact holes 8 opened to the source/drain regions 6. The contact hole 8 is formed into such a taper shape that the diameter of the contact hole 8 is gradually reduced from top to bottom for improving the burying characteristic of a layer which will be formed to fill the contact hole 8.

Figure 1D:
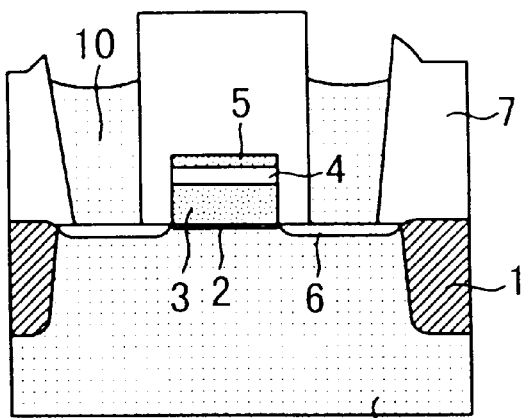

Referring to FIG. 1D, a layer of polysilicon or amorphous silicon doped with an impurity is deposited over the surface of the silicon substrate 0 by CVD in such as manner as to fill the contact holes 8. Phosphorus, arsenic or the like is used as the above impurity if the transistor is of the N-type, and boron or the like is used as the above impurity if the transistor is of the P-type. Then, the entire surface of the silicon substrate 0 is etched back by dry etching such as RIE, to form pads 10 composed of doped silicon in the contact holes 8.

Figure 1E:
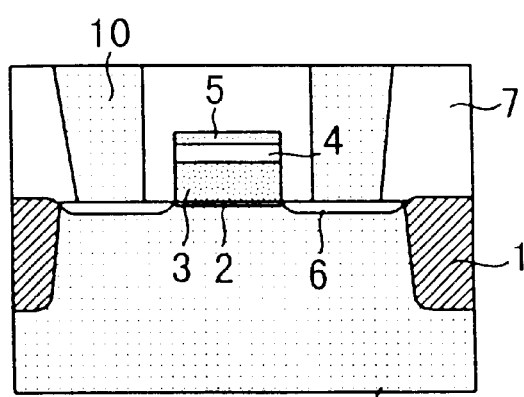

Referring to FIG. 1E, the silicon oxide film 7 and the pads 10 are polished by CMP (Chemical Mechanical Polishing) in such a manner that the surfaces of the pads 10 are smoothly continuous to the surface of the silicon oxide film 7 at the same level. As a result, one end surface of the pad 10 is connected to the source/drain region 6 and the other end surface thereof is made at the same level as the surface of the silicon oxide film 7.

In this embodiment, the above-described CMP is performed under a condition suitable for polishing portions projecting from the wafer. With this CMP, it is possible to remove an unnecessary portion of the silicon oxide film 7 for a short time without excessively removing an edge portion and the like of the pattern on the wafer, and hence to accurately form a desired structure.

Figure 1F:
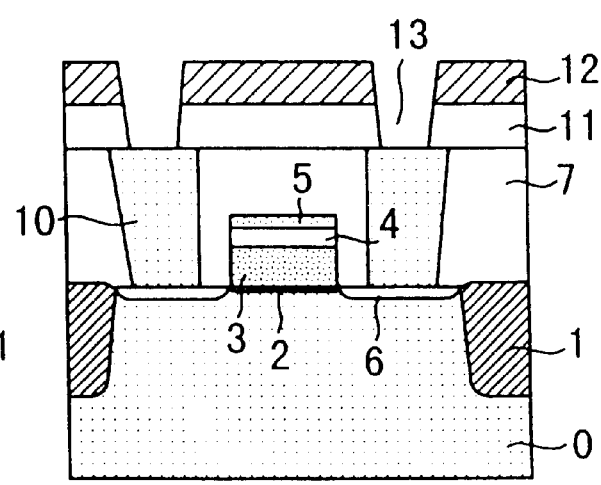

Referring to FIG. 1F, a silicon oxide film 11 is further deposited on the silicon oxide film 7 and the pads 10. Like the silicon oxide film 7, the silicon oxide film 11 is made from an undoped silicon oxide or a silicon oxide doped with an impurity such as phosphorus or boron. A patterned resist film 12 is formed on the silicon oxide film 11. The silicon oxide film 11 is selectively removed by dry etching such as RIE using the patterned resist film 12 as a mask, to form contact holes 13 each of which is smaller than the pad 10 and is opened to the central portion of the pad 10.

In the above fabrication step shown in FIG. 1F, the silicon oxide film 11 is deposited on the flat plane composed of the planarized surfaces of the silicon oxide film 7 and the pads 10. Accordingly, through the above-described sequential treatments, it is possible to easily make uniform the thickness of the silicon oxide film 11 and to easily planarize the surface of the silicon oxide film 11. Further, in accordance with the above-described fabrication step, since the surfaces of the pads 10 are planarized, the pattern of the resist film 12 for forming the contact holes 13 can be easily accurately obtained by photolithography; and since the aspect ratio of each contact hole 13 is suppressed at a sufficiently small value resulting from the planarized surfaces of the pads 10, etching for forming the contact holes 13 can be accurately performed and also the etching residue can be easily removed.

Figure 2:
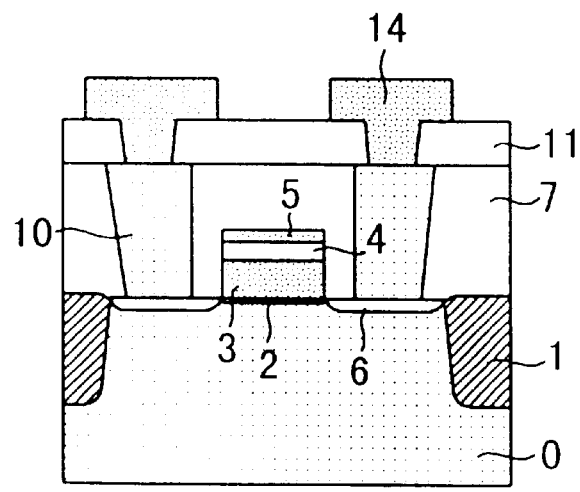

Referring to FIG. 2, after removal of the resist film 12, polysilicon or amorphous silicon doped with an impurity is deposited by CVD to fill the contact holes 13. Phosphorus, arsenic or the like is used as the above impurity if the transistor is of the N-type, and boron or the like is used as the above impurity if the transistor is of the P-type. The doped silicon film is then selectively removed by dry etching such as RIE, to form a patterned interconnection layer 14 communicated to the source/drain regions 6 by way of the contact holes 13.

According to the fabrication process in this embodiment, since the surfaces of respective layers under the interconnection layer 14 are sufficiently planarized etching for forming the interconnection layer 14 can be accurately performed and also the etching residue can be easily removed.

As described above, in the semiconductor device in this embodiment, the contact hole 13 for forming the interconnection layer 14 is formed in the size smaller than the pad 10. The formation of the pad 10 becomes easier as the width of the pad 10 becomes wider. In particular, if the contact hole 8 for containing the pad 10 is formed in accordance with a known self-alignment manner, it is important to sufficiently ensure the diameter of the contact hole 8 for preventing an opening failure.

On the other hand, each contact hole 13 for forming the interconnection layer 14 may be desired to be made as small as possible for enhancing the level of integration of the semiconductor device. According to the structure in this embodiment, since the aspect ratio of the contact hole 13 is small; the silicon oxide film 11 is planarized; and the thickness of the silicon oxide film 11 is uniform, the fine contact hole 13 can be formed with a sufficiently high dimensional accuracy. As a result, in this embodiment, as described above, the contact hole 13 is formed in the size smaller than the pad 10, and accordingly, it is possible to fabricate a highly integrated semiconductor device at a high yield.

Further, in this embodiment, each contact hole 13 for forming the interconnection layer 14 is formed in such a manner as to be opened to the region near the central portion of the pad 10. The region near the central portion of the pad 10 is superior in planarization to the peripheral edge portion of the pad 10. Accordingly, in the structure in this embodiment, the interconnection layer 14 can be brought in contact with the particularly planarized portion of the pad 10. Further, accord ng to this structure, even if an error in accuracy occurs upon alignment of the contact hole 13 and the pad 10, it is possible to stably ensure the desirable contact area therebetween. As a result, according to the structure in this embodiment, a semiconductor device having stable electric characteristics can be manufactured with a high yield.

Second Embodiment

Figures 3A, 3B:
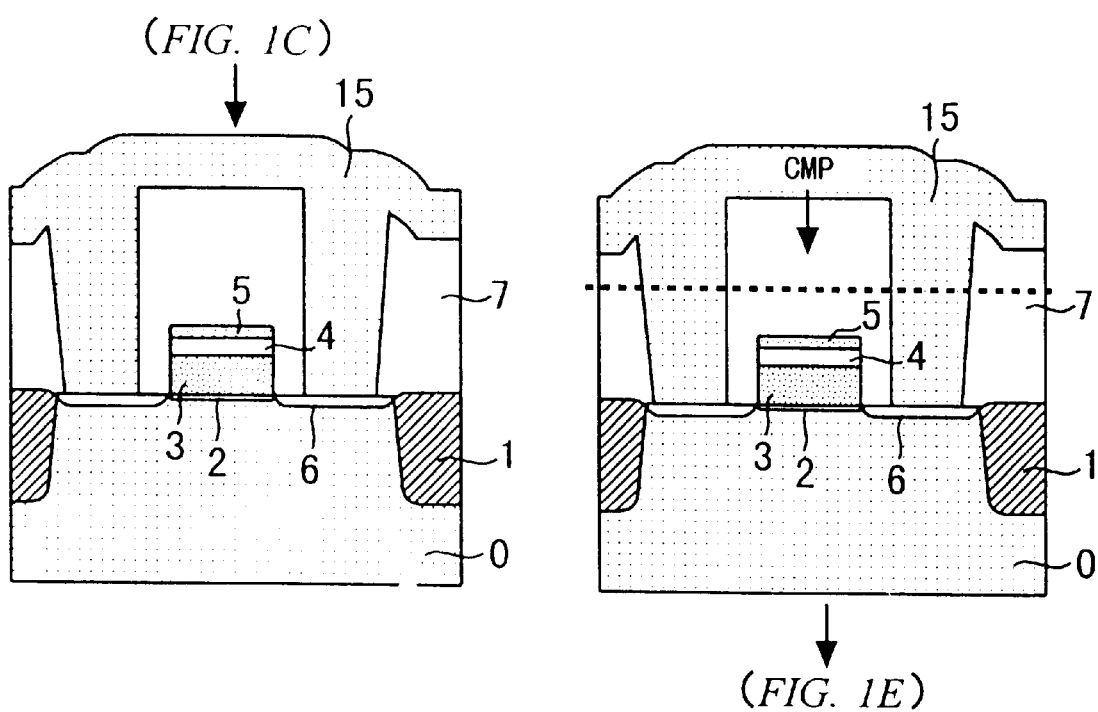
FIGS. 3A and 3B are cross-sectional views illustrating essential parts of a manufacturing method of a semiconductor device according to a second embodiment of the present invention.

A second embodiment of the present invention will be described with reference to FIGS. 3A and 3B. FIGS. 3A and 3B are cross-sectional views illustrating essential part of a method of manufacturing a semiconductor device according to the second embodiment.

According to the manufacturing method in the first embodiment, doped silicon for forming the pads 10 is deposited over the entire surface of the silicon substrate 0 and the entire surface of the silicon substrate 0 is etched back by dry etching. Such a state is shown in FIG. 1D. Then, the unnecessary portion of the silicon oxide film 7 is removed by CMP, to planarize the surfaces of the pads 10 and the surface of the silicon oxide film 7 at the same level.

On the contrary, according to the manufacturing method in the second embodiment, as shown in FIG. 3A, after deposition of doped silicon 15 over the entire surface of the silicon substrate 0, CMP is performed without carrying out etching back as shown in FIG. 3B. In this embodiment, the CMP is performed under a condition that the polishing rate of the doped silicon layer 15 is nearly equal to that of the silicon oxide film 7. According to such a manufacturing method, since etching back required in the first embodiment is omitted, it is possible to simplify the fabrication steps.

Third Embodiment

A third embodiment of the present invention will be described with reference to FIGS. 4A to 4C. FIGS. 4A to 4C are cross-sectional views illustrating essential part of a method of a semiconductor device according to the third embodiment.

According to the manufacturing method in the third embodiment, contact holes 13 opened to pads 10 are formed in the same manner as that in the first embodiment (see FIG. 1F). Referring to FIG. 4A, after formation of the contact holes 13, a high melting point metal film made from Ti, TiN, WN or the like or a multi-layer film formed by two or more layers made from Ti, TiN, WN and the like (hereinafter, referred to as "high melting point metal film 16") is formed by sputtering or CVD in such a manner as to cover the inner walls of the contact holes 13, exposed portions of the pads 10, and the surface of the silicon oxide film 11.

The silicon oxide film 11 is formed in the same manner as that in the first embodiment in such a manner as to have the planarized surface and the uniform thickness. Only the planarized region near the central portion of the pad 10 is used as the underlying layer of the high melting point metal film 16. Further, since the aspect ratio of each contact hole 14 is small, the high melting point metal film 16 can be relatively easily formed on the side surface of the contact hole 13 and the bottom surface (surface of the pad 10) of the contact hole 13 by sputtering or CVD. As a result, according to the manufacturing method in the third embodiment, the high melting point metal film 16 having a uniform thickness can be formed inside and outside the contact holes 13 with a desirable coverage.

After formation of the high melting point metal film 16, the wafer is subjected to RTA (Rapid Thermal Annealing) in an atmosphere of $N_2$ or $O_2$ at a temperature ranging from 600° C. to 900° C., with a result that as shown in FIG. 4B, a silicide film 18 is produced near the boundary between the high melting point metal film 16 and each pad 10. Since the thickness of the high melting point metal film 16 is uniform as described above, the thickness of the silicide film 18 becomes uniform. As a result, a good ohmic characteristic and a contact characteristic with a small resistance are ensured between the high melting point metal film 16 and each pad 10.

Referring to FIG. 4B, a low resistance metal film 17 having a resistance further smaller than that of the high melting point metal film 16 is formed on the high melting point metal film 16. Concretely, the low resistance metal film 17 made from W, copper (Cu), aluminum (Al) or the like is deposited on the high melting point metal film 16 by sputtering or CVD.

Referring to FIG. 4C, the high melting point metal film 16 and the low resistance metal film 17 are selectively removed by dry etching such as RIE to be formed into a desired interconnection pattern, resulting in forming an interconnection layer having a double layer structure of the films 16 and 17, which is conducted to the source/drain regions 6 via the pads 10.

The metal such as W used for forming the low resistance metal film 17 has a property of absorbing an impurity containing in silicon when the metal is in contact with silicon. The high melting point metal film 16, which is interposed between the low resistance metal film 17 having such a property and the pad 10, functions as a film for preventing absorption of an impurity from the pad 10 to the low resistance metal film 17, that is, as a barrier layer.

The high melting point metal film 16 has, as described above, the uniform thickness over the entire inner region of each contact hole 13. Accordingly, the high melting point metal film 16 functions as a suitable barrier film over the entire inner region of the contact hole 13. As a result, according to the structure in the third embodiment, it is possible to certainly prevent a contact failure and the like resulting from absorption of an impurity from each pad 10 to the low resistance metal film 1.

Fourth Embodiment

A fourth embodiment of the present invention will be described with reference to FIGS. 5A to 5E. FIGS. 5A to 5E are cross-sectional views illustrating essential part of a method of a semiconductor device according to the fourth embodiment.

Figure 5A:
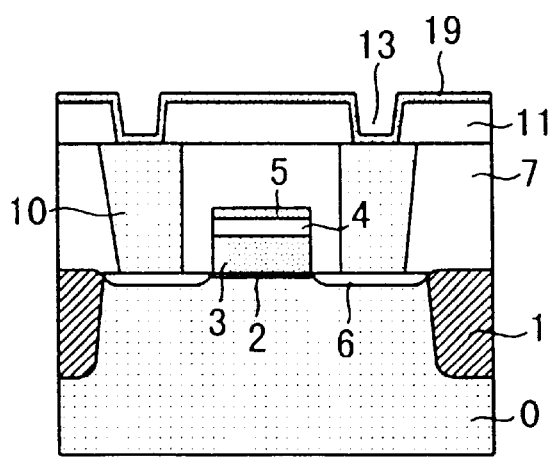
FIGS. 5A to 5E are cross-sectional views illustrating essential parts of a manufacturing method of a semiconductor device according to a fourth embodiment of the present invention.

According to the manufacturing method in the fourth embodiment, contact holes 13 opened to pads 10 are formed in the same manner as that in the first embodiment (see FIG. 1F). After formation of the contact holes 13, as shown in FIG. 5A, a first high melting point metal film 19 is formed in such a manner as to cover the inner walls of the contact holes 13, the exposed portions of the pads 19, and the surface of the silicon oxide film 11. The first high melting point metal film 19 is formed in the same manner as that for forming the high melting point metal film 16 in the third embodiment.

Figure 5D:
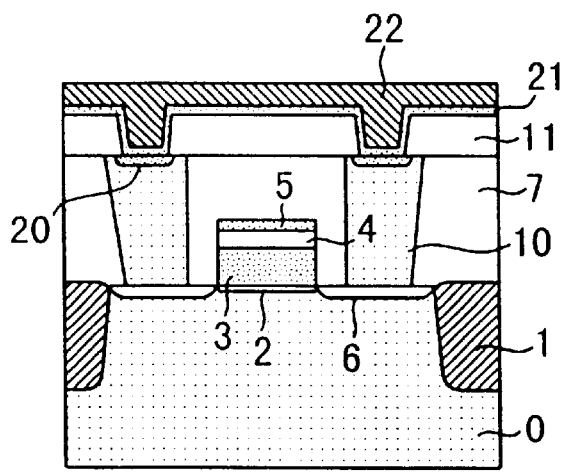
Figure 5B:
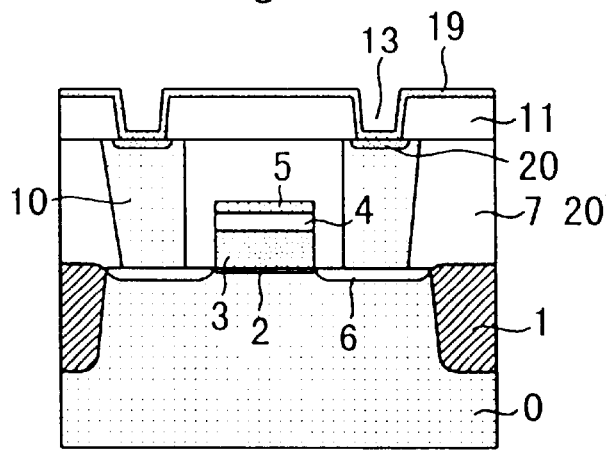

Referring to FIG. 5B, the wafer is subjected to RTA, to produce a silicide film 20 near the boundary between the first high melting point metal film 19 and each pad 10. Like the third embodiment, the first high melting point metal film 19 is formed with a desirable coverage and a uniform thickness, so that the thickness of the silicide film 18 is uniform and a good ohmic characteristic and a contact characteristic with a small resistance are ensured between the first high melting point metal film 19 and each pad 10.

Figure 5E:
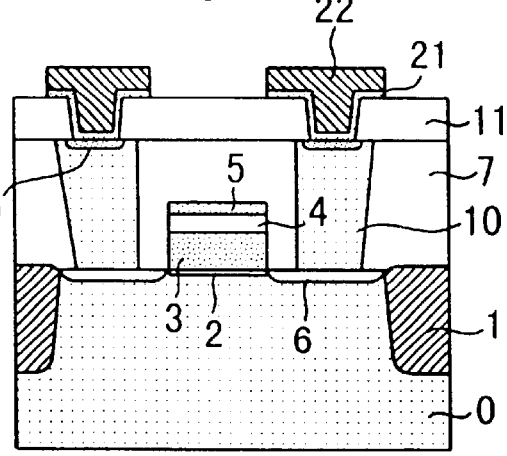
Figure 5C:
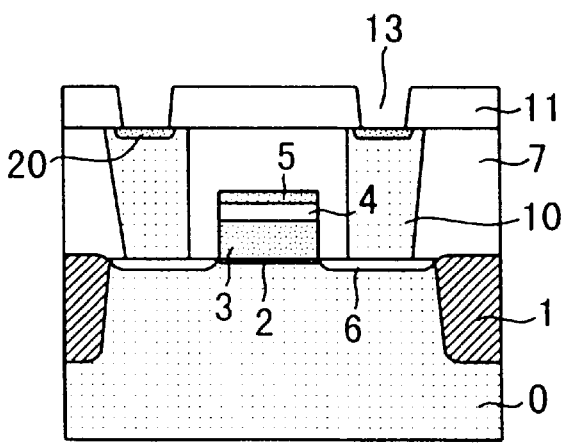

According to the manufacturing method in the fourth embodiment, as shown in FIG. 5C, after formation of the silicide film 20, the first high melting point metal film 19 remaining inside and outside the contact holes 13 is removed. The processing is performed by dipping the wafer in an oxidizing solution prepared by mixing hydrogen peroxide to sulfuric acid or nitric acid.

Referring to FIG. 5D, a second high melting point metal film 21 made from Ti, TiN or the like is formed by sputtering or CVD in such a manner as to cover the surface of the silicide film 20, the side surfaces of the contact holes 13, and the surface of the silicon chide film 11. The wafer is subjected to RTA, and then a low resistance metal film 22 made from W, Cu, Al or the like is formed on the second high melting point metal film 21.

Referring to FIG. 5E, the second high melting point metal film 21 and the low resistance metal film 22 are selectively removed by dry etching such as RIE to be formed into a desired interconnection layer having a double layer structure of the films 21 and 22 which is connected to each source/drain region 6 via the pad 10.

In the case where the interconnection layer containing the low resistance metal film is formed on each pad 10, the high melting point metal film functioning as a barrier layer is required to be formed between the pad 10 and the low resistance metal film for preventing reaction therebetween. Further, in order to form a silicide film having a sufficiently large thickness between each pad 10 and the high melting point metal film, it is required to ensure a somewhat large thickness of the high melting point metal film. On the other hand, to reduce the resistance of the interconnection layer, it may be desirable that the occupancy of the low resistance metal film 21 in the contact hole 13 be made as large as possible. As the size of the contact hole 13 becomes finer, it becomes more difficult to make the requirement to increase the occupancy of the low resistance metal film compatible with the requirement to ensure a somewhat large thickness of the high melting point metal film for ensuring a sufficiently large thickness of the silicide film 20.

According to the manufacturing method in this embodiment, a sufficiently large thickness of the silicide film 20 can be ensured without imparting a large thickness to the second high melting point metal film 21. Thus, even if the size of each contact hole 13 is made sufficiently fine, it is possible to sufficiently ensure the thickness of he silicide film 20 while keeping a sufficiently large occupancy of the low resistance metal film 22 in the contact hole 13.

Also in accordance with the manufacturing method in the fourth embodiment, the thicknesses and properties of the silicide film 20 and the barrier layer can be freely set by suitably selecting the kinds of the first and second high melting point metal films 19 and 21, the annealing condition, and the like. For example, if the first high melting point metal film 19 is made from cobalt (Co) and the second high melting point metal film 21 is made from Ti or TiN, the silicon film 20 can be configured as a cobalt silicide film and the barrier layer can be configured as a Ti or TiN layer.

Ti or TiN has a desirable property of preventing reaction between doped silicon and a low resistance metal such as W but has an undesirable property of easily absorbing an impurity contained in silicon as compared with cobalt. In this regard, by forming cobalt silicide under Ti or TiN, it is possible to effectively prevent absorption of an impurity from silicon to Ti or TiN. For this reason, when the first high melting point metal film 19 is made from Co and the second high melting point metal film 21 is made from Ti or TiN as described above, an extremely stable contact characteristic can be given to the contact portion between each pad 10 and the interconnection layer.

It should be noted that the first high melting point metal film 19 is not limited to the Co film, but may be a Ti or TiN film or a stacked film of the Ti or TiN film and the Co film, as well as the second high melting point metal film 21 is not limited to the single Ti or TiN film, but may be a stacked film of the Ti film and the TiN film.

Fifth Embodiment

A fifth embodiment of the present invention will be described with reference to FIGS. 6A to 6F and FIGS. 7A to 7C. FIGS. 6A to 6F and FIGS. 7A to 7C are cross-sectional views illustrating a structure of a semiconductor device and a manufacturing method thereof according to the fifth embodiment. In the semiconductor device in the fifth embodiment, a capacitor portion of a DRAM has the same structure as that in the first embodiment.

Figure 6A:
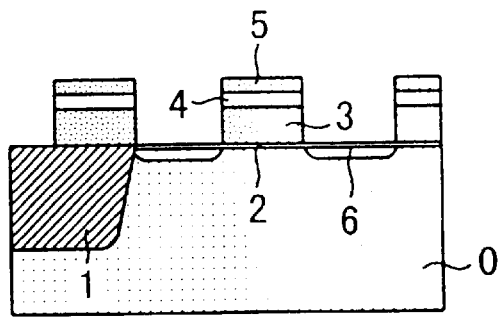
FIGS. 6A to 6F and FIGS. 7A to 7C are cross-sectional views illustrating the structure of a semiconductor device and a manufacturing method thereof according to a fifth embodiment of the present invention.

According to the manufacturing method in this embodiment, as shown in FIG. 6A, a transistor is formed on a silicon substrate 0 in the same manner as that in the first embodiment.

Figure 6B:
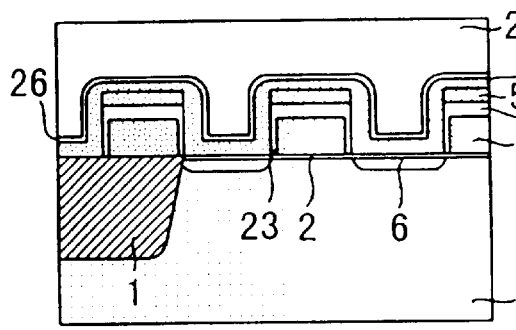

Referring to FIG. 6B, the silicon substrate 0 is subjected to oxidation treatment to form a silicon oxide film 23 on the side surfaces of a gate silicon film 3. Then, a silicon nitride film 24 is deposited over the entire surface of the substrate 0. To desirably keep a hot carrier characteristic of the transistor, it is required to avoid direct contact of the silicon nitride film with the gate silicon film 3. According to the structure in the fifth embodiment, the above requirement is satisfied by interposing the silicon oxide film 23 between the silicon nitride film 24 and the gate silicon film 3.

After a wafer region (not shown) in which a peripheral circuit of the DRAM is to be formed is subjected to a specific treatment, an undoped silicon oxide film 26 and a doped silicon oxide film 25 are deposited on the silicon nitride film 24 in this order. The treatment for forming the peripheral circuit includes the step for removing part of the silicon nitride film 24 to expose silicon. The undoped silicon oxide film 26 formed under the doped silicon oxide film 25 prevents diffusion of an impurity from the doped silicon oxide film 25 to the exposed silicon portion.

Figure 6C:
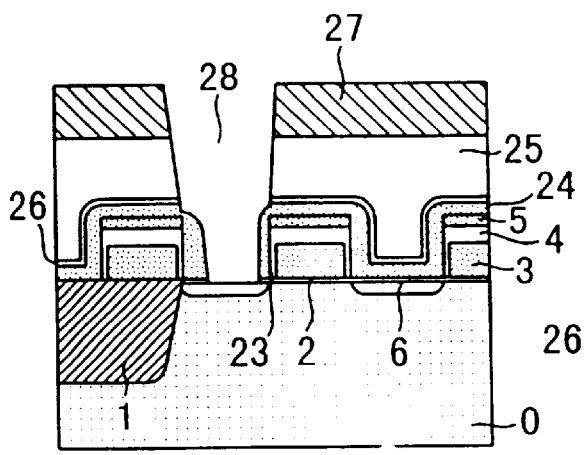

Referring to FIG. 6C, a patterned resist film 27 is formed on the silicon oxide film 26. The silicon oxide films 25 and 26 and the silicon nitride film 24 are selectively etched using the patterned resist film 27 as a mask to form a contact hole 28 opened to the source/drain region 6. In formation of the contact hole 28, etching is first performed under such a condition as to make high the etching selectivity for the silicon oxide, to thereby preferentially remove the silicon oxide films 25 and 26. This means that the formation of the contact hole 28 by etching proceeds in self-alignment manner. When the silicon nitride film 24 is exposed in the semi-formed contact hole 28, the etching condition is changed to such a condition as to make high the etching selectivity for the silicon nitride film. As a result, the contact hole 28 shown in FIG. 6C can be accurately formed.

As the method of forming a contact hole opened to the source/drain region 6 in self-alignment manner, there has been known a method in which silicon nitride is formed only on side walls of a gate electrode composed of films 3 to 5, that is, silicon nitride is not formed between the adjacent side walls of the two gate electrodes. According to this method (hereinafter, referred to as "comparative method"), the contact hole can be formed only by performing etching under such a condition as to make high the etching selectivity for the silicon oxide.

However, a region between the above adjacent side walls of the two gate electrodes may be overlapped to a trench isolation region 1 or the like. In such a case, it is required to sufficiently suppress the amount of over etching of the trench isolation region 1 accompanied by formation of the contact hole. According to the comparative method, since etching for forming the contact hole is not stopped on the way, it is not necessarily easy to suppress the over etching amount. On the contrary, according to the method in the fifth embodiment, since the progression of etching is stopped on the way, it is easy to suppress the over etching amount. As a result, according to the manufacturing method in the fifth embodiment, it is possible to accurately form the contact hole 28 without imparting unnecessary damage to components in the semiconductor device.

Figure 6D:
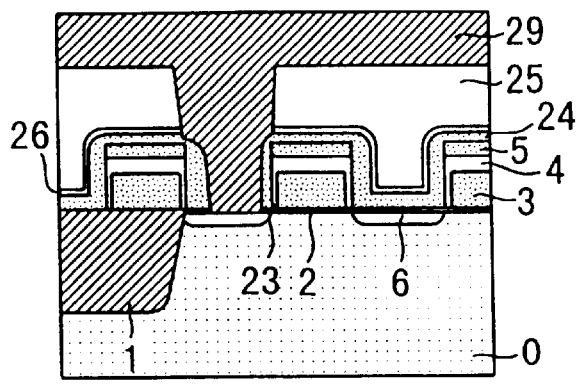

Referring to FIG. 6D, after formation of the contact hole 28, a doped silicon film 29 is deposited on the entire surface of the silicon substrate 0 in such a manner as to fill the contact hole 28.

Figure 6E:
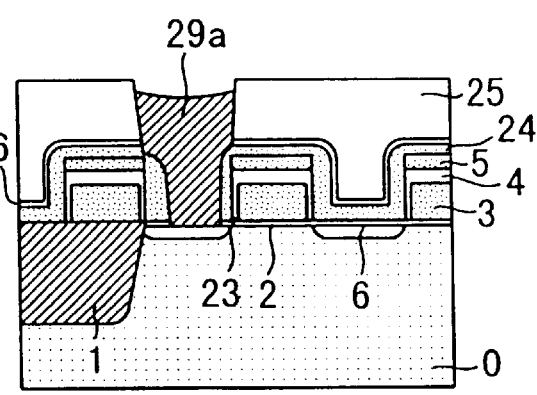

Referring to FIG. 6E, the entire surface of the silicon film 29 is etched back by dry etching such as RIE, to form a pad 29a made from doped silicon in the contact hole 28.

Figure 6F:
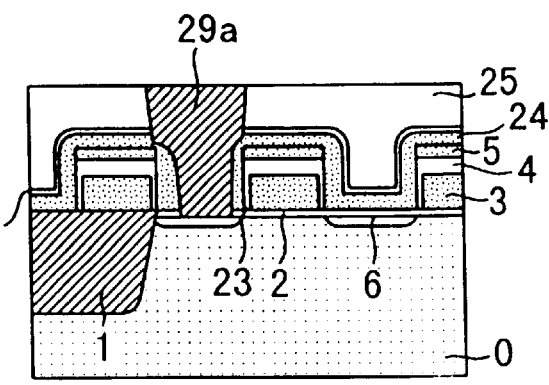

Referring to FIG. 6F, the pad 29a and the silicon oxide film 25 are polished by CMP in such a manner that the surface of the pad 29a is smoothly continuous to the surface of the silicon oxide film 25 at the same level. As a result, one end surface of the pad 29a is connected to the source/drain region 6, and the other end surface thereof is made at the same level as the surface of the silicon oxide film 25.

Figure 7A:
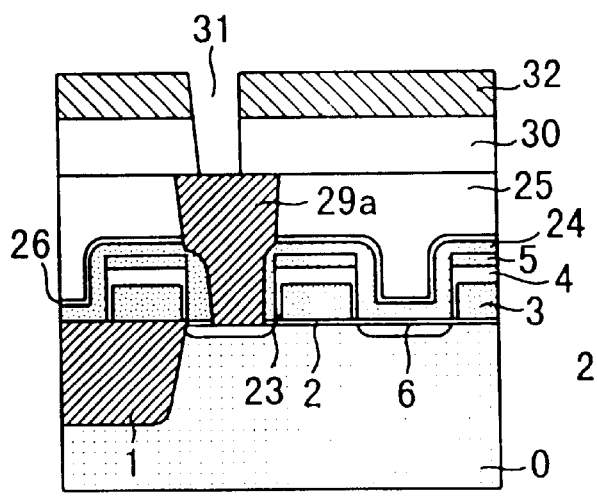

Referring to FIG. 7A, a silicon oxide film 30 is deposited on the silicon oxide film 25 and the pad 29a, and a patterned resist film 32 is formed on the silicon oxide film 30. The silicon oxide film 30 is selectively removed using the patterned resist film 32 as a mask by dry etching such as RIE, to form a contact hole 31 which is smaller in size than the pad 10 and is opened to the central portion of the pad 29a.

Figure 7C:
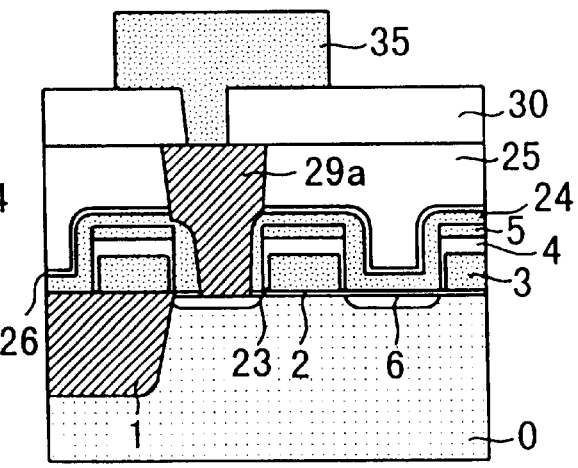
Figure 7B:
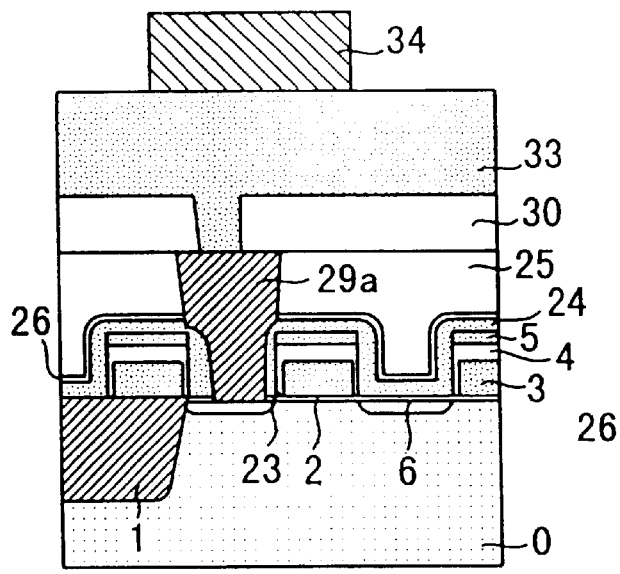

Referring to FIG. 7B, after removal of the resist film 32, a doped polysilicon or amorphous silicon film 33 is formed by CVD to fill the contact hole 31. A resist film 34 patterned into the same shape as that of a first electrode of a capacitor is formed on the silicon film 33.

Referring to FIG. 7C, the silicon film 33 is selectively removed using the patterned resist film 34 as a mask by dry etching such as RIE, to form a first electrode 35 connected to the pad 29a via the contact hole 31. In the manufacturing method of this embodiment, since the surfaces of respective layers formed under the first electrode are sufficiently planarized, the first electrode 35 can be accurately formed by etching. After that, an insulating film and a second electrode are formed on the fist electrode 35, to obtain a capacitor functioning as a memory cell of a DRAM.

In the fifth embodiment, the contact hole 28 to be filled with the pad 29a is formed in self-alignment manner. To be more specific, in formation of the contact hole 28, etching is first performed under such a condition as to remove the silicon oxide film 25 in preference to the silicon nitride film 24. The effect of self-alignment becomes larger as the etching selectivity for the silicon oxide film 25 becomes higher. The etching selectivity for the silicon oxide film 25 becomes higher as the deposition characteristic of an etching gas for the silicon nitride film 24 becomes larger.

According to this embodiment, the width of the lower portion of the contact hole 28 becomes smaller as the thickness of the silicon nitride film 24 becomes larger. As a result, the width of the lower portion of the contact hole 28 becomes smaller as the etching gas for forming the contact hole 28 exhibits the higher deposition characteristic for the silicon nitride film 24, that is, the etching gas exhibits the higher etching selectivity for the silicon oxide film 25.

The contact hole 28 is harder to be cut through as the width of the lower portion of the contact hole 28 becomes smaller. Accordingly, to sufficiently obtain the effect of self-alignment manner, it is effective to make the size of the contact hole 28 larger enough to prevent occurrence of an opening failure even by use of an etching gas having a high etching selectivity for the silicon oxide film 25.

As described above, according to the fifth embodiment, the contact hole 31 to be filled with the first electrode 35 is formed in a small size from the viewpoint of enhancing the level of integration of the semiconductor device; while the contact hole 28 to be filled with the pad 29a is formed so as to have a large width. As a result, according to the structure in the fifth embodiment, it is possible to realize a DRAM having a high level of integration, which can be fabricated with a high yield.

Sixth Embodiment

Figure 8:
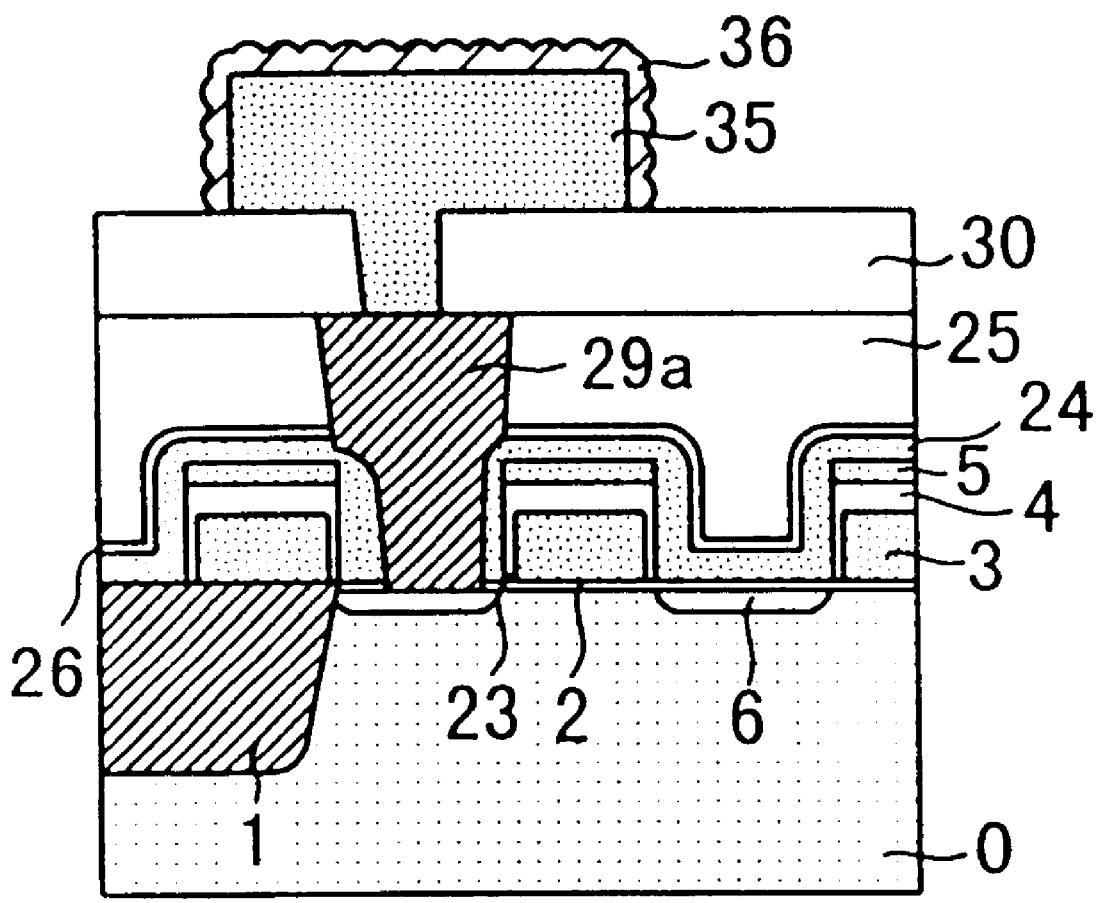
FIG. 8 is a cross-sectional view illustrating the structure of a semiconductor device according to a sixth embodiment of the present invention.

A sixth embodiment of the present invention will be described with reference to FIG. 8. FIG. 8 is a cross-sectional view showing a structure of a semiconductor in the sixth embodiment. The semiconductor in the sixth embodiment, which is a variation of the semiconductor device in the fifth embodiment, is characterized in that granular crystals 36 are grown on the surface of the first electrode 35. According to this structure, since the surface area of the first electrode 35 is increased, the capacitance of the capacitor can be increased.

Seventh Embodiment

A seventh embodiment of the present invention will be described with reference to FIGS. 9A to 9C. FIGS. 9A to 9C are cross-sectional views illustrating a structure of a semiconductor device and a manufacturing method thereof according to the seventh embodiment. The semiconductor device in the seventh embodiment, which is another variation of the semiconductor device in the fifth embodiment, is characterized in that a cylindrical electrode is used as the first electrode of the capacitor.

According to the fabrication steps for a semiconductor device in the seventh embodiment, a contact hole 31 is provided in a silicon oxide film 30 in the same manner as that in the fifth embodiment (see FIG. 7A). Next, as shown in FIG. 9A, a doped polysilicon or amorphous silicon film 37 is formed by CVD in such a manner as to fill the contact hole 31. A silicon oxide film 38 is deposited on the silicon film 37, and a patterned resist film 39 is formed on the silicon oxide film 38.

Referring to FIG. 9B, the silicon oxide film 38 and the silicon film 37 are patterned by dry etching using the patterned resist film 39 as a mask into a specific shape. A doped silicon film 40 is deposited over the entire surface of the silicon substrate 0 in such a manner as to cover the silicon film 37 and the silicon oxide film 38.

Referring to FIG. 9C, the silicon film 40 is etched back until the silicon oxide films 30 and 38 are exposed. As a result, the silicon film 40 is formed into a cylindrical shape surrounding the silicon film 37. Then, the silicon oxide film 38 remaining in the cylindrical silicon film 40 is removed, to form a cylindrical first electrode composed of the films 37 and 40. The cylindrical first electrode is advantageous in that it has a surface area larger than that of the thick film type first electrode 35. According to the structure in the seventh embodiment, the capacitance of the capacitor becomes larger than that in the DRAM of the fifth embodiment.

Eighth Embodiment

Figure 10:
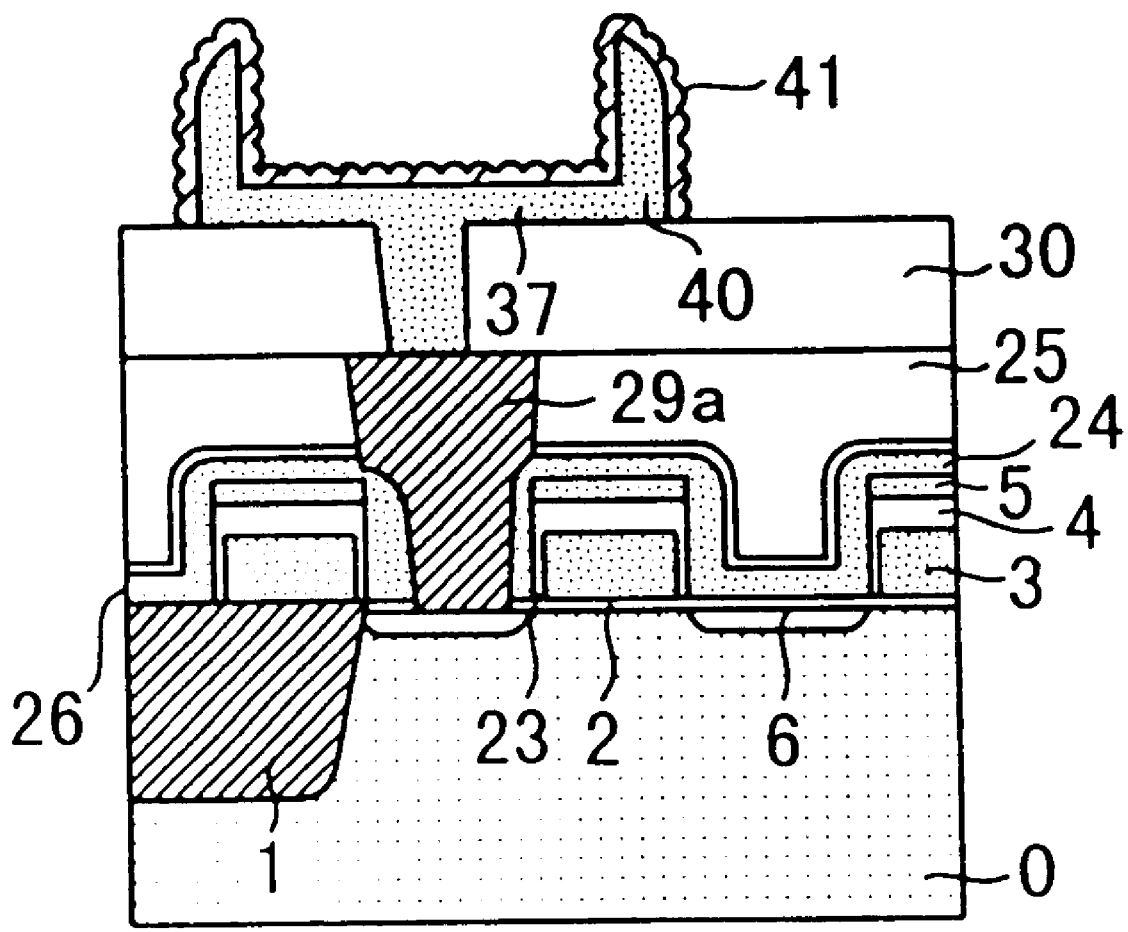
FIG. 10 is a cross-sectional view illustrating the structure of a semiconductor device according to a eighth embodiment of the present invention.

An eighth embodiment of the present invention will be described with reference to FIG. 10. FIG. 10 is a cross-sectional view showing a structure of a semiconductor device in the eighth embodiment. The semiconductor device in the eighth embodiment, which is a variation of the semiconductor device in the seventh embodiment, is characterized in that granular crystals 41 are grown on the surfaces of silicon oxide films 37 and 40 constituting the first electrode. With this structure, since the surface area of the first electrode is increased, the capacitance of the capacitor is increased.

Ninth Embodiment

A ninth embodiment of the present invention will be described with reference to FIGS. 11A to 11D. FIGS. 11A to 11D are cross-sectional views illustrating a structure of a semiconductor device and a manufacturing method thereof according to the ninth embodiment. The structure in the ninth embodiment, which is a further variation of the semiconductor device in the fifth embodiment, is characterized in having a first electrode 45a of a cylindrical shape in which only the inner wall thereof is utilized as a electrode of a capacitor.

According to the fabrication steps for a semiconductor device in the ninth embodiment, a pad 29a is formed in the same manner as that in the fifth embodiment (see FIG. 6F). Next, as shown in FIG. 11A, a silicon oxide film 42 is formed to cover the pad 29a. The silicon oxide film 42 is selectively removed using a patterned resist film 43 as a mask, to form a contact hole 44 for containing a first electrode 45a.

Referring to FIG. 11B, a doped silicon film 45 is formed by CVD in such a manner as to cover the inner wall of the contact hole 44.

Referring to FIG. 11C, a resist film 46 is formed in the contact hole 44 in such a manner as to cover the silicon film 45.

Referring to FIG. 11D, the silicon film 45 is selectively removed by dry etching using the resist film 46 as a mask until the silicon oxide film 42 is exposed. As a result, a cylindrical first electrode 45a is formed in the contact hole 44. After that, an insulating film and a second electrode are formed on the first electrode 45a, to obtain a capacitor functioning as a memory cell.

Tenth Embodiment

Figure 12A:
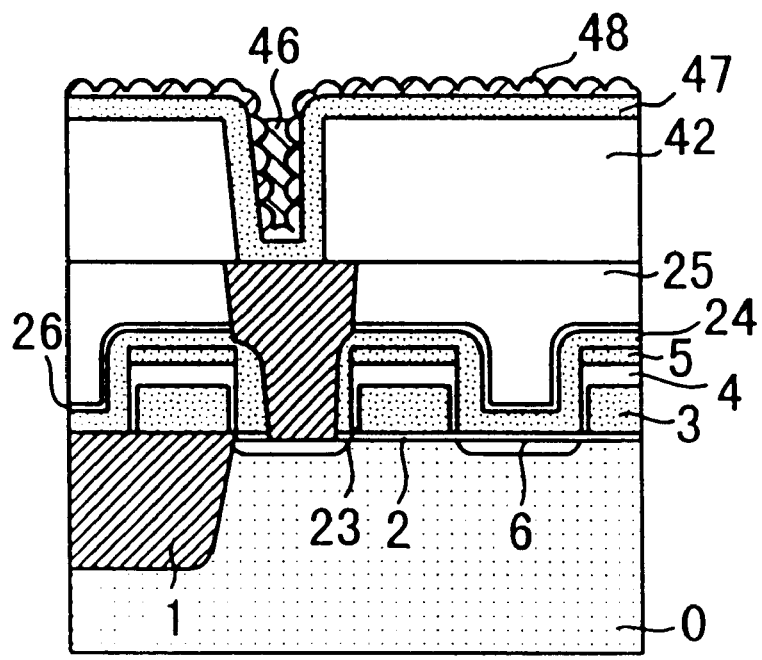
FIGS. 12A and 12B are cross-sectional views illustrating essential parts of a manufacturing method of a semiconductor device according to a tenth embodiment of the present invention.
Figure 12B:
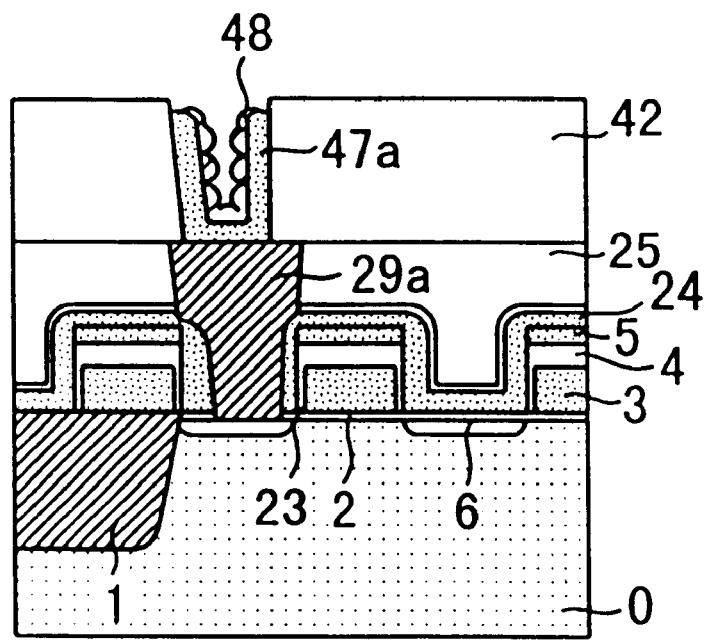

A tenth embodiment of the present invention will be described with reference to FIGS. 12A and 12B. FIGS. 12A and 12B are cross-sectional views illustrating a structure of a semiconductor device and a manufacturing method thereof according to the tenth embodiment. The semiconductor device in the tenth embodiment, which is a variation of the semiconductor device in the ninth embodiment, is characterized in that granular crystals 48 are grown on the surface of the cylindrical first electrode which makes use of only the inner wall.

According to the fabrication steps for a semiconductor device in the tenth embodiment, a contact hole 44 is formed in the same manner as that in the ninth embodiment (see FIG. 11A). Next, as shown in FIG. 12A, a doped silicon film 47 is deposited on a silicon oxide film 42 in such a manner as to cover the inner wall of the contact hole 44, and granular crystals 48 are grown on the doped silicon film 47. The contact hole 44 is filled with a resist film 46.

Referring to FIG. 12B, the granular crystals 48 and the doped silicon film 47 are selectively removed using the resist film 46 as a mask, to form a cylindrical first electrode 47a with its inner wall covered with the granular crystals 48. With this structure, the surface area of the first electrode becomes larger than that described in the ninth embodiment, the capacitance of the capacitor can be increased.

Eleventh Embodiment

An eleventh embodiment of the present invention will be described with reference to FIGS. 13A to 13D. FIGS. 13A to 13D are cross-sectional views illustrating a structure of a semiconductor device and a manufacturing method thereof according to the eleventh embodiment. The semiconductor device in the eleventh embodiment, which is a further variation of the semiconductor device in the fifth embodiment, is characterized in that a high dielectric film 54 made from BST (barium-strontium titanate), PZT (lead zirconate titanate) or the like is used as an insulating film of the capacitor.

Figure 13A:
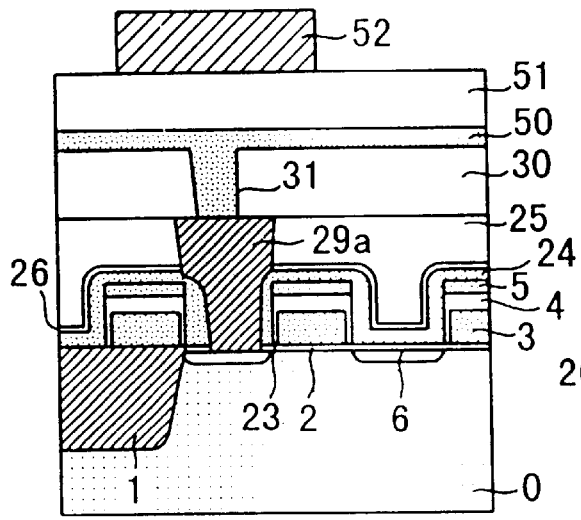
FIGS. 13A to 13D are cross-sectional views illustrating essential parts of a manufacturing method of a semiconductor device according to a eleventh embodiment of the present invention.

According to the fabrication steps for a semiconductor device in the eleventh embodiment, a contact hole 31 is formed in a silicon oxide film 30 in the same manner as that in the fifth embodiment (see FIG. 7A). Referring to FIG. 13A, a high melting point metal film 50 made from Ti, TiN or the like is formed by sputtering or CVD in such a manner as to fill the contact hole 31. A conductive film 51 to be taken as a first electrode of a capacitor is formed on the high melting point metal film 50. The conductive film 51 is formed of a film of a metal such as platinum (Pt), gold (Au) or ruthenium (Ru); or a stacked film in which on the above metal film is stacked a film of a high melting point metal such as Ti, or a stacked film having a silicide of a high melting point metal and a nitride film of a high melting point metal. In the eleventh embodiment, the high melting point metal film 50 functions as a barrier film for preventing reaction between a pad 29a and the conductive film 51. A resist film 52 patterned into the same shape as that of the first electrode of the capacitor is formed on the conductive film 51.

Figure 13C:
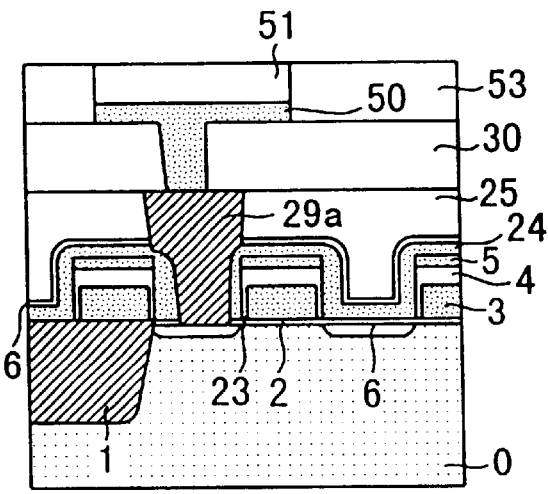
Figure 13B:
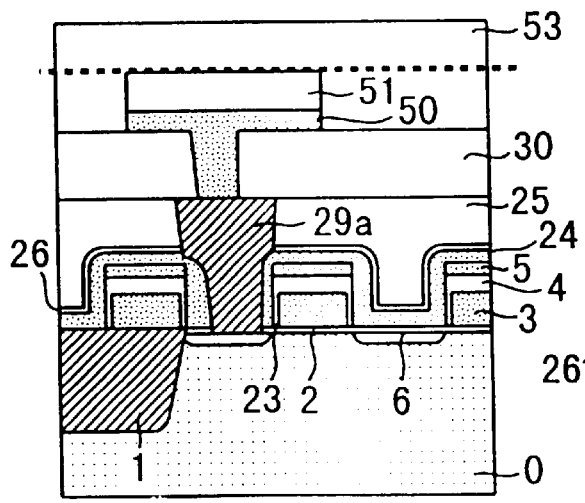

Referring to FIG. 13B, the high melting point metal film 50 and the conductive film 51 are patterned into a specific shape by etching using the patterned resist film 52 as a mask, to form the first electrode of the capacitor. A silicon oxide film 53 is deposited over the entire surface of the silicon substrate 0 in such a manner as to cover the first electrode.

Referring to FIG. 13C, the silicon oxide film 53 is removed by CMP or etching-back until the surface of the conductive film 51 constituting the first conductive film is exposed, with a result that the surface of the first electrode (the conductive film 51) is continuous to the surface of the silicon oxide film 53 at the same level.

Figure 13D:
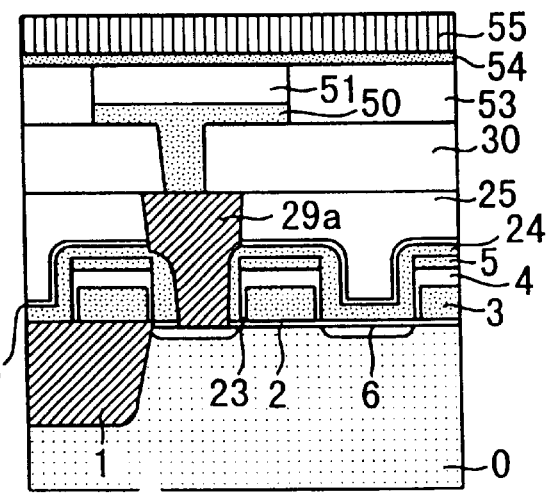

Referring to FIG. 13D, a high dielectric film 54 made from BST, PZT or the like functioning as the insulating film of the capacitor is formed on the conductive layer 51 and the silicon oxide film 53. A second electrode 55 of the capacitor is formed on the high dielectric film 54. The second electrode 55 is formed of a film of a metal such as Pt, Au, Ru or a stacked film in which on such a metal film is stacked a film of a high melting point metal such as Ti or a stacked film having silicide of a high melting point metal and a nitride film of a high melting point metal.

It is known that the high dielectric film 54 used as the insulating film of the capacitor in this embodiment does not exhibit stable characteristics if a stepped portion is present at the boundary between the conductive layer 51 and the silicon oxide film 53 both of which are the underlying layer of the high dielectric film 54. In the eleventh embodiment, however, since the surface of the conductive film 51 is made at the same level as that of the silicon oxide film 53, the high dielectric film 54 exhibits stable characteristics. As a result, according to the structure in the eleventh embodiment, the capacitance of the capacitor becomes larger than that in the structure that the insulating film is formed of a usual dielectric film.

Twelfth Embodiment

Figure 14A:
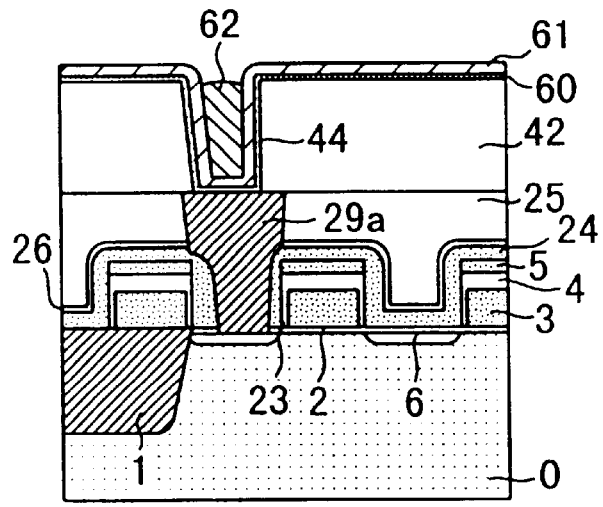
FIGS. 14A to 14C are cross-sectional views illustrating essential parts of a manufacturing method of a semiconductor device according to a twelfth embodiment of the present invention.
Figure 14B:
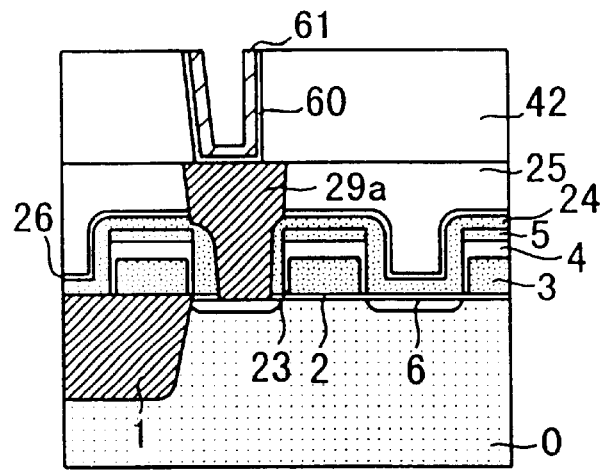
Figure 14C:
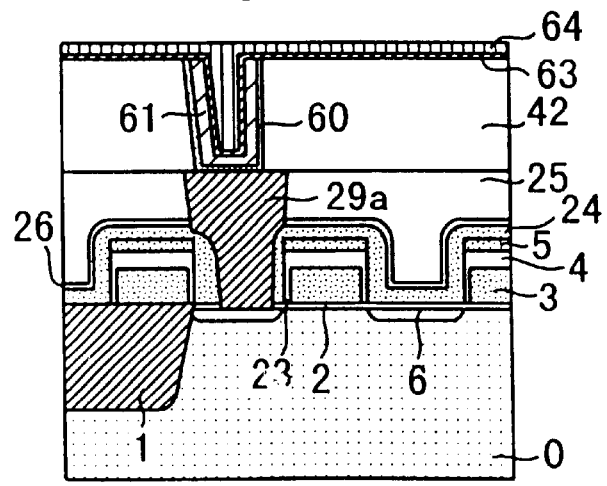

A twelfth embodiment of the present invention will be described with reference to FIGS. 14A to 14C. FIGS. 14A to 14C are cross-sectional views illustrating a structure of a semiconductor device and a manufacturing method thereof according to the twelfth embodiment. The semiconductor device in the twelfth embodiment, which is a variation of the semiconductor device of the eleventh embodiment, is characterized in that a high dielectric film 63 is provided as the insulating film of the capacitor and a cylindrical electrode which makes use of only the inner wall is provided as the first electrode of the capacitor.

According to the fabrication steps for a semiconductor device in the twelfth embodiment, a contact hole 44 is provided in a silicon oxide film 42 in the same manner as that in the ninth embodiment (see FIG. 11A). Next, as shown in FIG. 14A, a high melting point metal film 60 made from Ti, TiN or the like and a conductive film 61 to be taken as a first electrode of the capacitor are sequentially formed in such a manner as to fill the contact hole 44. The conductive film 61 is made from the same material as that of the conductive film 51 in the eleventh embodiment. A resist film 62 is formed in the contact hole 44 in such a manner as to cover the conductive film 61.

Referring to FIG. 14B, the high melting point metal film 60 and the conductive film 61 are selectively removed by dry etching using the resist film 62 as a mask until the silicon oxide film 42 is exposed. As a result, the cylindrical first electrode composed of the high melting point metal film 60 and the conductive film 61 is formed in the contact hole 44.

Referring to FIG. 14C, a high dielectric film 63 made from BST, PZT or the like is formed in such a manner as to cover the surface of the conductive film 61 constituting part of the first electrode and the surface of the silicon oxide film 42. A second electrode 64 of the capacitor is formed on the high dielectric film 63. Like the second electrode 55 in the eleventh embodiment, the second electrode 64 is formed of a film of a metal such as Pt, Au, Ru or a stacked film in which on such a metal film is stacked a film of a high melting point metal such as Ti or a stacked film having silicide of a high melting point metal and a nitride film of a high melting point metal.

According to the structure in twelfth embodiment, since the conductive layer 61, the high dielectric metal film 60 and the silicon oxide film 42, which are the underlying layers of the high dielectric film 63, are formed in such a manner as not to form a stepped portion at each boundary therebetween, the high dielectric film 63 exhibits stable characteristics. As a result, according to the structure in the twelfth embodiment, the capacitance of the capacitor becomes larger than that in the structure that the insulating film is formed of a usual dielectric film.

Thirteenth Embodiment

Figure 15A:
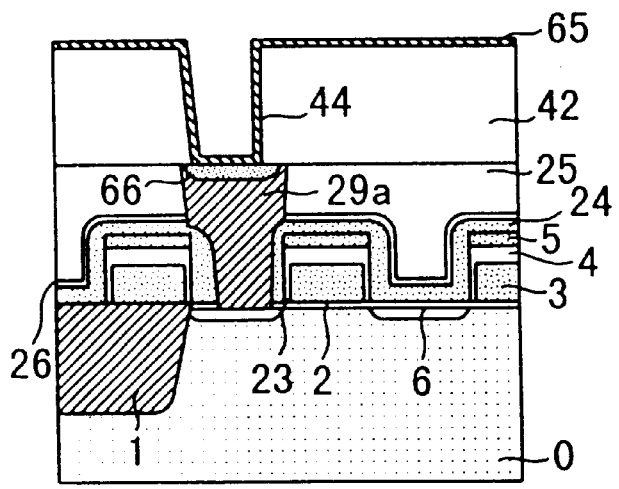
FIGS. 15A to 15C are cross-sectional views illustrating essential parts of a manufacturing method of a semiconductor device according to a thirteenth embodiment of the present invention.
Figure 15B:
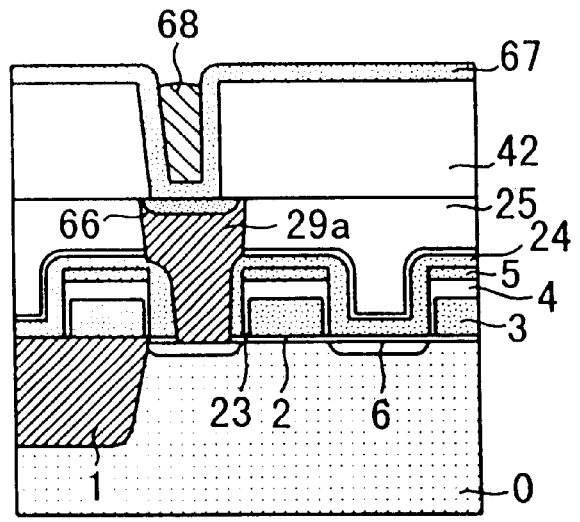
Figure 15C:
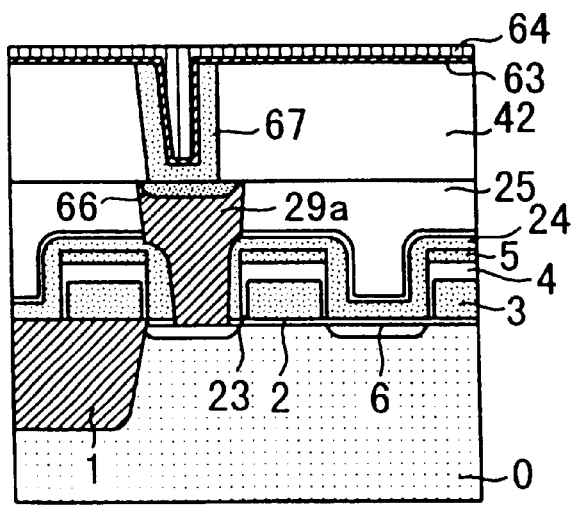

A thirteenth embodiment of the present invention will be described with reference to FIGS. 15A to 15C. FIGS. 15A to 15C are cross-sectional views illustrating a structure of the semiconductor device and a manufacturing method thereof according to the thirteenth embodiment. The semiconductor device in the thirteenth embodiment is a variation of the semiconductor device in the twelfth embodiment.

According to the fabrication steps for a semiconductor device in the thirteenth embodiment, a contact hole 44 is formed in a silicon oxide film 42 in the same manner as that in the twelfth embodiment. Next, as shown in FIG. 15A, a high melting point metal film 65 made from Ti, TiN or the like is formed in such a manner as to fill the contact hole 44. Then, the wafer is subjected to specific heat-treatment, to form a silicide film 66 near the boundary between a pad 29a and the high melting point metal film 65.

Referring to FIG. 15B, the high melting point metal film 65 remaining in the contact hole 44 and on the silicon oxide film 42 is removed, and a conductive film 67 to be taken as a first electrode of the capacitor is formed. The conductive film 67 is made from the same material as that of the conductive film 61 in the twelfth embodiment. A resist film 68 is formed in the contact hole 44 in such a manner as to cover the conductive film 67.

Referring to FIG. 15C, the conductive film 67 is selectively removed by dry etching using the resist film 68 as a mask until the silicon oxide film 42 is exposed. As a result, the cylindrical first electrode composed of the conductive film 67 is formed in the contact hole 44. A high dielectric film 63 is formed in such a manner as to cover the surface of the conductive film 67 and the surface of the silicon oxide film 42. A second electrode 64 of the capacitor is formed on the high dielectric film 63.

In the thirteenth embodiment, the inner space of the contact hole 44 is occupied with the conductive film 67 at a ratio higher than that in the twelfth embodiment. The capacitance of the capacitor becomes larger as the occupancy of the conductive film 67 becomes higher. As a result, according to the structure in the thirteenth embodiment, the capacitance of the capacitor becomes larger than that in the structure of the twelfth embodiment.

Fourteenth Embodiment

A fourteenth embodiment of the present invention will be described with reference to FIGS. 16A to 16D through 18A to 18D. FIGS. 16A to 16D through 18A to 18D are cross-sectional views illustrating a structure of a semiconductor device and a manufacturing method thereof according to the fourteenth embodiment. The semiconductor device in the fourteenth embodiment is a DRAM having a COB (Capacitor Over Bit Line) structure in which a capacitor is provided over a bit line.

Figure 16A:
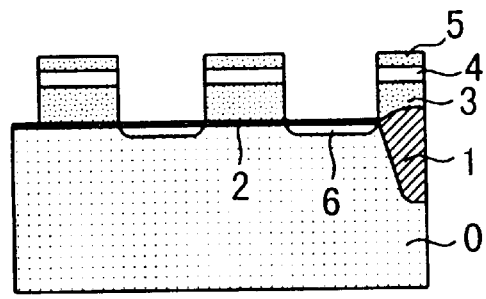
FIGS. 16A to 16F, FIGS. 17A to 17F and FIGS. 18A to 18D are cross-sectional views illustrating the structure of a semiconductor device and a manufacturing method thereof according to a fourteenth embodiment of the present invention.
Figure 16D:
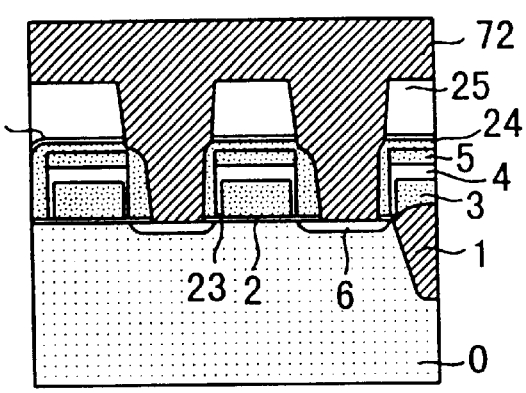
Figure 16B:
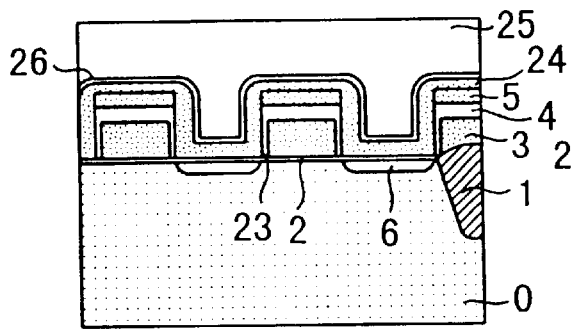

As shown in FIGS. 16A and 16B, according to the fabrication steps for a semiconductor device in this embodiment, a gate electrode composed of films 3 to 5, a silicon nitride film 24, a silicon oxide film 25, and the like are formed in the same manner as that in the fifth embodiment (see FIGS. 6A and 6B).

Figure 16E:
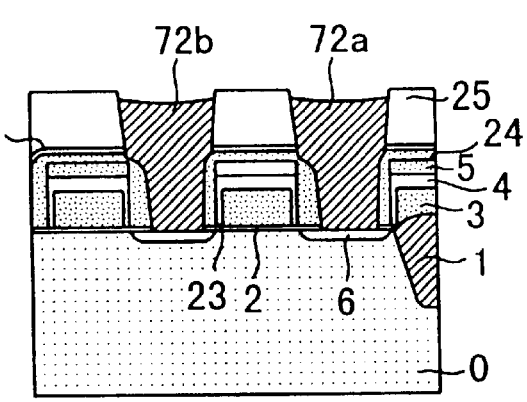
Figure 16C:
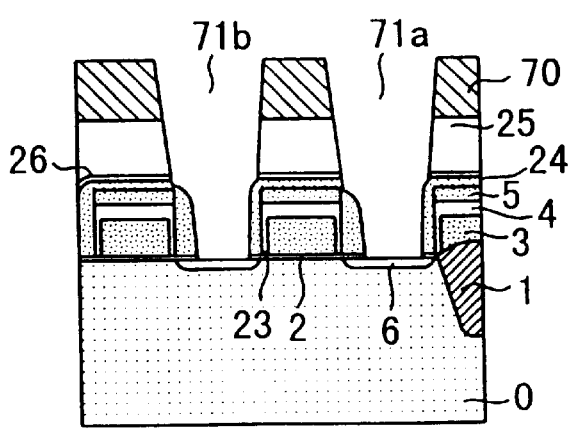

Referring to FIG. 16C, a patterned resist film 70 is formed on the silicon nitride film 25, and the silicon nitride film 25 is selectively etched using the patterned resist film 70 as a mask, to form contact holes 71a and 71b in self-alignment. In FIG. 16C, the contact hole 71a shown on the right side is provided to contain a pad for a capacitor, and the contact hole 71b shown on the left side is provided to contain a pad for a bit line.

Referring to FIG. 16D, a doped silicon film 72 is deposited over the entire surface of a silicon substrate 0 in such a manner as to fill the contact holes 71a and 71b.

Referring to FIG. 16E, the entire surface of the silicon film 72 is etched back by dry etching such as RIE, to form pads 72a and 72b made from doped silicon in the contact holes 71a and 71b, respectively.

Figure 16F:
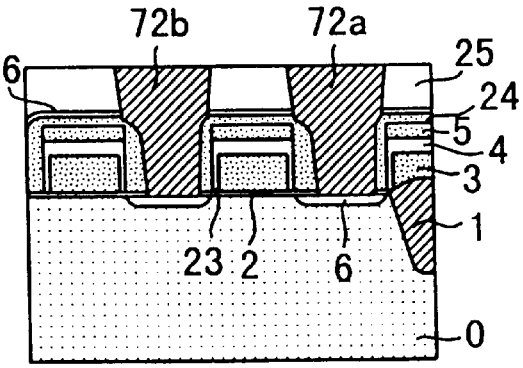

Referring to FIG. 16F, the pads 72a and 72b and the silicon oxide film 25 are polished by CMP in such a manner that the surfaces of the pads 72a and 72b are smoothly continuous to the surface of the silicon oxide film 25 at the same level. As a result, one end surface of each of the pads 7a and 72b is connected to a source/drain region 6 and the other end surface thereof is made thereof is made at the same level as that of the silicon oxide film 25.

Figure 17A:
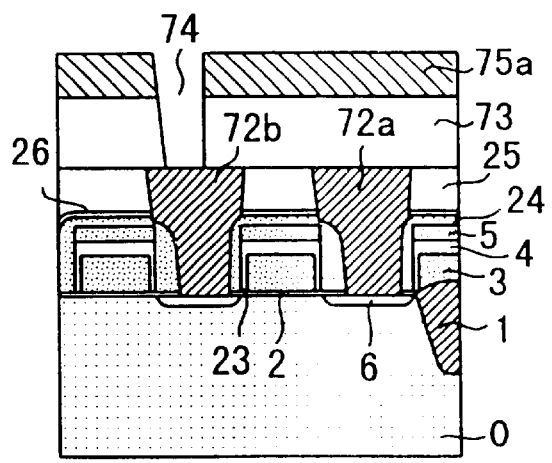

Referring to FIG. 17A, a silicon oxide film 73 is deposited on the silicon oxide film 25 and the pads 72a and 72b. A patterned resist film 75a adapted to form a contact hole for a bit line is formed on the silicon oxide film 73. The silicon oxide film 73 is selectively removed by dry etching such as RIE using the patterned resist film 75a as a mask, to form a contact hole 74 which is smaller in size than the pad 72b and is opened to the central portion of the pad 72b.

Figure 17D:
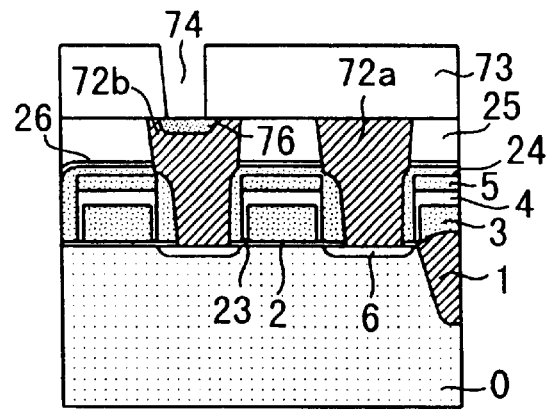
Figure 17B:
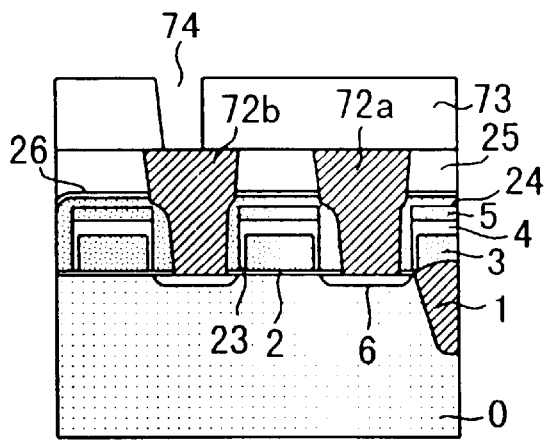
Figure 17E:
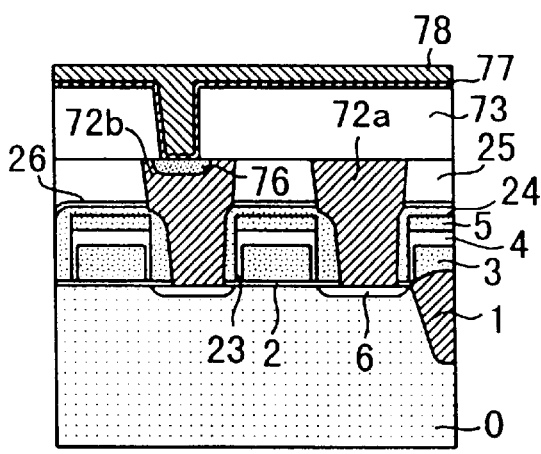
Figure 17C:
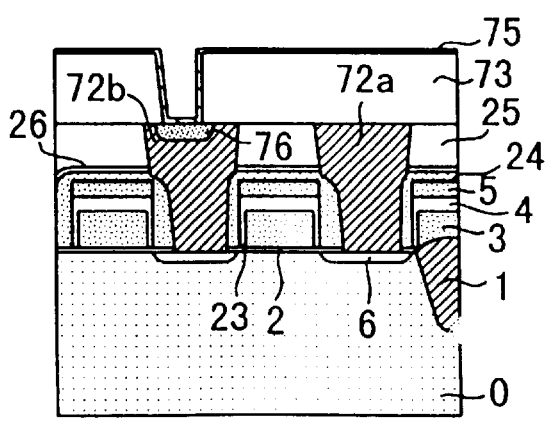

After formation of the contact hole 74, the same steps as those in the fourth embodiment are carried out (see FIGS. 5A to 5D), to form an interconnection layer (bit line) having a double layer structure. Specifically, the resist film 75a remaining on the silicon oxide film 73 is removed (see FIG. 17B). a first high melting point metal film 75 is formed in such a manner as to cover the inner wall of the contact hole 74 (see FIG. 17C); a silicide film 75 is formed by specific heat-treatment, and then the first high melting point metal film 75 is removed (see FIG. 17D); and a second high melting point metal film 77 and a low resistance metal film 78 are sequentially formed (see FIG. 17E). It should be noted that the first high melting point metal film 75, the second high melting point metal film 77, and the low resistance metal film 78 are equivalent to the first high melting point metal film 19, the second high melting point metal film 21 and the low resistance metal film 22 in the fourth embodiment, respectively.

Figure 17F:
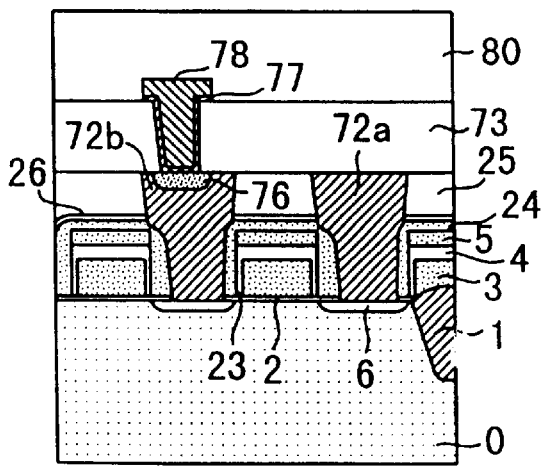

Referring to FIG. 17F, the second high melting point metal film 77 and the low resistance metal film 78 are patterned into a specific shape, to thus form a bit line. In the structure of this embodiment, a silicon oxide film 80 is formed on the bit line.

Figure 18A:
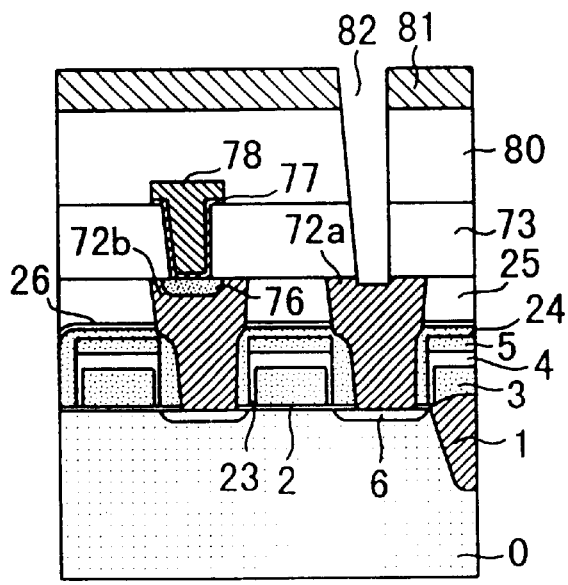

After deposition of the silicon oxide film 80, the same steps as those in the fifth embodiment are carried out (see FIGS. 7A to 7C), to form a first electrode of the capacitor. Specifically, as shown in FIG. 18A, a patterned resist film 81 is formed on the silicon oxide film 80, and the silicon oxide film 80 and the silicon oxide film 73 are selectively etched using the patterned resist film 81 as a mask, to form a contact hole 82 which is small in size than the pad 72a and is opened to the central portion of the pad 72a.

Figure 18C:
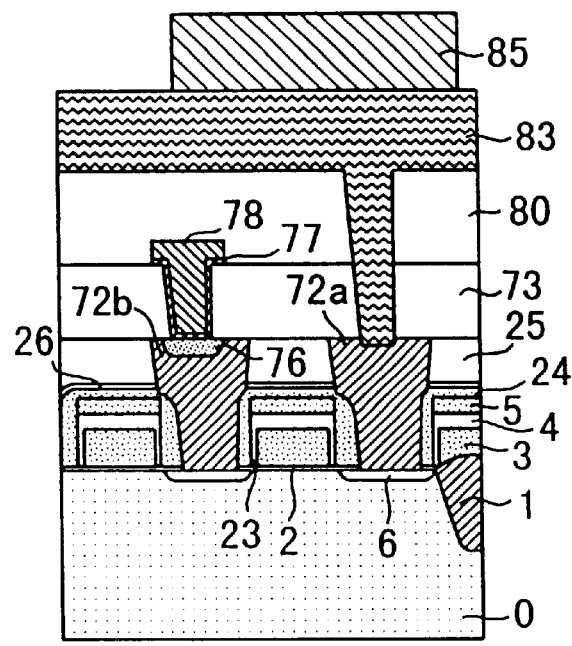
Figure 18B:
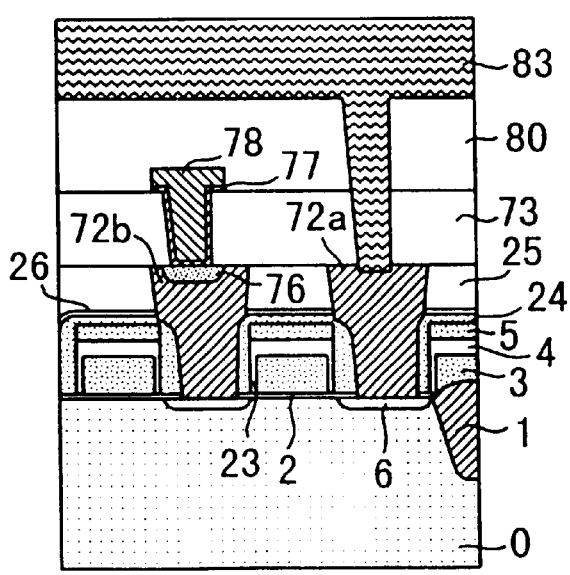
Figure 18D:
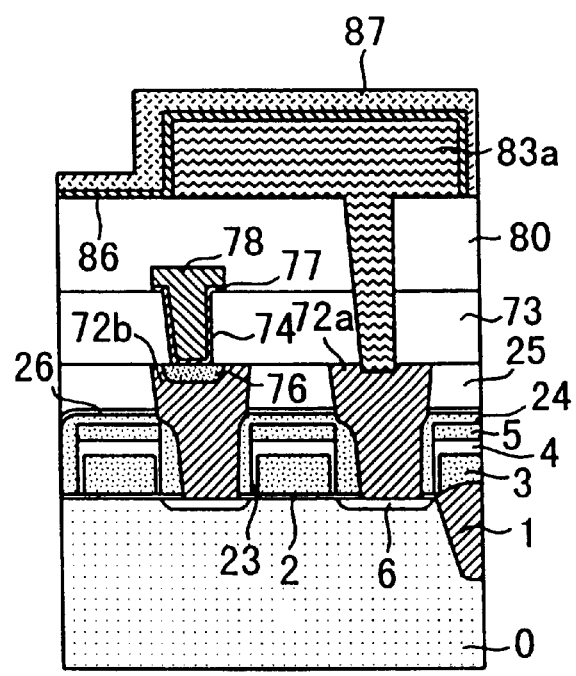

A doped silicon film 83 is deposited in such a manner as to fill the contact hole 82 (see FIG. 18B), and a resist film 85 patterned into the same shape as that of a first electrode of the capacitor is formed on the silicon film 83 (see FIG. 18C). Then, as shown in FIG. 18D, the silicon film 83 is selectively etched using the patterned resist film 85 as a mask, to form the first electrode 83a of the capacitor. An insulating film 86 and a second electrode 87 are formed on the first electrode 83a, to form the capacitor functioning as a memory cell.

As described above, the semiconductor device in the fourteenth embodiment adopts the COB structure. Accordingly, the aspect ratio of the contact hole 74 for the bit line is suppressed at a sufficiently small value. As the aspect ratio of the contact hole 74 becomes smaller, the coverage of each of the first and second high melting point metal films 75 and 77 becomes more preferable. As a result, according to the structure in the fourteenth embodiment, it is possible to ensure a desirable contact characteristic between the bit line and the pad 72*b*.

In the semiconductor device of the fourteenth embodiment, since the COB structure is adopted, the aspect ratio of contact hole 82 for the capacitor is larger than that of the other side contact hole 74. However, doped silicon to be contained in the contact hole 82 has a coverage characteristic superior to the high melting point metal film. As a result, according to the structure in the fourteenth embodiment, it is possible to ensure a desirable contact characteristic on the bit line side and to ensure a good contact characteristic on the capacitor side.

Although the first electrode 83*a* of the capacitor has a flat surface in the structure according to the fourteenth embodiment, the structure of the first electrode is not limited thereto. For example, granular crystals may be grown on the surface of the first electrode 83*a*.

Fifteenth Embodiment

A fifteenth embodiment of the present invention will be described with reference to FIGS. 19A to 19D. FIGS. 19A to 19D are cross-sectional views illustrating a structure of a semiconductor device and a manufacturing method thereof according to the fifteenth embodiment. The semiconductor device in this embodiment, which is a variation of the semiconductor device in the fourteenth embodiment, is characterized in that a cylindrical electrode which makes use of only the inner wall is provided as a first electrode 92*a* of the capacitor.

Figure 19A:
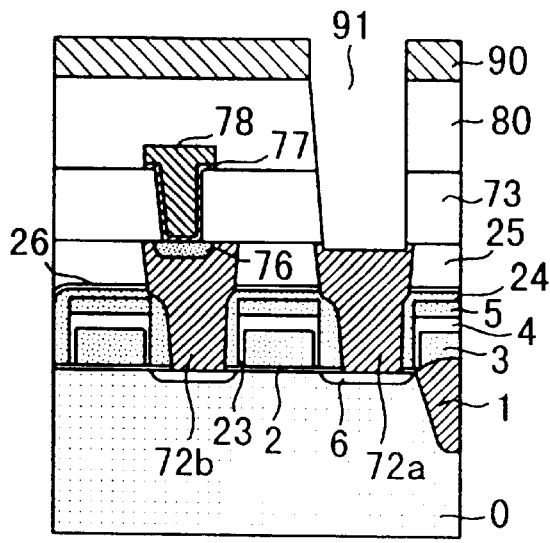
FIGS. 19A to 19D are cross-sectional views illustrating essential parts of a manufacturing method of a semiconductor device according to a fifteenth embodiment of the present invention.

According to the manufacturing method in the fifteenth embodiment, a silicon oxide film 80 is deposited on a bit line in the same manner as that in the fourteenth embodiment (see FIG. 17F), and then the first electrode 92*a* is formed in the manner similar to that in the ninth embodiment. Specifically, as shown in FIG. 19A, a patterned resist film 90 is formed on the silicon oxide film 80, and the silicon oxide film 80 is selectively etched using the patterned resist film 90 as a mask, to form a contact hole 91 for containing the first electrode 92*a*.

Figure 19C:
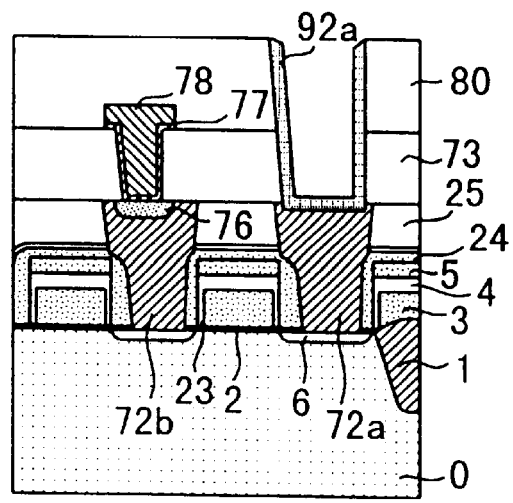
Figure 19B:
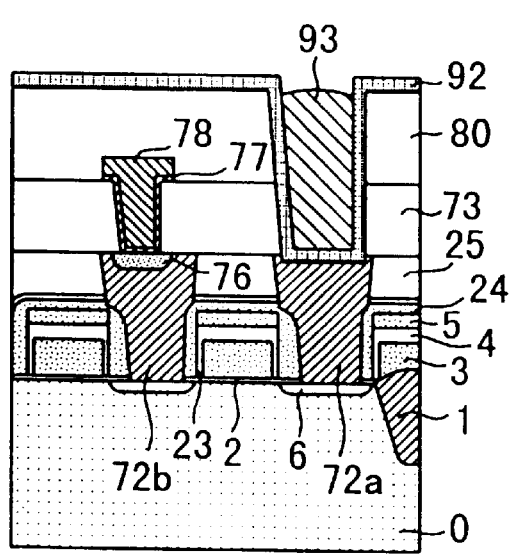
Figure 19D:
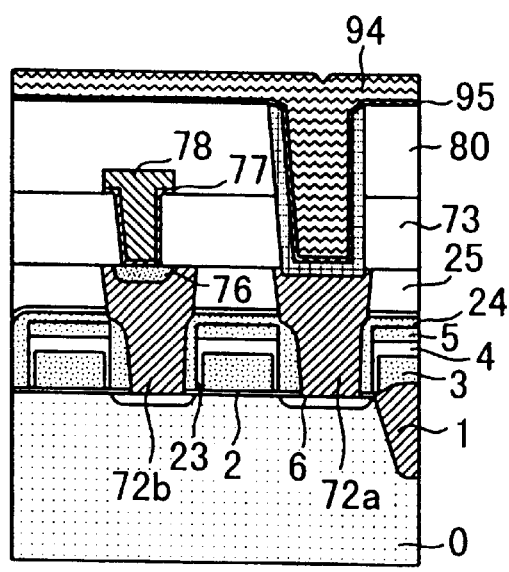

Referring to FIG. 19B, a doped silicon film 92 is formed in such a manner as to fill the contact hole 91, and a resist film 93 is formed in the contact hole 91 in such a manner as to cover the silicon film 92.

Referring to FIG. 19C, the silicon film 92 is selectively removed by dry etching using the resist film 93 as a mask until the silicon oxide film 80 is exposed. As a result, a cylindrical first electrode 92*a* is formed in the contact hole 91. After that, an insulating film 95 and a second electrode 94 are formed on the first electrode 92*a*, to obtain a capacitor functioning as a memory cell.

Sixteenth Embodiment

Figure 20A:
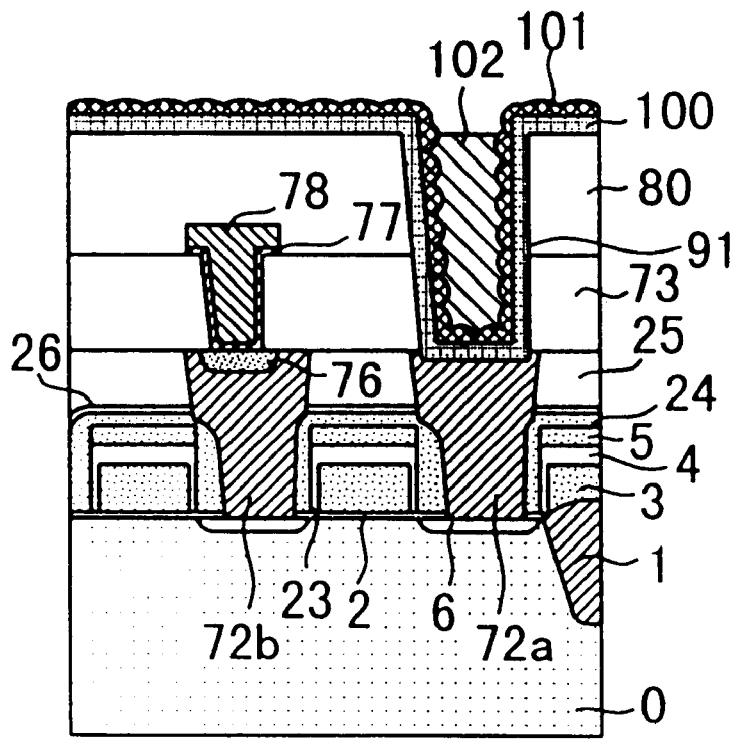
FIGS. 20A and 20B are cross-sectional views illustrating essential parts of a manufacturing method of a semiconductor device according to a sixteenth embodiment of the present invention.
Figure 20B:
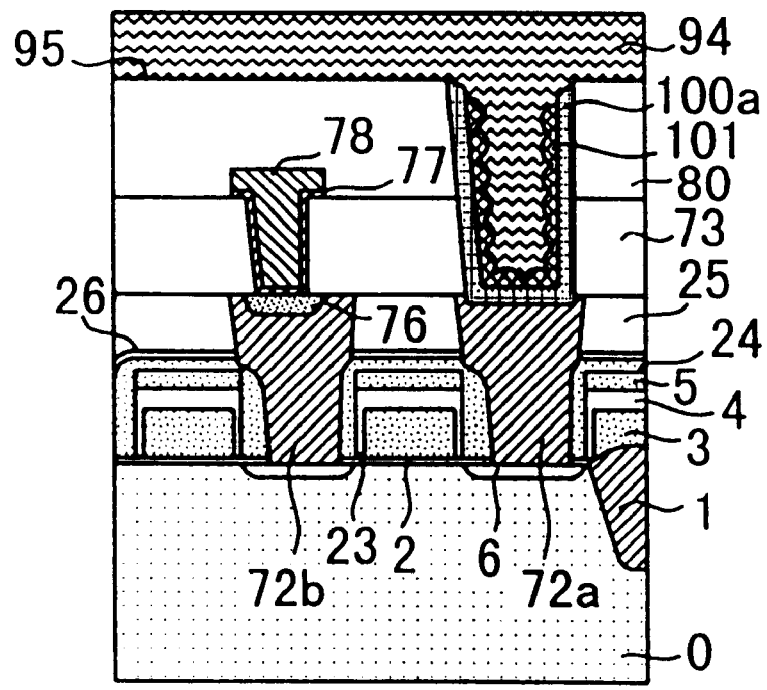

A sixteenth embodiment of the present invention will be described with reference to FIGS. 20A and 20B. FIGS. 20A and 20B are cross-sectional views illustrating a structure of a semiconductor device and a manufacturing method thereof according to the sixteenth embodiment. The semiconductor device in the sixteenth embodiment, which is a variation of the fifteenth embodiment, is characterized in that granular crystals 101 are grown on the cylindrical first electrode which makes use of only the inner wall.

According to the fabrication steps for a semiconductor device in this embodiment, a contact hole 91 is formed in the same manner as that in the fifteenth embodiment (see FIG. 19A). Next, as shown in FIG. 20A, a doped silicon film 100 is formed on a silicon oxide film 80 in such a manner as to fill the contact hole 91, and the granular crystals 101 are grown on the doped silicon film 100. A resist film 102 is formed in the contact hole 91.

Referring to FIG. 20B, the silicon film 100 and the granular crystals 101 are selectively etched using the resist film 102 as a mask, to form a cylindrical first electrode 100*a* on the inner wall of which the granular crystals 101 are grown. After that, an insulating film 95 and a second electrode 94 are formed on the first electrode 100*a*, to obtain a capacitor functioning as a memory cell. With this structure, since the surface area of the first electrode becomes larger than that in the fifteenth embodiment, the capacitance of the capacitor becomes larger than that in the fifteenth embodiment.

Seventeenth Embodiment

Figure 21:
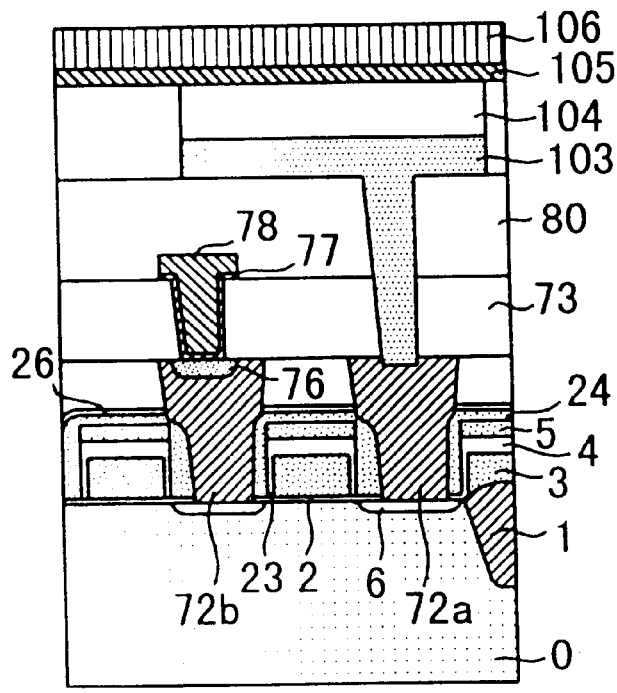
FIG. 21 is a cross-sectional view illustrating the structure of a semiconductor device according to a seventeenth embodiment of the present invention.

A seventeenth embodiment of the present invention will be described with reference to FIG. 21. FIG. 21 is a cross-sectional view illustrating a structure of a semiconductor device in the seventeenth embodiment. The semiconductor device in the seventeenth embodiment, which is another variation of the semiconductor device in the fourteenth embodiment, is characterized by including a first electrode composed of a high melting point metal film 103 and a conductive film 104, a high dielectric film 105 made from BST, PZT or the like, and a second electrode formed on the high dielectric film 105.

According to the semiconductor device in this embodiment, a silicon oxide film 80 is deposited on a bit line in the same manner as that in the fourteenth embodiment, and then a capacitor is formed in the same manner as that in the eleventh embodiment (see FIGS. 13A to 13D). According to the structure of this embodiment, since the insulating film of the capacitor is formed of the high dielectric film 105, it is possible to ensure the capacitor of a large capacitance.

Eighteenth Embodiment

Figure 22:
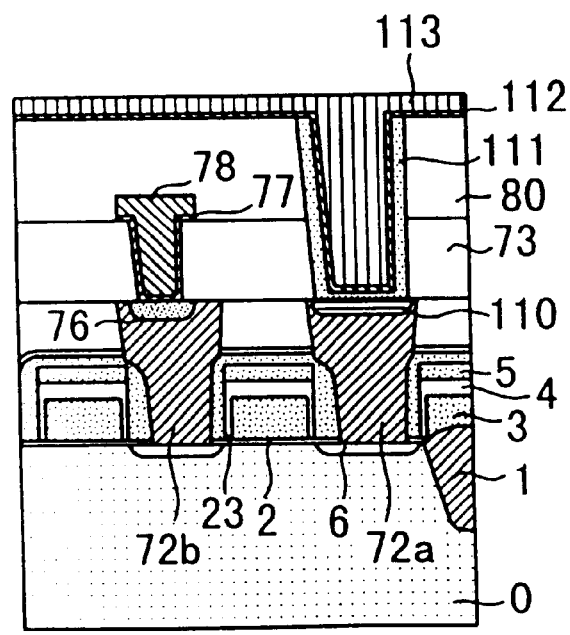
FIG. 22 is a cross-sectional view illustrating the structure of a semiconductor device according to a eighteenth embodiment of the present invention.

An eighteenth embodiment of the present invention will be described with reference to FIG. 22. FIG. 22 is a cross-sectional view illustrating a structure of a semiconductor device in the eighteenth embodiment. The semiconductor device in the eighteenth embodiment, which is a variation of the semiconductor device in the seventeenth embodiment, is characterized by including a cylindrical first electrode 111 which makes use of only the inner wall, a high dielectric film 112 covering the first electrode 111, and a second electrode 113 formed on the high dielectric film 112. In this embodiment, the first electrode 111 is made from a high melting point metal, and a silicide film 110 is formed near the boundary between the first electrode 111 and a pad 72*a*.

According to the semiconductor device in this embodiment, a silicon oxide film 80 is deposited on a bit line in the same manner as that in the fourteenth embodiment, and then a capacitor is formed in the same manner as that in the thirteenth embodiment (see FIGS. 15A to 15C). According to this structure, since the insulating film of the capacitor is formed of the high dielectric film 112, it is possible to ensure the capacitor of a large capacitance.

Nineteenth Embodiment

Figure 23:
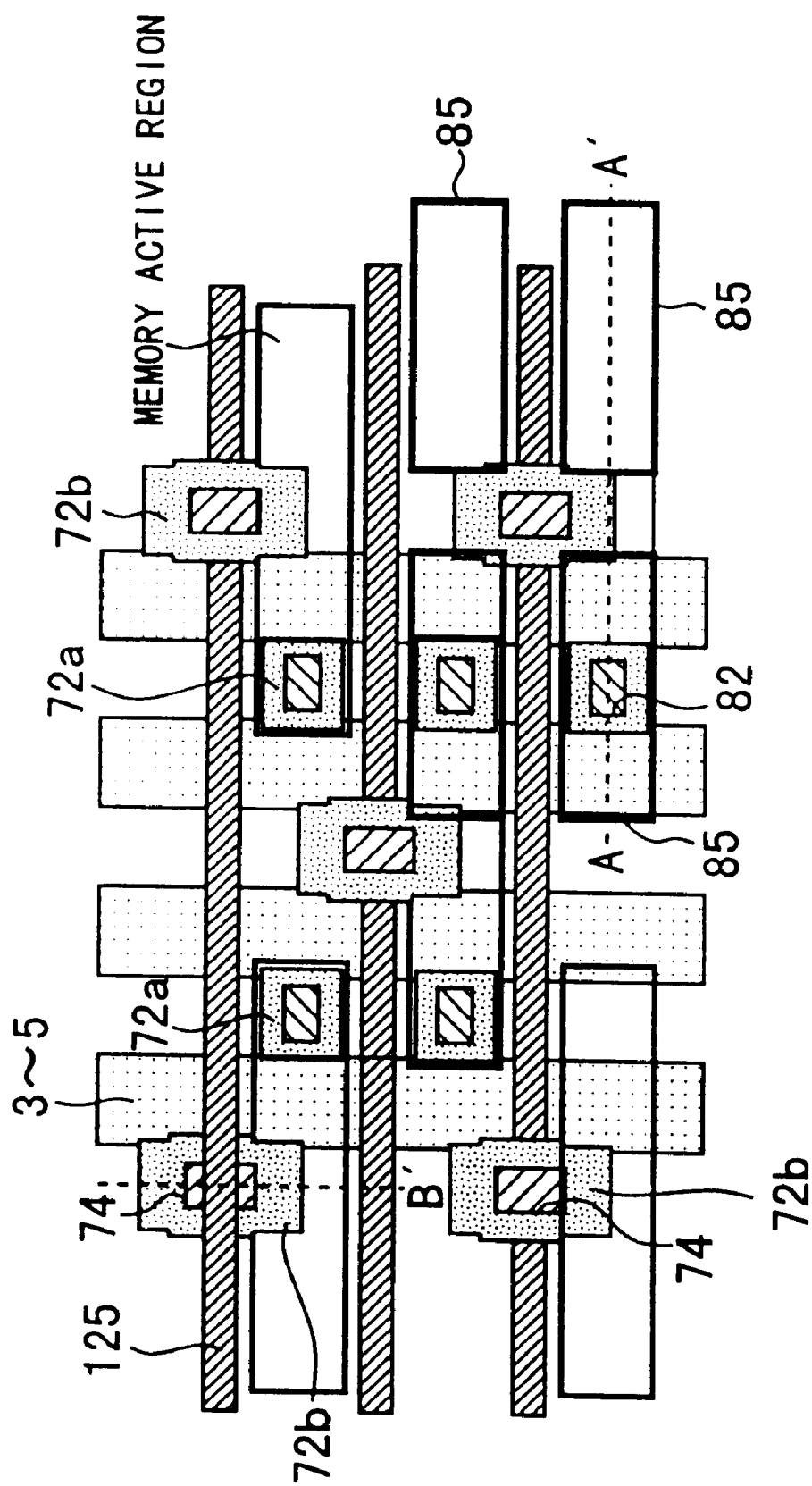
FIG. 23 is a plane view illustrating the structure of a semiconductor device according to a nineteenth embodiment of the present invention.
Figure 24:
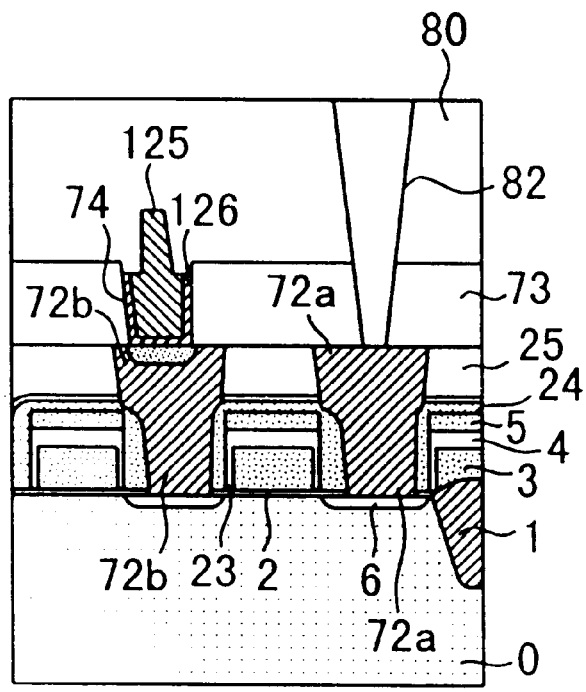
FIG. 24 is a cross-sectional view illustrating the structure of the semiconductor device according to the nineteenth embodiment of the present invention.
Figure 25:
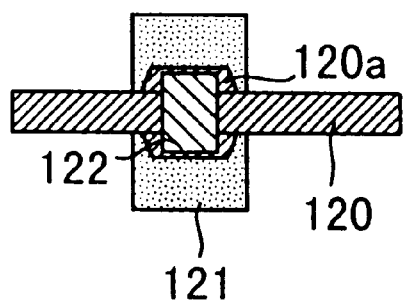
FIG. 25 is a plan view showing a structure of a bit line generally used.

A nineteenth embodiment of the present invention will be described with reference to FIGS. 23 to 25. FIG. 23 is a plan view of a semiconductor device in the nineteenth embodiment. FIG. 24 is a cross-sectional view in which a cross-section taken on line A–A' of FIG. 23 and a cross-section taken on line B–B' of FIG. 23 are respectively represented on the right and left sides of the same plane for the sake of convenience. FIG. 25 is a plan view showing a structure of a bit line generally used.

Referring to FIG. 23, a plurality of gate electrodes, each being composed of films 3 to 5, extending in parallel to each other and a plurality of bit lines 125 extending in the direction perpendicular to the gate electrodes 3 to 5 are provided on a silicon substrate 0. A contact hole 74 for the bit line 125 and a pad 72b are formed at a specific position overlapping the bit line 125.

Referring to FIG. 24, in the contact hole 74 is a high melting point metal film 126 functioning as a barrier layer. The bit line 125 is conducted to a pad 72b through the contact hole 74, and is connected to a source/drain region 6 via the pad 72b.

Referring again to FIG. 24, the contact hole 82 is opened to the central portion of the pad 72a which is conducted to the source/drain region 6. As a result, the first electrode of the capacitor can be connected to the source/drain region 6 via the contact hole 82 and the pad 72a without interference with the bit line 125.

Referring to FIG. 25, a general bit line structure includes a pad 121, a bit line contact 122, a bit line 120, and a bit line contact cover 120a. The bit line contact 122, which passes through the contact hole, connects the pad 121 to the bit line 120. The bit line contact 122 has a width larger than that of the bit line 120. The bit line contact cover 120a is integrated with the bit line 120, and has a width larger than the bit line 120 in order to cover the entire surface of the bit line contact 122.

In the general bit line structure shown in FIG. 25, since the bit line contact 122 is covered with the bit line contact cover 120a, upon etching for forming the bit line 120 and the bit line contact cover 120a, a portion near the boundary between the bit line contact 122 and the contact hole is not exposed to an etcher. Accordingly, even if the coverage of the bit line contact 122 is insufficient, the pad 121 can be certainly protected from the above-described etcher.

The pattern of the bit lines 120 to which the bit line contact covers 120a are added is not a line-space pattern, that is, not a pattern in which lines and spaces are simply repeated. The transfer accuracy by photolithography is degraded in the case where a pattern to be transferred is not a line-space pattern, as compared with the case where it is the line-space pattern. In this regard, in the case where the pattern of the bit lines 120 to which the bit line contact covers 120a are added is transferred, a transfer error inevitably occurs to some extent at the straight line portion of each bit line 120. Such a transfer error is undesirable in the case where the fineness of the bit lines is required.

As shown in FIGS. 23 and 24, according to the semiconductor device in the nineteenth embodiment, the bit lines 125 are formed into a simple straight line pattern. That is to say, in the semiconductor in this embodiment, the pattern of the bit lines 125 constitutes a simple line-space pattern. As a result, the bit lines 125 can keep up with a line-space pattern of 0.2 µm or less by making use of a transfer technique such as an ultra-high resolution.

Since the bit lines 125 can keep up with fine processing as described above, according to the nineteenth embodiment, the width of the bit line 125 is set to be sufficiently smaller than the width of the contact hole 74. As a result, it is possible to ensure a large dimensional margin between the bit line 125 and the contact hole 82 for the capacitor.

In the structure in which the width of the bit line 125 is smaller than that of the contact hole 74, upon etching for forming the bit line 125, the etching effect is exerted on the bit line contact contained in the contact hole 74. In the structure of the nineteenth embodiment, the high melting point metal film 126 exhibits extremely desirable coverage because the aspect ratio of the contact hole 74 is small and the particularly planarized portion of the pad 72b is taken as the connection portion. Accordingly, in the structure of this embodiment, the pad 72b is not damaged even if the interior of the contact hole 74 is exposed to an etcher.

Twentieth Embodiment

A twentieth embodiment of the present invention will be described with reference to FIGS. 26A to 26D and 27. FIGS. 26A to 26D and 27 are cross-sectional views illustrating a structure of a semiconductor device and a manufacturing method thereof according to the twentieth embodiment. The semiconductor device in the twentieth embodiment, which is a further variation of the semiconductor device in the fourteenth embodiment, is characterized in that a cylindrical electrode which makes use of only the inner wall is provided as a first electrode 134a of the capacitor and a silicon nitride film 131 is disposed at a position where it surrounds the bottom portion of the first electrode 134a.

According to the fabrication steps for a semiconductor device in this embodiment, a contact hole 82 for a capacitor is formed in the same manner as that in the fourteenth embodiment (see FIG. 18A). Next, as shown in FIG. 26A, a doped silicon film 130 is deposited in such a manner as to fill the contact hole 82.

Figures 26A, 26B, 26C, 26D:
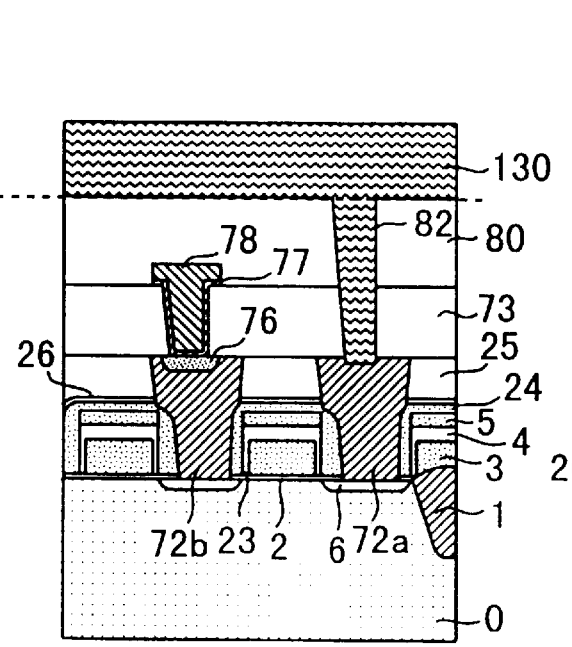
FIGS. 26A to 26D and FIG. 27 are cross-sectional views illustrating the structure of a semiconductor device and a manufacturing method thereof according to a twentieth embodiment of the present invention.

Referring to FIG. 26B, the silicon film 130 is removed by CMP or etching-back by RIE until a silicon oxide film 80 is exposed. As a result, a plug 130a is formed in the contact hole 82. One end surface of the plug 130a is in contact with a pad 72a and the other end surface thereof is at the same level as the surface of the silicon oxide film 80. A silicon nitride film 131 and a silicon oxide film 132 are sequentially deposited on the silicon oxide film 80 and the plug 130a.

Referring to FIG. 26C, a patterned resist film 133 is formed on the silicon oxide film 132, and the silicon oxide film 132 is selectively etched using the patterned resist film 133 as a mask, to form an opening 139 for containing a first electrode of a capacitor. The etching is performed with an etching selectivity which is high for the silicon oxide, and accordingly, the progression of the etching is stopped by the silicon nitride film 131.

Etching is then performed under a condition suitable for removal of the silicon nitride, to remove the silicon nitride film 131 exposed to the opening 139. With this procedure, the upper end surface of the plug 130a can be exposed while the etching amount of the silicon oxide film 80 can be suppressed at a sufficiently small value. In this case, since the margin to be given to the silicon oxide film 80 for preventing exposure of the bit line can be sufficiently suppressed, it is possible to make small the aspect ratio of the contact hole 82 for containing the plug 130a.

Referring to FIG. 26D, a doped polysilicon or amorphous silicon film 134 is deposited in such a manner as to cover the exposed upper end surface of the plug 130a and the inner wall of the opening 139. A resist film 135 is formed in the opening 139 in such a manner as to cover the silicon film 134.

Figure 27:
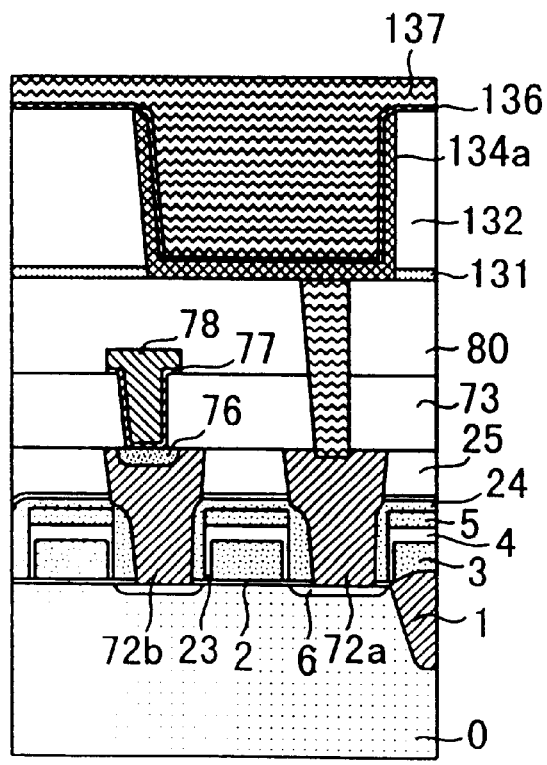

Referring to FIG. 27, the silicon film 134 is selectively removed by dry etching using the resist film 135 as a mask until the silicon oxide film 132 is exposed, to form a cylindrical first electrode 134a in the opening 139. After that, an insulating film 136 and a second electrode 137 are formed on the first electrode 134a, to obtain a capacitor functioning as a memory cell.

In accordance with the structure of the twentieth embodiment, an interconnection electrode structure, which is composed of the three doped silicon members (pad 72a, plug 130a and first electrode 134a), can be formed on the source/drain region 6. The characteristic of such an interconnection electrode structure can be freely changed by controlling the concentration of the impurity doped in each doped silicon member. As a result, according to the structure in the twentieth embodiment, the characteristic of the interconnection electrode structure can be optimized in accordance with various characteristics required for the semiconductor device.

Further, according to the structure in the twentieth embodiment, as described above, since the aspect ratio of the contact hole 82 for the capacitor can be suppressed, it is advantageous in facilitating the manufacturing process for the semiconductor device and in improving the yield and the reliability of the device.

Twenty-First Embodiment

Figure 28:
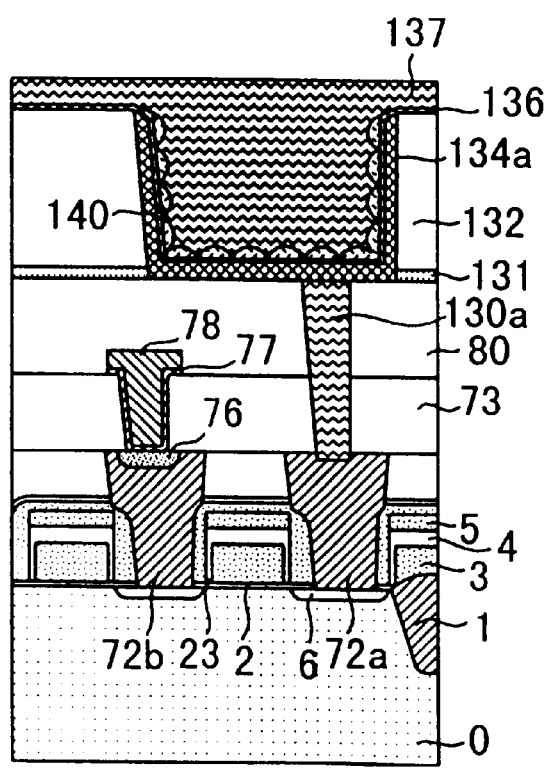
FIG. 28 is a plane view illustrating the structure of a semiconductor device according to a twenty-first embodiment of the present invention.

A twenty-first embodiment of the present invention will be described with reference to FIG. 28. FIG. 28 is a cross-sectional view illustrating a structure of a semiconductor device in this embodiment. The semiconductor device in this embodiment, which is a variation of the semiconductor device in the twentieth embodiment, is characterized in that granular crystals 140 are grown on the surface of the cylindrical first electrode 134a which makes use of only the inner wall.

Granular crystals 140 are easier to grow as the concentration of phosphorus doped in the first electrode 134a becomes lower. In the semiconductor device of this embodiment, since the concentration of an impurity doped in each of the first electrode 134a, a plug 130a and a pad 72a can be freely adjusted, the concentration of phosphorus doped in the first electrode 134a can be reduced without degrading characteristics required for the semiconductor device. As a result, according to the structure in this embodiment, it is possible to ensure a sufficiently large surface area of the first electrode 134a and hence to obtain the capacitor of a large capacitance.

Twenty-Second Embodiment

A twenty-second embodiment of the present invention will be described with reference to FIGS. 29A to 29D. FIGS. 29A to 29D are cross-sectional views illustrating a structure of a semiconductor device in this embodiment. The semiconductor device in this embodiment, which is another variation of the semiconductor device in the twentieth embodiment, is characterized by including a cylindrical first electrode 150 which makes use of only the inner wall.

According to the manufacturing method in this embodiment, a silicon oxide film 132 is etched until a silicon nitride film 131 is exposed in the same manner as that in the twentieth embodiment (see FIG. 26C), to form an opening 139 having a size shown by a broken line in FIG. 29A.

After removal of a resist film remaining on the silicon oxide film 132, the opening 139 is subjected to HF treatment for enlarging the diameter of the opening 139, with a result that the opening 139 having a size shown in FIG. 29B is formed. Upon HF treatment, the silicon oxide film 80 and the plug 130a are protected by the silicon nitride film 131. As a result, according to the above treatment, it is possible to enlarge the diameter of the opening 139 while certainly preventing exposure of the bit line.

After that, steps similar to those in the twentieth embodiment are carried out, to form a first electrode 150 and granular crystals 151 in the opening 139 (see FIG. 29C). Then, a second electrode 152 and the like are formed on the first electrode 150 and the granular crystals 151, to obtain a capacitor functioning as a memory cell (see FIG. 29D).

According to the structure in this embodiment, since the size of the opening 139 is enlarged by HF treatment, a large surface area of the first electrode 151 can be ensured. As a result, according to this embodiment, it is possible to ensure the capacitor of a larger capacitance than that in each of the twentieth and twenty-first embodiments.

Twenty-Third Embodiment

A twenty-third embodiment of the present invention will be described with reference to FIGS. 30A to 30D. FIGS. 30A to 30D are cross-sectional views illustrating a structure of a semiconductor device and a manufacturing method thereof according to this embodiment. The semiconductor device in this embodiment, which is a further variation of the semiconductor device in the twentieth embodiment, is characterized in that a silicon nitride film 153 is provided on a bit line and a silicon oxide film 73.

According to the fabrication steps for a semiconductor device in this embodiment, a bit line of a double layer structure having a second high melting point metal film 77 and a low resistance metal film 78 is formed by the same manner as shown in the fourteenth embodiment (see FIG. 17F). In this embodiment, after formation of the bit line, as shown in FIG. 30A, a silicon nitride film 153 is deposited in such a manner as to cover the bit line and the entire surface of the silicon oxide film 73. On the silicon nitride film 153 is stacked a silicon oxide film 154.

Referring to FIG. 30B, a patterned resist film 155 is formed on the silicon oxide film 154. The silicon oxide film 154 is etched with an etching selectivity which is high for the silicon oxide using the patterned resist film 155 as a mask. The progression of the above etching is stopped by the silicon nitride film 153. As a result, an opening 156 is formed on the silicon nitride film 153.

Since the etching of the silicon oxide film 154 is performed in the state in which the bit line is covered with the silicon nitride film 153, no oxygen reaches to the bit line during the etching, and hence oxidation of the bit line at the step of etching the silicon oxide film 154 is certainly prevented.

After etching of the silicon oxide film 154 is terminated, to remove foreign matters, the wafer is cleaned using an acidic solution containing sulfuric acid or nitric acid, a mixed solution of the acidic solution and $H_2O_2$, or the mixed solution of $H_2O_2$ and ammonia. In this embodiment, since the cleaning is performed in the state in which the bit line is covered with the silicon nitride film 154, it is possible to certainly prevent elution of the bit line in the cleaning solution.

Referring to FIG. 30C, after removal of the silicon nitride film 153 remaining on the bottom of the opening 156, the silicon oxide film 73 is selectively etched, to form a contact hole 160 opened to a pad 72a.

Referring to FIG. 30D, a plug is formed in the contact hole 160 in the same manner as that in the twentieth embodiment, and a structure of a capacitor is formed in the same manner as that in the twenty-second embodiment.

In this embodiment, a distance between the bottom of the silicon nitride film 153 and the pad 72a, that is, the initial thickness of the silicon oxide film 73 is extremely accurately controlled. Accordingly, in the above-described etching of the bottom of the opening 156 to form the contact hole 160, the over-etch amount of the pad 72a can be highly accurately controlled. As a result, according to the structure in this embodiment, it is possible to ensure a good contact characteristic between the pad 72a and the plug 130a.

Twenty-Fourth Embodiment

Figure 31:
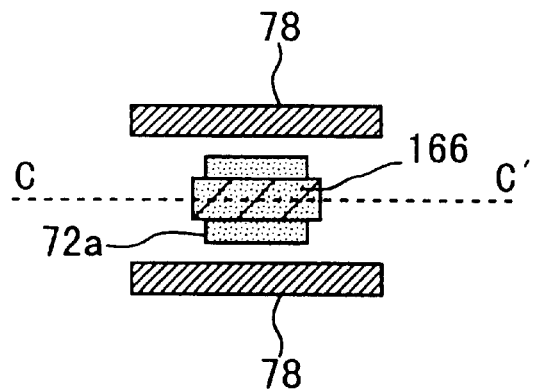
FIG. 31 is a plane view illustrating an essential part of a semiconductor device according to a twenty-fourth embodiment of the present invention.
Figures 32A, 32B:
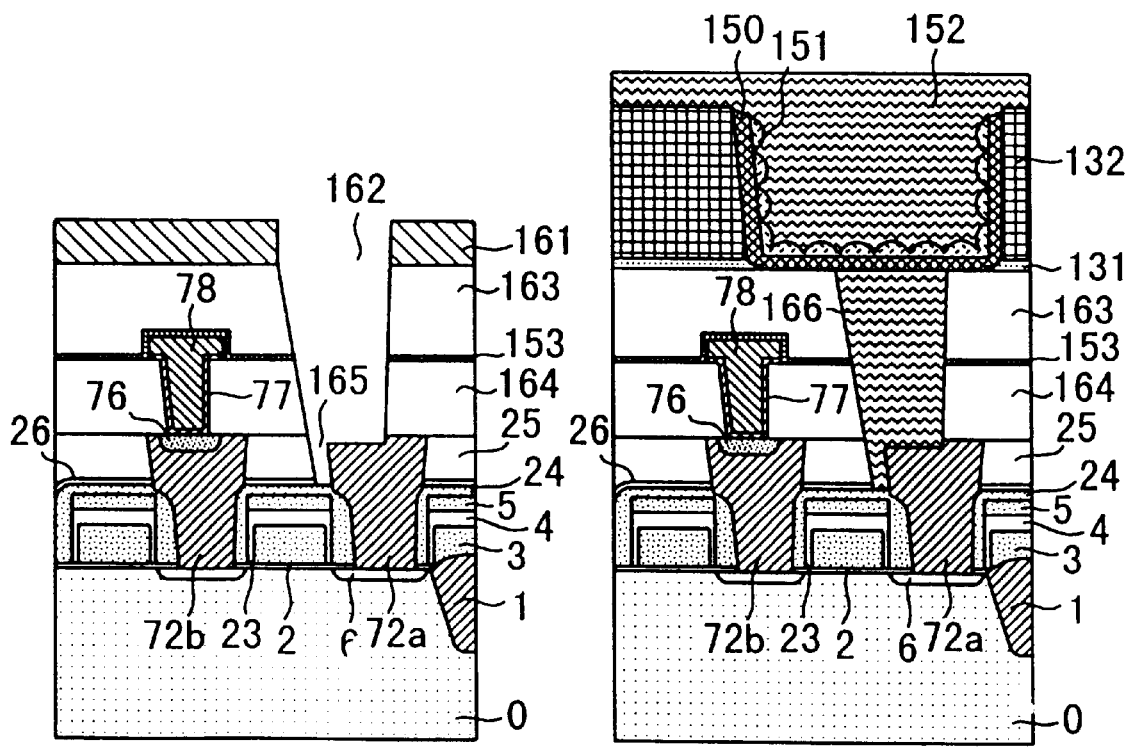
FIGS. 32A and 32B are cross-sectional views illustrating essential parts of the semiconductor device according to the twenty-fourth embodiment of the present invention.

A twenty-fourth embodiment of the present invention will be described with reference to FIG. 31 and FIGS. 32A and 32B. FIG. 31 is a plan view showing a pad 72a and its neighborhood on the capacitor side of a semiconductor device in this embodiment. FIGS. 32A and 32B are cross-sectional view illustrating a structure of the semiconductor and a manufacturing method thereof according to this embodiment. In each of FIGS. 32A and 32B, a cross-section taken on line C–C' of FIG. 31 is represented on the right side.

The semiconductor device in this embodiment is a variation of the semiconductor device in the twenty-third embodiment. As shown in FIG. 31, the semiconductor in this embodiment includes a plug 166 at a position where it is overlapped to the pad 72a for the capacitor. As compared with the plug 130a in the twenty-third embodiment, the plug 166 is enlarged in the longitudinal direction of a bit line (low resistance metal film 78). With such a shape of the plug 166, it is possible to ensure a large margin to an error occurring in photolithography and processing. As a result, according to the semiconductor device in this embodiment, it is possible to realize a good productivity.

FIGS. 32A and 32B show a state in which a contact hole 162 for containing the plug 166 is formed at a position offset from a pad 72a. In the case where the plug 166 is enlarged in the longitudinal direction of the bit line, the contact hole 162 may be easily offset from the pad 72a as shown in FIGS. 32A and 32B.

Etching for forming the contact hole 162, however, is once stopped by a silicon nitride film 153 like the twenty-third embodiment, and therefore, even in this embodiment, the over-etch amount accompanying the formation of the contact hole 162 can be highly accurately controlled. As a result, according to the structure in this embodiment, it is possible to certainly prevent exposure of the gate electrode irrespective of the positional relationship between the contact hole 162 and the pad 72a.

Twenty-Fifth Embodiment

A twenty-fifth embodiment of the present invention will be described with reference to FIGS. 33A to 33D. FIGS. 33A to 33D are cross-sectional views illustrating a structure of a semiconductor device and a manufacturing method thereof according to this embodiment. The semiconductor device in this embodiment, which is another variation of the semiconductor device in the twenty-third embodiment, is characterized in that a side wall 182 formed of a silicon nitride film is provided along a plug 130a for the capacitor.

Figure 33A:
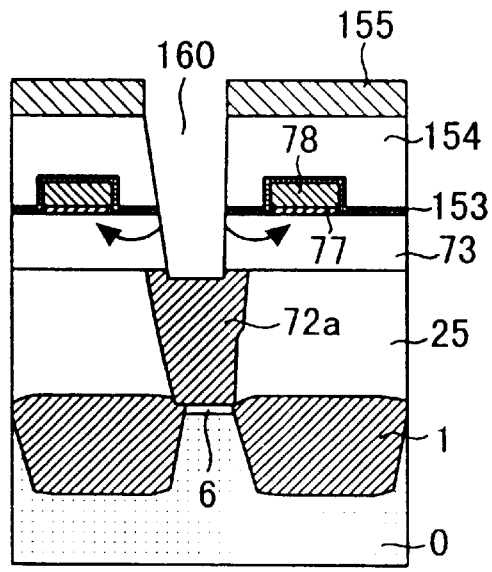
FIGS. 33A to 33D are cross-sectional views illustrating essential parts of a manufacturing method of a semiconductor device according to a twenty-fifth embodiment of the present invention.

Referring to FIG. 33A, according to the fabrication steps for a semiconductor device in this embodiment, a contact hole 160 on the capacitor side is formed in the same manner as that in the twenty-third embodiment. Before formation of a plug 130a in the contact hole 160, the wafer sometimes is cleaned with an alkali solution or the like for cleaning the surface of a pad 72a.

Such cleaning may corrode the inner wall of the contact hole 160, thereby gradually enlarging the diameter of the contact hole 160. In the structure of this embodiment, since a silicon nitride film 153 is formed on a low resistance metal film 78 constituting the upper part of a bit line, adverse effect due to the cleaning does not exert onto the bit line from upper side thereof. However, underside of the bit line, i.e., of the high melting point metal film 77 is a silicon oxide film 73. Thus, the adverse effect accompanying the cleaning possibly exerts onto the bit line from lower side thereof.

Figure 33C:
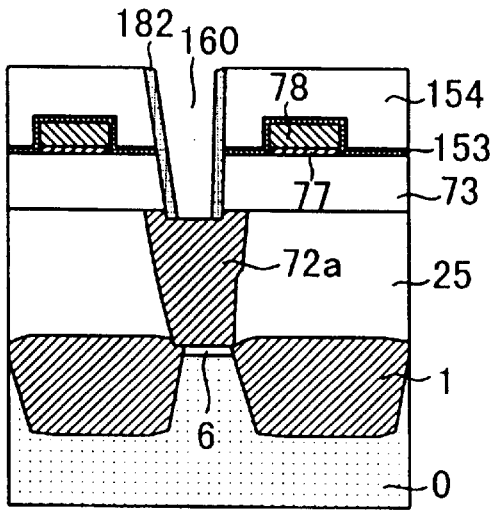
Figure 33B:
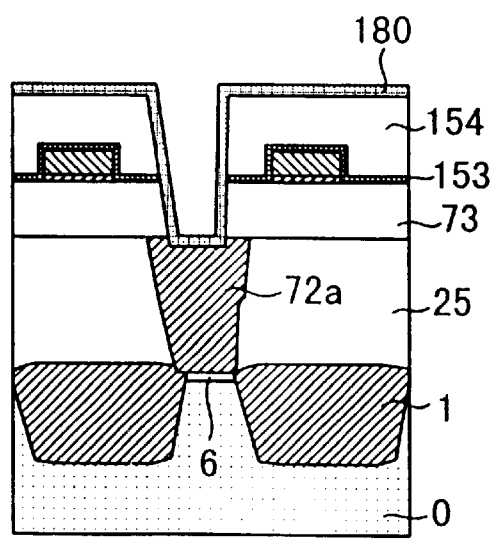

In this embodiment, as shown in FIG. 33B, after formation of the contact hole 160, a silicon nitride film 180 is deposited in such a manner as to cover the inner wall of the contact hole 160 and the surface of the silicon oxide film 154.

Figure 33D:
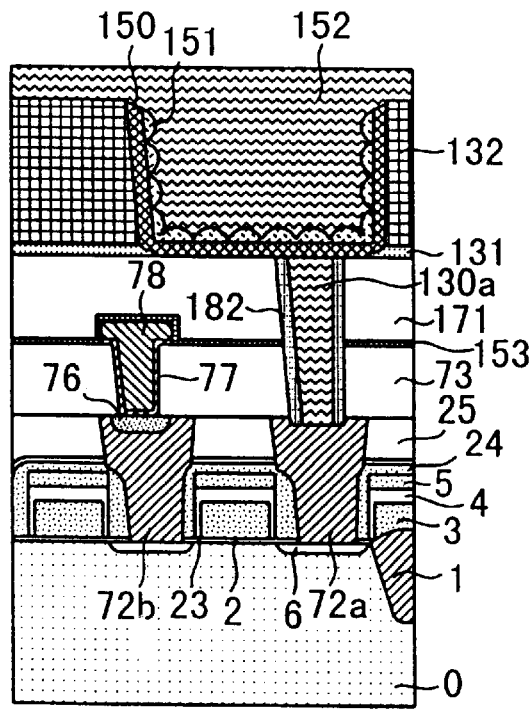

As shown in FIG. 33C, the silicon nitride film 180 deposited on the surface of the silicon oxide film 154 is removed by etching, to form a side wall 182 covering the inner wall of the contact hole 160. After that, as shown in FIG. 33D, the capacitor is formed in the same manner as that in the twenty-third embodiment.

In this embodiment, the cleaning is performed after formation of the side wall 182. In this case, since the adverse effect of the cleaning is interrupted by the side wall 182, the bit line is prevented from being damaged due to the adverse effect of the cleaning. As a result, according to the structure of this embodiment, it is possible to usually obtain stable characteristics of the semiconductor device.

Twenty-Sixth Embodiment

Figure 34A:
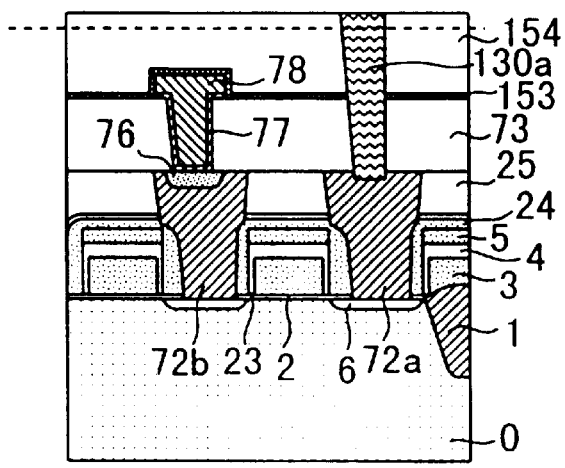
FIGS. 34A to 34C are cross-sectional views illustrating essential parts of a manufacturing method of a semiconductor device according to a twenty-sixth embodiment of the present invention.
Figure 34C:
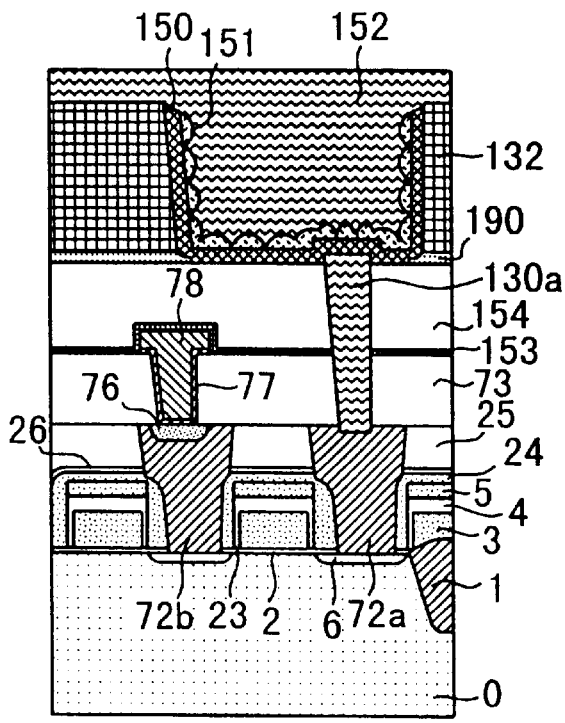
Figure 34B:
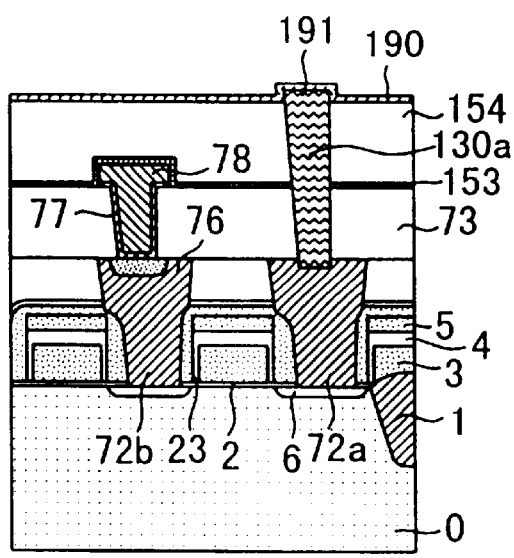

A twenty-sixth embodiment of the present invention will be described with reference to FIGS. 34A to 34C. FIGS. 34A to 34C are cross-sectional views illustrating a structure of a semiconductor device and a manufacturing method thereof according to this embodiment. The semiconductor device in this embodiment is a further variation of the semiconductor device in the twenty-third embodiment.

According to the fabrication steps for a semiconductor device in this embodiment, a plug 130a is formed in a contact hole 160 in the same manner as that in the twenty-third embodiment. Then, as shown in FIG. 34A, a silicon oxide film 154 is etched by a specific thickness, so that the plug 130a projects by a specific length from the surface of the silicon oxide film 154.

After that, a silicon nitride film 190 is formed in the same manner as that in the twenty-third embodiment (see FIG. 34B). Then, a capacitor is also formed in the same manner as that in the twenty-third embodiment (see FIG. 34C). According to the structure in this embodiment, since the plug 130a projects from the surface of the silicon oxide film 154, it is possible to ensure a large contact area between the plug 130a and a first electrode 150. As a result, according to this embodiment, it is possible to reduce the contact resistance between the plug 130a and the first electrode 150.

Twenty-Seventh Embodiment

Figure 35:
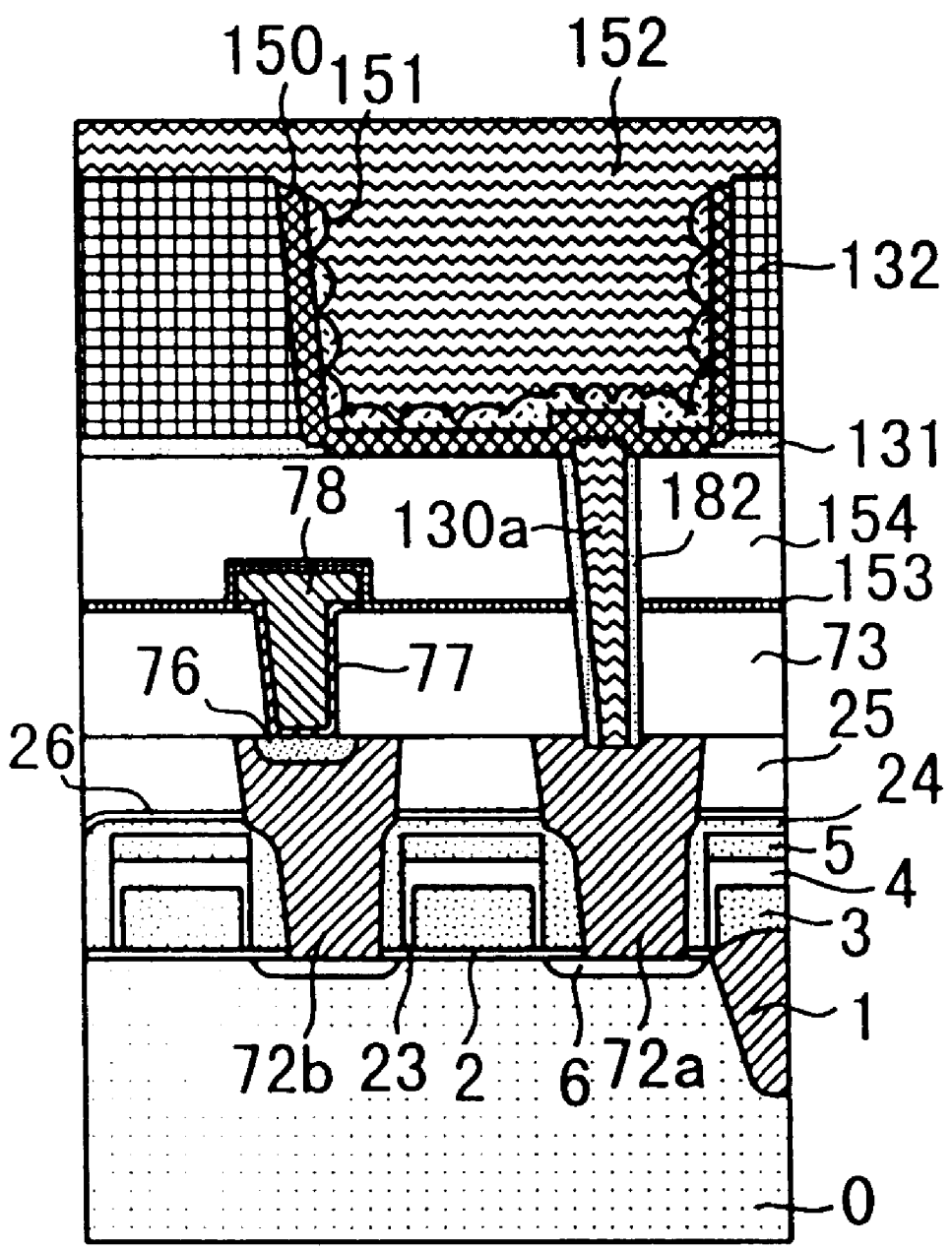
FIG. 35 is a cross-sectional view illustrating the structure of a semiconductor device according to a twenty-seventh embodiment of the present invention.

A twenty-seventh embodiment of the present invention will be described with reference to FIG. 35. FIG. 35 is a cross-sectional view illustrating a structure of a semiconductor device in this embodiment. The semiconductor device in this embodiment is a combination of the semiconductor devices in the twenty-fifth and twenty-sixth embodiments. According to the structure in this embodiment, it is possible to obtain the effects of the above two embodiments in combination.

Twenty-Eighth Embodiment

Figure 36:
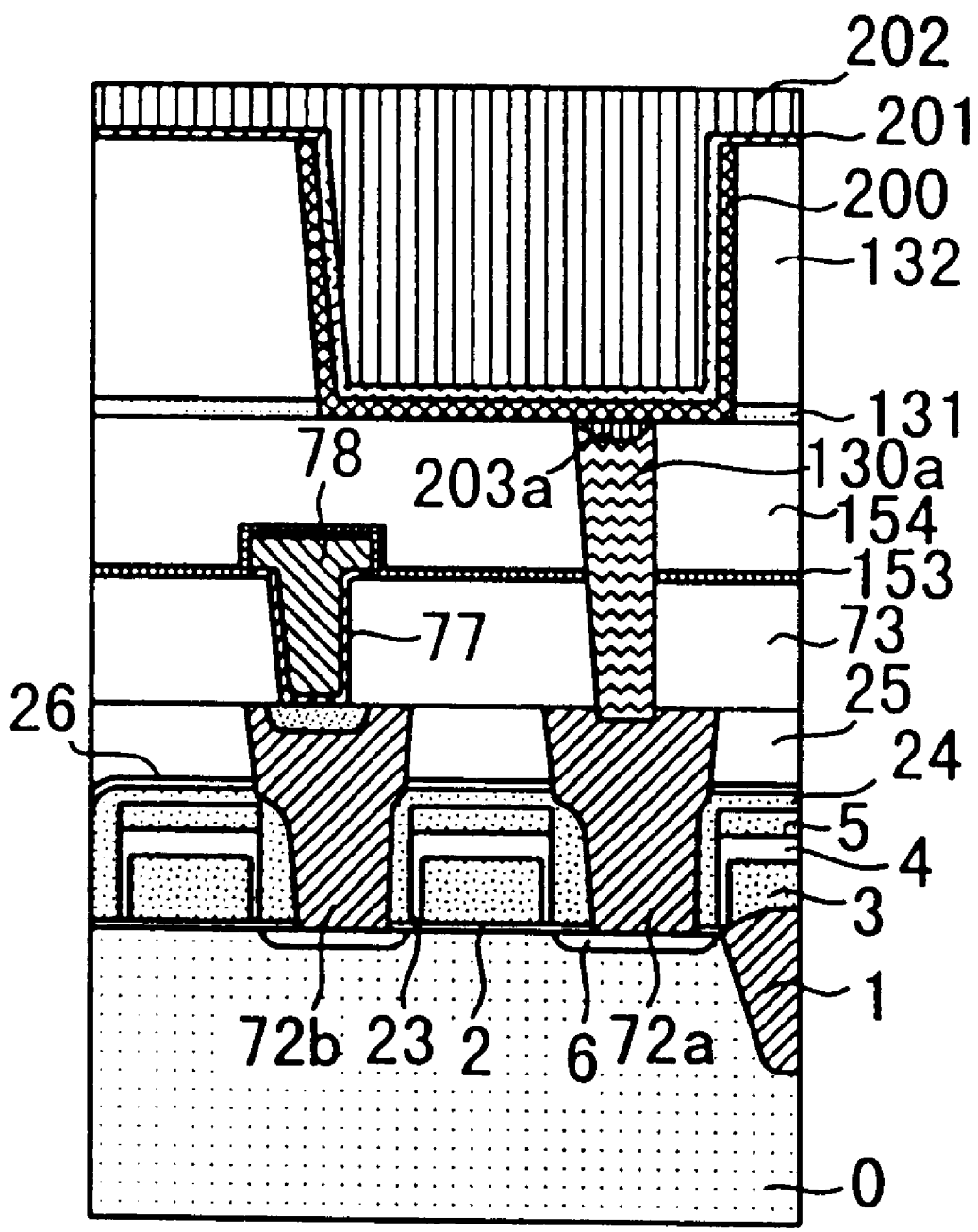
FIG. 36 is a cross-sectional view illustrating the structure of a semiconductor device according to a twenty-eighth embodiment of the present invention.

A twenty-eighth embodiment of the present invention will be described with reference to FIG. 36. FIG. 36 is a cross-sectional view illustrating a structure of a semiconductor device in this embodiment. The semiconductor device in this embodiment, which is a further variation of the semiconductor device in the twenty-third embodiment, is characterized by including a first electrode 200 made from a high melting point metal, a high dielectric film 201 formed on the first electrode 200, and a second electrode 202. Also in this embodiment, a silicide film 203a is formed near the boundary between the first electrode 200 and a plug 130a.

In the semiconductor device in this embodiment, the first electrode and a silicon oxide film 132 which are the underlying layer of the high dielectric film 201 are smoothly continuous to each other at the same level. As a result, according to the structure in this embodiment, it is possible to ensure the capacitor of a larger capacitance than that in a structure in which an insulating film of the capacitor is made from a usual dielectric substance.

Twenty-Ninth Embodiment

Figure 37A:
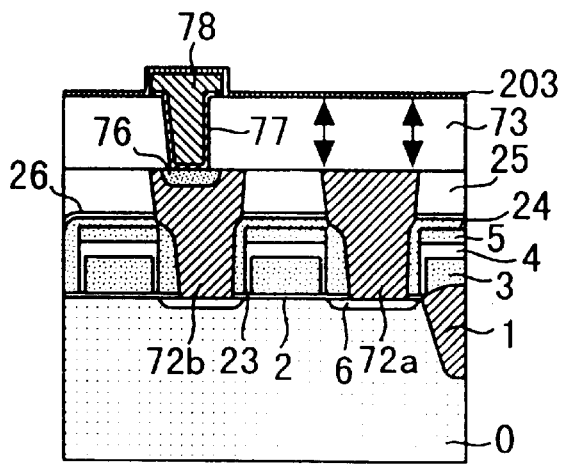
FIGS. 37A to 37C are cross-sectional views illustrating essential parts of a manufacturing method of a semiconductor device according to a twenty-ninth embodiment of the present invention.
Figure 37B:
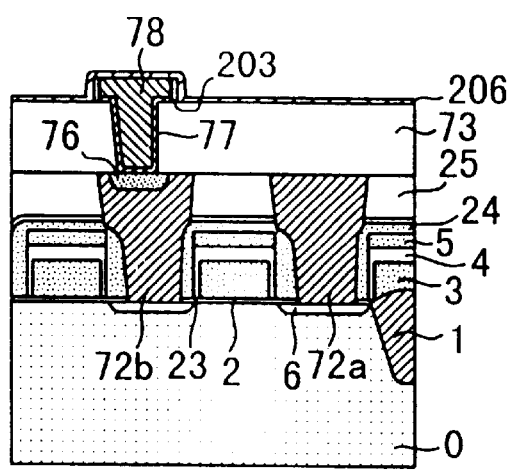
Figure 37C:
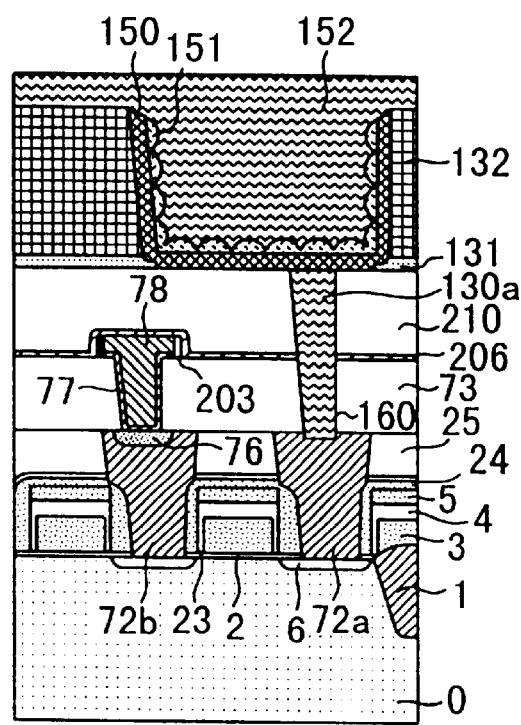

A twenty-ninth embodiment of the present invention will be described with reference to FIGS. 37A to 37C. FIGS. 37A to 37C are cross-sectional views illustrating a structure of a semiconductor device and a manufacturing method thereof according to this embodiment. The semiconductor device in this embodiment, which is a further variation of the semiconductor device in the twenty-third embodiment, is characterized in that the side surface of a bit line (low resistance metal film 78) is covered with a silicon nitride film having a thickness larger than that of a silicon nitride film which covers the upper surface of the bit line.

According to the manufacturing method in this embodiment, a bit line is formed in the same manner as that in the twenty-third embodiment. Then, as shown in FIG. 37A, a silicon nitride film 203 is deposited in such a manner as to cover the bit line and a silicon oxide film 73.

The silicon nitride 203 is removed by etching except a portion covering the side surface of the bit line (low resistance metal film 78). As shown in FIG. 37B, a silicon nitride film 206 is deposited in such a manner as to cover the bit line, the silicon oxide film 73, and the remaining silicon nitride film 203. After that, a capacitor is formed in the same manner as that in the twenty-third embodiment (see FIG. 37C).

To protect the bit line from being affected by the cleaning performed after formation of the contact hole 160 for the capacitor, it may be desirable to make large the thickness of the silicon nitride film covering the side surface of the bit line. However, if the silicon nitride film covering the bit line and the silicon oxide film 73 has a large thickness over the entire region, there may occur an inconvenience that it takes a long time to form the contact hole 160 by etching. Accordingly, it should be avoided that the thickness of the silicon nitride film covering the upper surface of the bit line and the surface of the silicon oxide film 73 becomes unnecessarily large.

As described above, according to the structure of the semiconductor device in this embodiment, since only the silicon nitride film covering the side surface of the bit line has a large thickness, it is possible to strongly protect the bit line without occurrence of any inconvenience.

Thirtieth Embodiment

Figure 38A:
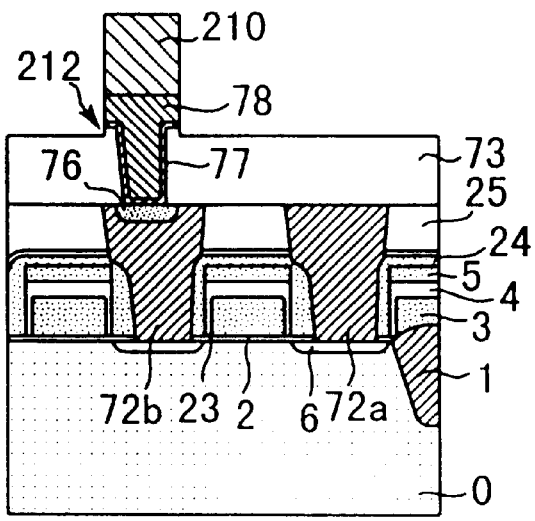
FIGS. 38A to 38C are cross-sectional views illustrating essential parts of a manufacturing method of a semiconductor device according to a thirtieth embodiment of the present invention.
Figure 38C:
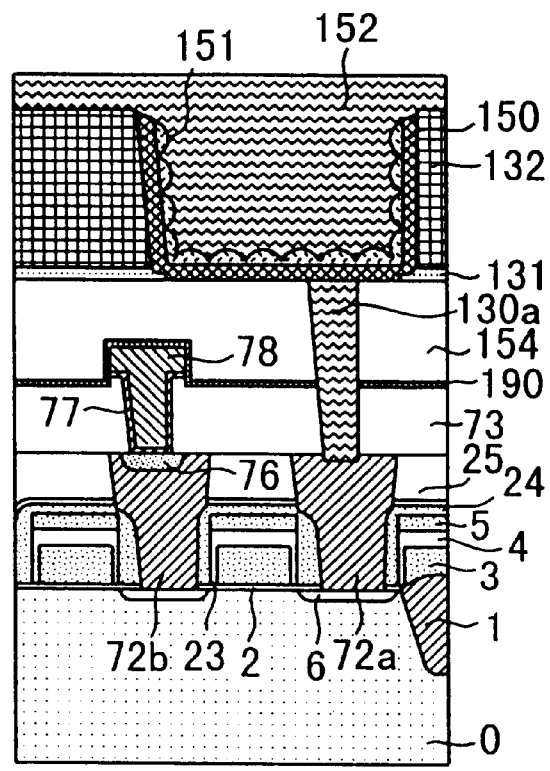
Figure 38B:
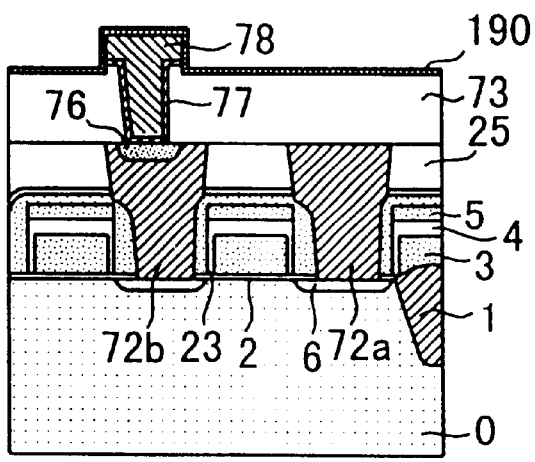

A thirtieth embodiment of the present invention will be described with reference to FIGS. 38A to 38C. FIGS. 38A to 38C are cross-sectional views illustrating a structure of a semiconductor device and a manufacturing method according to this embodiment. The semiconductor device in this embodiment is a further variation of the twenty-third embodiment.

According to the fabrication steps for a semiconductor device in this embodiment, a bit line is formed in the same manner as that in the twenty-third embodiment. Then, as shown in FIG. 38A, a patterned resist film 210 is formed on the bit line. The silicon oxide film 73 is etched by a specific thickness using the patterned resist film 210 as a mask, so that the bit line projects by a specific length from the surface of the silicon oxide film 73.

A silicon nitride film 190 is formed in the same manner as that in the twenty-third embodiment (see FIG. 38B), to form a capacitor (see FIG. 38C). According to the structure in this embodiment, since the bit line projects from the silicon oxide film 73, the bit line and its underlying portion (a portion of the silicon oxide film 73) can be protected by the silicon nitride film 190. In this case, the bit line can be protected to the same extent as the twenty-ninth embodiment (see FIGS. 37A to 37C) by the silicon nitride film 190.

Thirty-First Embodiment

Figure 39:
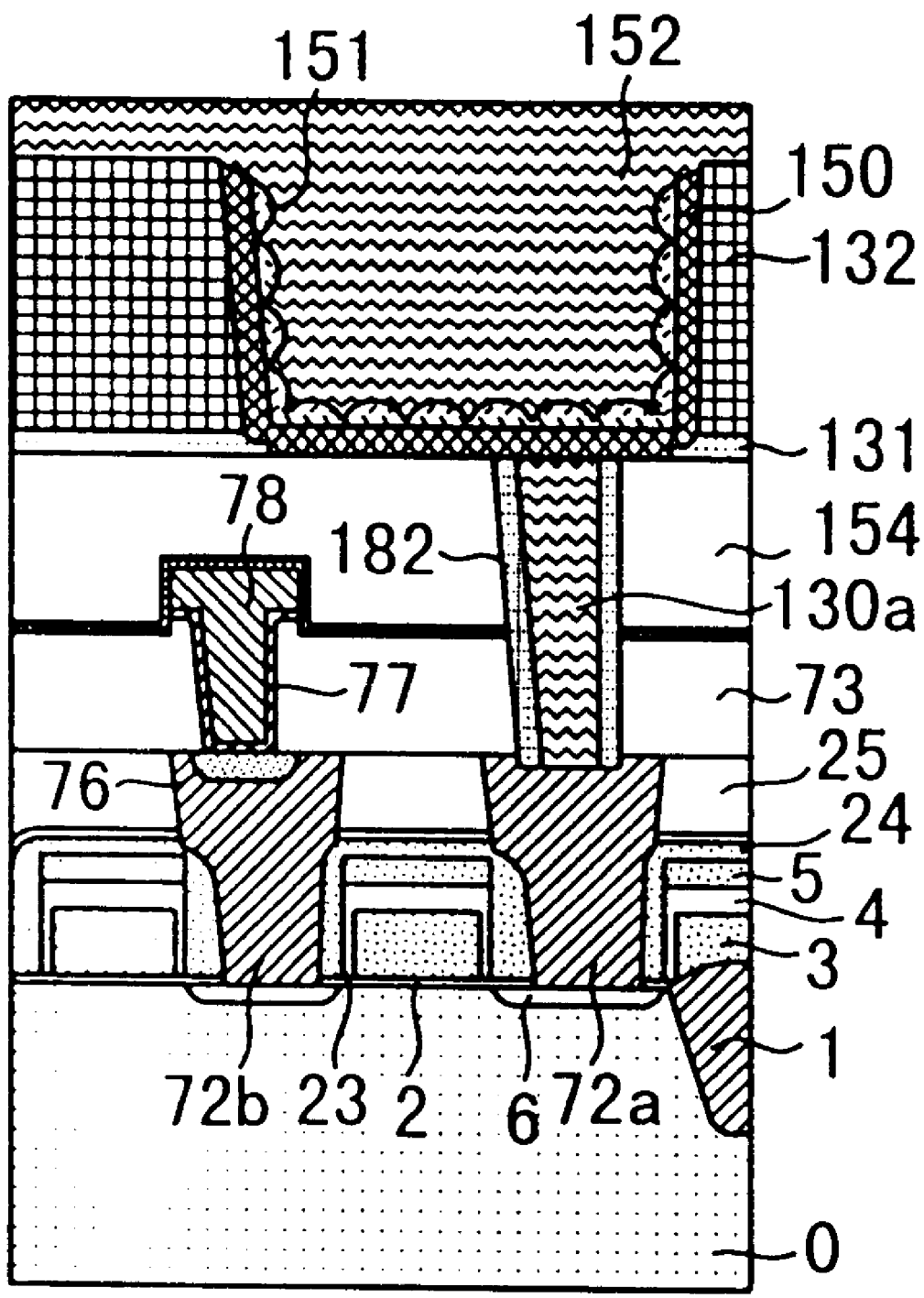
FIG. 39 is a cross-sectional view illustrating the structure of a semiconductor device according to a thirty-first embodiment of the present invention.
Figure 40A:
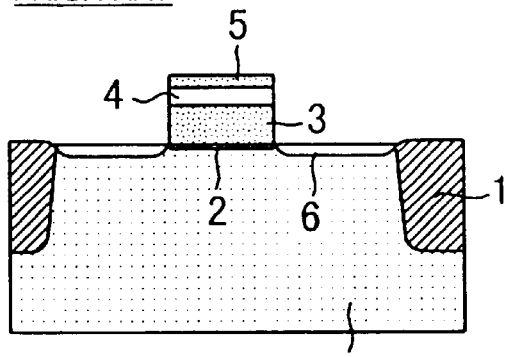
FIGS. 40A to 40F are cross-sectional views illustrating a manufacturing method of a first former semiconductor device.
Figure 40D:
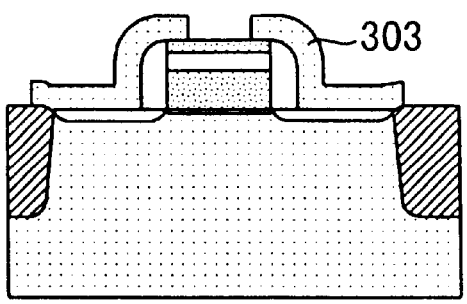
Figure 40B:
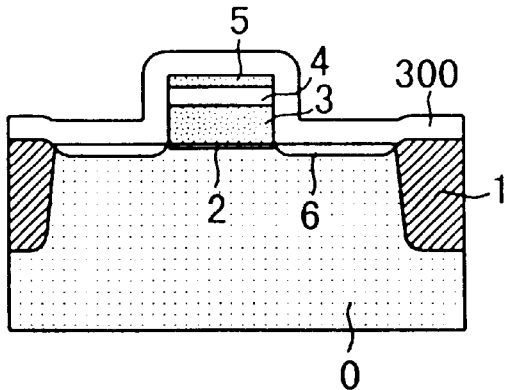
Figure 40E:
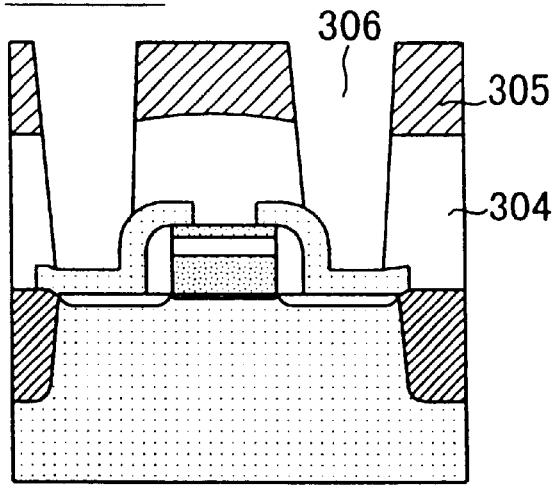
Figure 40C:
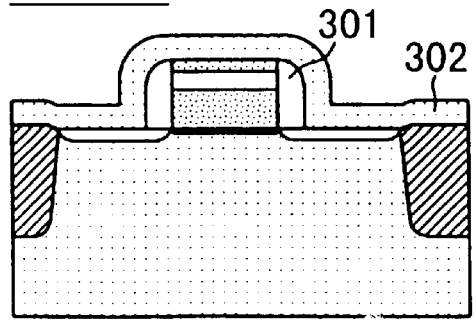
Figure 40F:
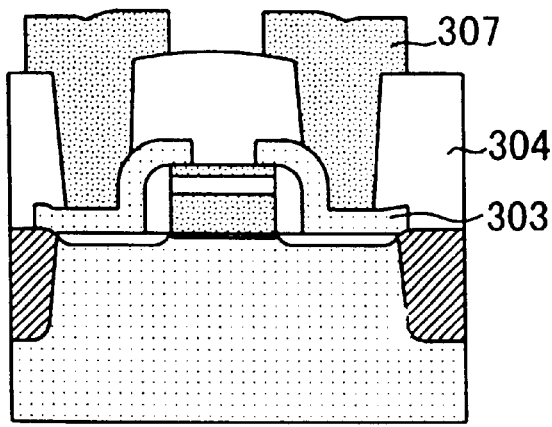
Figure 41:
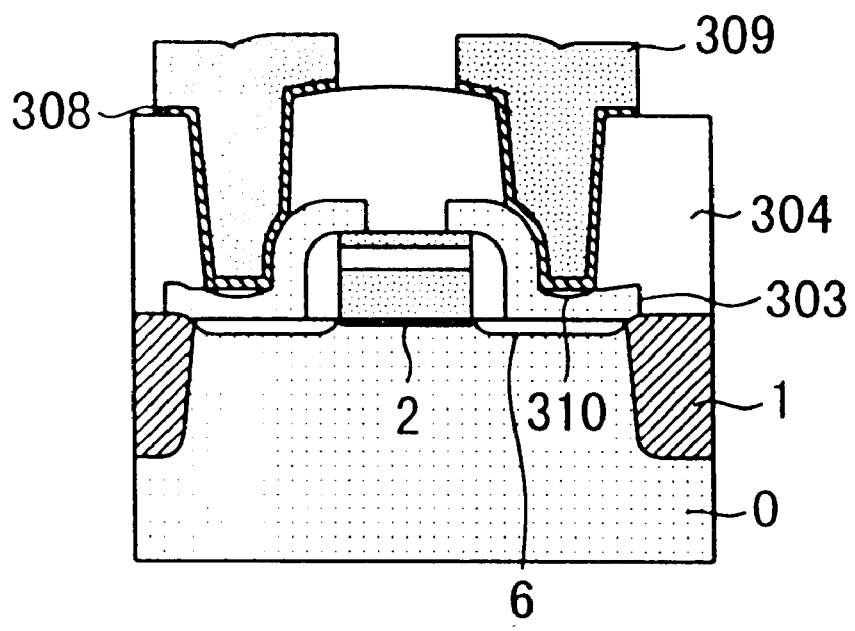
FIG. 41 is a cross-sectional view illustrating the structure of a second former semiconductor device.
Figure 42A:
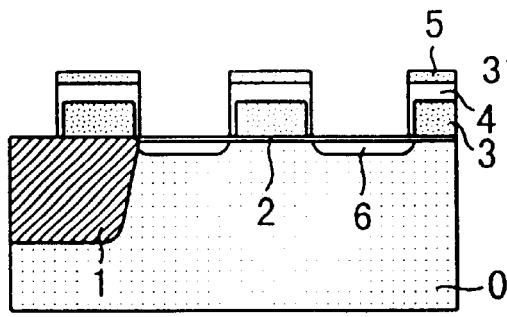
FIGS. 42A to 42F and FIG. 43 are cross-sectional views illustrating the structure of a third former semiconductor device and a manufacturing method.
Figure 42D:
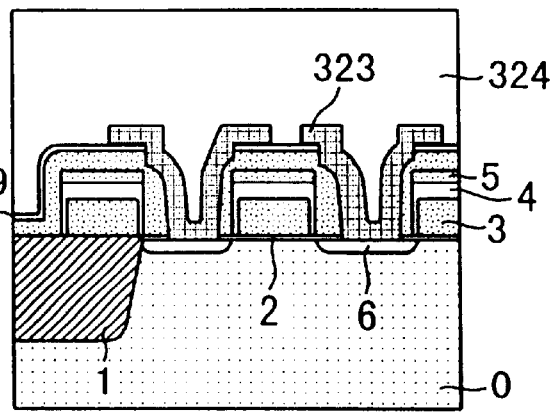
Figure 42B:
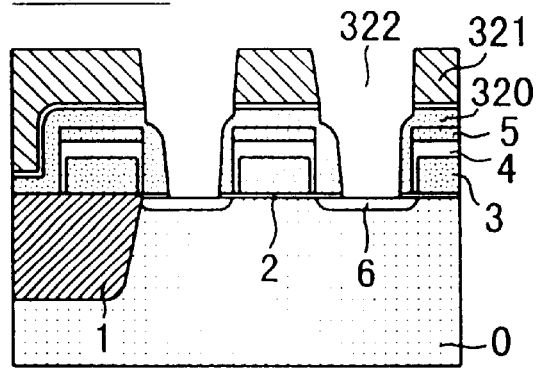
Figure 42E:
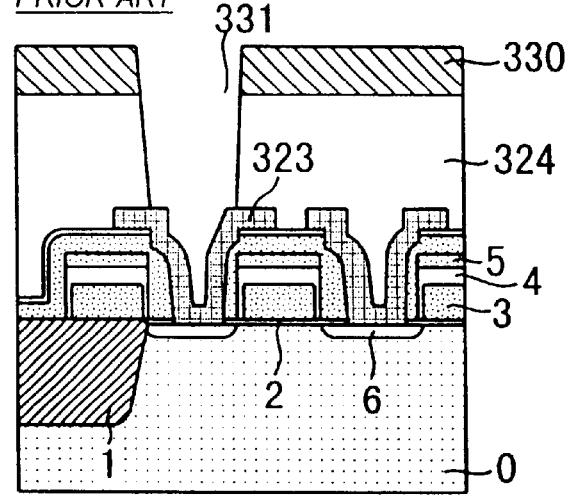
Figure 42C:
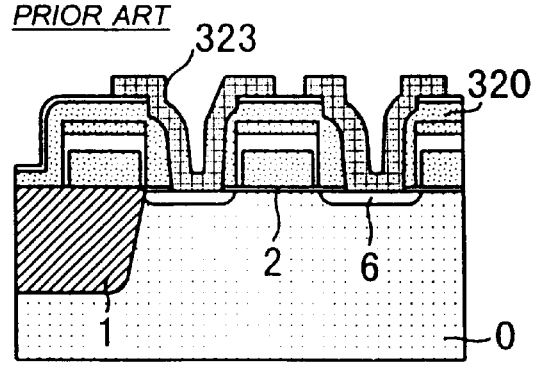
Figure 42F:
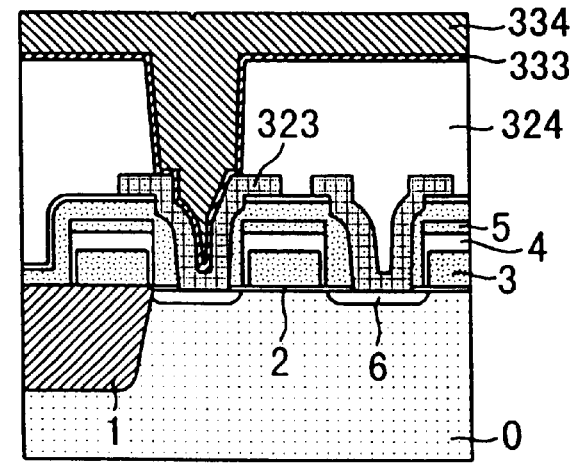
Figure 43:
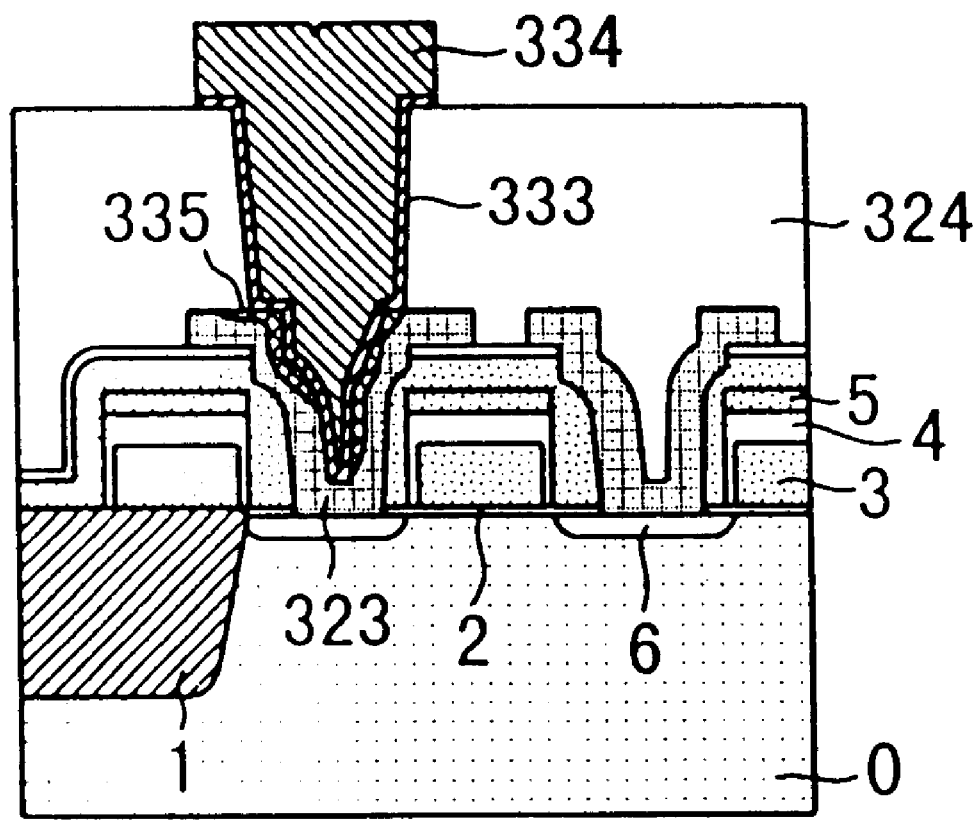

A thirty-first embodiment of the present invention will be described with reference to FIG. 39. FIG. 39 is a cross-sectional view illustrating a structure of a semiconductor device in this embodiment. The semiconductor device in this embodiment is a combination of the semiconductor devices in the twenty-fifth embodiment (see FIGS. 33A to 33D) and thirtieth embodiment. According to the structure in this embodiment, it is possible to obtain the effects of the two embodiments in combination.

The major benefits of the present invention described above are summarized as follows:

According to the first aspect of the present invention, since the surface of the pad formed on the first circuit element is continuous to the surface of the first interlayer insulating film at the same level, the second interlayer insulating film and the plug can be accurately formed. With the above structure, since the aspect ratio of the plug can be suppressed, the plug can be finely formed. According to the present invention, since the pad is larger in size than the plug, the pad can be easily formed and also a particularly planarized portion of the surface of the pad is taken as a contact portion with the plug. As a result, according to the present invention, it is possible to ensure a good contact characteristic between the first circuit element and the second circuit element.

According to the second aspect of the present invention, since the plug is formed of the high melting point metal film and the low resistance metal film, it is possible to make the interconnection resistance sufficiently small. Also, according to the present invention, since the plug has a small aspect ratio and the highly planarized central portion of the pad is taken as the contact portion with the plug, the high melting point metal film of the plug exhibits a desirable coverage. As a result, according to the present invention, it is possible to keep stable characteristics while certainly suppressing reaction between the pad and the low resistance metal film.

According to the third aspect of the present invention, the silicide film can be formed by using the first high melting point metal film and the barrier layer can be formed of the second high melting point metal film. Also, according to the present invention, the first and second high melting point metal films are formed of respective metal films suitable for playing roles thereof. As a result, according to the present invention, it is possible to sufficiently achieve the effects of the high melting point metal films while ensuring the occupancy of the low resistance metal film in the plug.

According to the fourth aspect of the present invention, the interconnection structure described in the first aspect can be formed between the first electrode for the capacitor and the source/drain region of the transistor. As a result, according to the present invention, it is possible to realize a memory device having stable characteristics.

According to the fifth aspect of the present invention, the capacitor having the cylindrical first electrode can be formed. As a result, according to the present invention, it is possible to realize a memory device in which the capacitor functioning as a memory cell has a large capacitance.

According to the sixth aspect of the present invention, the first electrode having the surface area increased by coarsening can be formed. As a result, according to the present invention, it is possible to realize a memory device in which the capacitor functioning as a memory cell has a large capacitance.

According to the seventh aspect of the present invention, the capacitor including a high dielectric film as an insulating film can be formed. The capacitance of the capacitor including the high dielectric film as the insulating film becomes larger than that of a capacitor including a usual dielectric film as the insulating film. As a result, according to the present invention, it is possible to realize a memory device having the capacitor of a large capacitance.

According to the eighth aspect of the present invention, the capacitor can be formed by a combination of the cylindrical first electrode and the high dielectric film as an insulating film. As a result, according to the present invention, it is possible to realize a memory device having the capacitor of a large capacitance.

According to the ninth aspect of the present invention, it is possible to realize a memory device having the COB structure in which the interconnection structure described in the first aspect is provided between the first electrode for the capacitor and the source/drain region of the transistor and the interconnection structure described in the third aspect is provided between the bit line and the source/drain region of the transistor. In this case, it is possible to easily give stable characteristics to a bit line or an interconnection portion connected to the capacitor. As a result, according to the present invention, it is possible to realize a memory device having stable characteristics, which can be fabricated at a high yield.

According to the tenth aspect of the present invention, since the interconnection pattern of the bit lines is a simple line/space pattern, the bit liens can be highly accurately, since the plug for connecting the bit line to the source/drain region exhibits a good coverage in the contact hole, the pad can be certainly protected from an etcher and the like even if the bit line is narrower than the plug.

According to the eleventh aspect of the present invention, each of the capacitor side pad, capacitor side plug and first electrode required for the interconnection structure of the capacitor can be doped with an impurity at an arbitrary concentration, so that the capacitor characteristics can be optimized in accordance with the requirement for the device. Also, according to the present invention, since the silicon nitride film can function as a stopper film upon etching an opening for containing the first electrode, the thickness of the third interlayer insulating film can be suppressed. As a result, it is possible to enhance the easiness of the fabrication process and the stability of product characteristics by suppressing the aspect ratio of the capacitor side plug.

According to the twelfth aspect of the present invention, the bit line containing tungsten can be protected by the silicon nitride film. As a result, according to the present invention, it is possible to effectively prevent occurrence of damages of the bit line at the fabrication step of the device. Also, according to the present invention, since the silicon nitride film can function as a stopper film upon formation of the contact hole for the capacitor side plug, the thickness of the third interlayer insulating film can be suppressed and the over-etch amount of the capacitor side pad can be highly accurately controlled. As a result, according to the present invention, it is possible to realize a semiconductor device having stable characteristics, which can be fabricated at a high yield.

According to the thirteenth aspect of the present invention, since the side surface of the capacitor side contact hole positioned between the bit lines can be covered with the side wall of the silicon nitride film, it is possible to certainly prevent the bit line from being corroded from the contact hole side at the fabrication step of the device. As a result, according to the present invention, it is possible to enhance the reliability of the semiconductor device and also enhance the yield thereof.

According to the fourteenth aspect of the present invention, since the end surface of the plug projects from the second interlayer insulating film, the contact area between the plug and the first electrode can be increased. As a result, according to the present invention, it is possible to reduce the contact resistance between the plug and the first electrode.

According to the fifteenth aspect of the present invention, the thickness of the silicon nitride film can be made small at a portion where the contact hole is required to be formed and can be made large on the side surface of the bit line. As a result, according to the present invention, it is possible to more strongly protect the bit line.

According to the sixteenth aspect of the present invention, even the underlying portion of the bit line can be protected by the silicon nitride film. As a result, according to the present invention, it is possible to more strongly protect the bit line.

Further, the present invention is not limited to these embodiments, but variations and modifications may be made without departing from the scope of the present invention.

What is claimed is:

1. A semiconductor device in which first and second circuit elements to be connected to each other are disposed in such a manner as to be spaced from each other with a specific gap kept therebetween in the stacking direction, said semiconductor device comprising:

a first interlayer insulating film formed on said first circuit element, and wherein said first circuit element is a source/drain region of a transistor provided on a silicon substrate;

a conductive pad provided in said first interlayer insulating film in such a manner that one end surface thereof is connected to said first circuit element and the other end surface thereof is exposed to the surface of said first interlayer insulating film;

a second interlayer insulating film formed on said first interlayer insulating film and said pad; and a conductive plug provided in said second interlayer insulating film in such a manner that one end surface thereof is in contact with said pad and the other end surface thereof is connected to said second circuit element, and wherein said second circuit element is an interconnection layer, wherein the surface of said first interlayer insulating film is smoothly continuous to the other end surface of said pad at the same level, said plug is smaller in size than said pad and is in contact with the central portion of said pad, and said interconnection layer is narrower than said conductive plug, and has a uniform width.

2. A semiconductor device having a capacitor over bit line structure in which a capacitor is provided on a bit line, said semiconductor device comprising:

a transistor formed on a silicon substrate, said transistor including two source/drain regions and a gate electrode held therebetween;

a first interlayer insulating film formed on said transistor;

an interconnection side pad provided in said first interlayer insulating film in such a manner that one end surface thereof is connected to one of said source/drain regions and the other end surface thereof is exposed to the surface of said first interlayer insulating film;

a capacitor side pad provided in said first interlayer insulating film in such a manner that one end surface thereof is connected to the other of said source/drain regions and the other end surface thereof is exposed to the surface of said first interlayer insulating film;

a second interlayer insulating film formed on said first interlayer insulating film and said two pads;

a bit line formed on said second interlayer insulating film;

an interconnection side plug provided in said second interlayer insulating film in such a manner that one end surface thereof is in contact with said interconnection side pad and the other end surface thereof is connected to said bit line; a third interlayer insulating film formed on said bit line and said second interlayer insulating film;

a first electrode for a capacitor, which is formed on said third interlayer insulating film; and a capacitor side plug provided in said third interlayer insulating film in such a manner that one end surface thereof is in contact with said capacitor side pad and the other end surface thereof is connected to said first electrode, wherein the surface of said first interlayer insulating film is smoothly continuous to the other end surfaces of said two pads at the same level;

said interconnection side plug is smaller in size than said interconnection side pad, and is in contact with the central portion of said interconnection side pad; said capacitor side plug is in contact with said capacitor side pad;

said interconnection side pad is made from doped silicon;

said interconnection side plug comprises a high melting point metal film being in contact with said interconnection side pad and a low resistance metal film formed on said high melting point metal side film;

a silicide film is formed near the boundary between said interconnection side pad and said interconnection side plug;

said silicide film is formed by reaction between said interconnection side pad and a first high melting point metal film suitable for preventing absorption of an impurity from said doped silicon; and said high melting point metal film constituting part of said interconnection plug is a second high melting point metal film suitable for preventing reaction between said doped silicon and said low resistance metal film.

3. The semiconductor device according to claim 2, further comprising:

a silicon nitride film formed on said third interlayer insulating film; and a silicon oxide film formed on said silicon nitride film;

wherein said first electrode is a cylindrical electrode formed in an opening provided in said silicon oxide film and said silicon nitride film; and each of said first electrode, said capacitor side plug and said capacitor side pad is made from doped silicon which is doped with an impurity at an arbitrary concentration.

4. The semiconductor device according to claim 2, wherein said bit line has a stacked structure formed by stacking said second high melting point metal film and said low resistance metal film;

said low resistance metal film is a single tungsten film; and a silicon nitride film which covers said second interlayer insulating film and said bit line is provided between said second interlayer insulating film and said third interlayer insulating film.

5. The semiconductor device according to claim 4, wherein the thickness of said silicon nitride film which covers said second interlayer insulating film and said bit line is larger at the side surface of said bit line than that at the upper portion of said bit line and the upper portion of said second interlayer insulating film.

6. The semiconductor device according to claim 4, wherein said second interlayer insulating film has a protruding portion covered by said bit line.

* * * * *